(12) United States Patent
Lim et al.

(10) Patent No.: US 11,342,556 B2
(45) Date of Patent: May 24, 2022

(54) COATING OF ELECTRODE MATERIALS FOR ENERGY STORAGE DEVICES

(71) Applicant: Hunt Energy Enterprises, L.L.C., Dallas, TX (US)

(72) Inventors: Jin-Myoung Lim, Coppell, TX (US); Fantai Kong, McKinney, TX (US); Mark Griffin, Dallas, TX (US)

(73) Assignee: HUNT ENERGY ENTERPRISES, L.L.C., Dallas, TX (US)

( * ) Notice: Subject to any disclaimer, the term of this patent is extended or adjusted under 35 U.S.C. 154(b) by 0 days.

(21) Appl. No.: 17/152,515

(22) Filed: Jan. 19, 2021

(65) Prior Publication Data
US 2021/0226201 A1    Jul. 22, 2021

Related U.S. Application Data

(60) Provisional application No. 62/962,638, filed on Jan. 17, 2020, provisional application No. 62/976,699, filed on Feb. 14, 2020.

(51) Int. Cl.
| | | |
|---|---|---|
| *H01M 4/134* | (2010.01) | |
| *H01M 4/1391* | (2010.01) | |
| *H01M 4/36* | (2006.01) | |
| *C23C 16/44* | (2006.01) | |
| *H01M 4/133* | (2010.01) | |

(Continued)

(52) U.S. Cl.
CPC ........... *H01M 4/366* (2013.01); *C23C 16/403* (2013.01); *C23C 16/405* (2013.01); *C23C 16/407* (2013.01); *C23C 16/4408* (2013.01); *C23C 16/4417* (2013.01); *C23C 16/45529* (2013.01); *C23C 16/45531* (2013.01); *C23C 16/45555* (2013.01); *H01M 4/131* (2013.01); *H01M 4/133* (2013.01); *H01M 4/134* (2013.01); *H01M 4/1391* (2013.01); *H01M 4/1393* (2013.01); *H01M 4/1395* (2013.01); *H01M 4/364* (2013.01); *H01M 4/386* (2013.01); *H01M 4/505* (2013.01); *H01M 4/525* (2013.01);

(Continued)

(58) Field of Classification Search
CPC ...... H01M 50/409; H01M 4/36; H01M 4/505; H01M 4/134; H01M 4/1391; H01M 4/1395; C23C 16/45529
See application file for complete search history.

(56) References Cited

U.S. PATENT DOCUMENTS

| | | |
|---|---|---|
| 9,240,589 B2 | 1/2016 | He et al. |
| 2012/0208086 A1 | 8/2012 | Plieth et al. |

(Continued)

FOREIGN PATENT DOCUMENTS

| | | | | |
|---|---|---|---|---|
| CN | 105470474 A | * | 4/2016 | ............. H01M 4/36 |
| CN | 106654226 A | | 5/2017 | |

OTHER PUBLICATIONS

PCT International Search Report and Written Opinion for application No. PCT/US2021/013952, dated May 12, 2021, 13 pages.

*Primary Examiner* — Khanh T Nguyen
(74) *Attorney, Agent, or Firm* — Baker Botts L.L.P.

(57) ABSTRACT

Batteries, methods for recycling batteries, and methods of forming one or more electrodes for batteries are disclosed. The battery includes at least one of (i) a cathode including a nickel-rich material and a first sub-nanoscale metal oxide coating on the nickel-rich material; and (ii) an anode including an anode material and a second sub-nanoscale metal oxide coating disposed on the anode material.

15 Claims, 25 Drawing Sheets

Sub-nanoscale Metal Oxide Depositon

(51) Int. Cl.
*H01M 4/38* (2006.01)
*H01M 4/505* (2010.01)
*H01M 4/525* (2010.01)
*H01M 4/587* (2010.01)
*H01M 4/62* (2006.01)
*H01M 10/0525* (2010.01)
*H01M 10/54* (2006.01)
*H01M 4/1393* (2010.01)
*H01M 4/1395* (2010.01)
*C23C 16/40* (2006.01)
*C23C 16/455* (2006.01)
*H01M 4/131* (2010.01)

(52) U.S. Cl.
CPC ........... *H01M 4/587* (2013.01); *H01M 4/624* (2013.01); *H01M 10/0525* (2013.01); *H01M 10/54* (2013.01)

(56) References Cited

U.S. PATENT DOCUMENTS

| | | | |
|---|---|---|---|
| 2012/0258366 A1* | 10/2012 | Yu | H01M 4/505 429/223 |
| 2016/0351910 A1 | 12/2016 | Albano et al. | |
| 2016/0351973 A1 | 12/2016 | Albano et al. | |
| 2018/0053940 A1* | 2/2018 | Jo | H01M 4/505 |
| 2019/0190059 A1* | 6/2019 | Feng | H01M 50/409 |

* cited by examiner

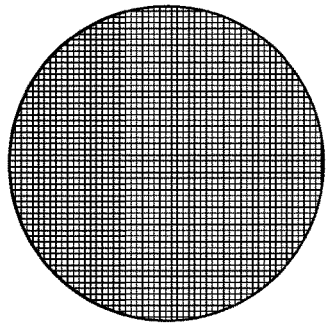
FIG. 1A — Electrode Particle
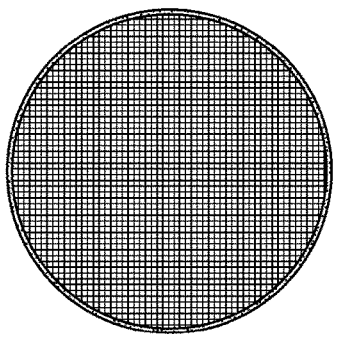
FIG. 1B — Sub-nanoscale Metal Oxide Depositon
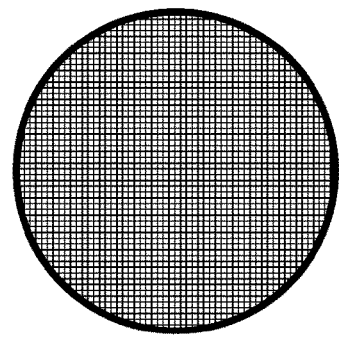
FIG. 1C — Conductive Polymer Coating
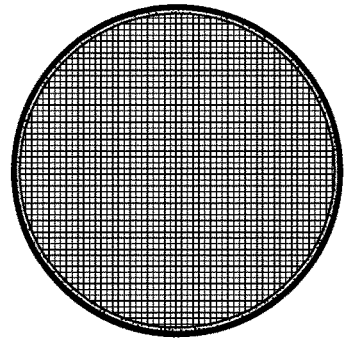
FIG. 1D — Conductive Polymer Coating on the Oxide Deposition
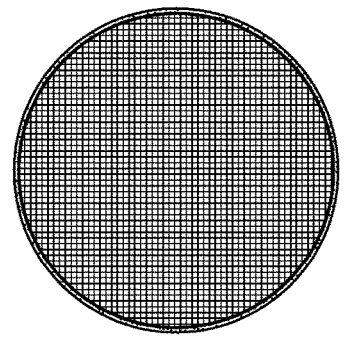
FIG. 1E — Sub-nanoscale Metal Oxide Deposition on the Conductive Polymer Coating
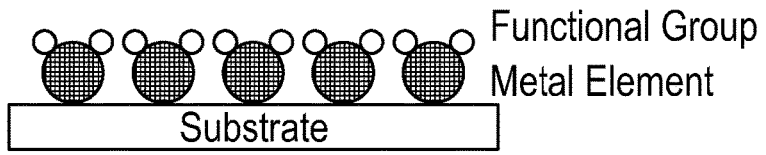
FIG. 2A — Functional Group / Metal Element / Substrate
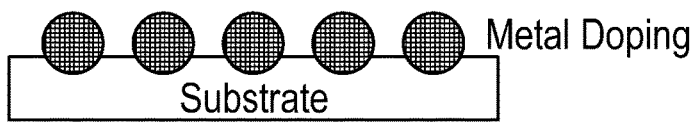
FIG. 2B — Metal Doping / Substrate

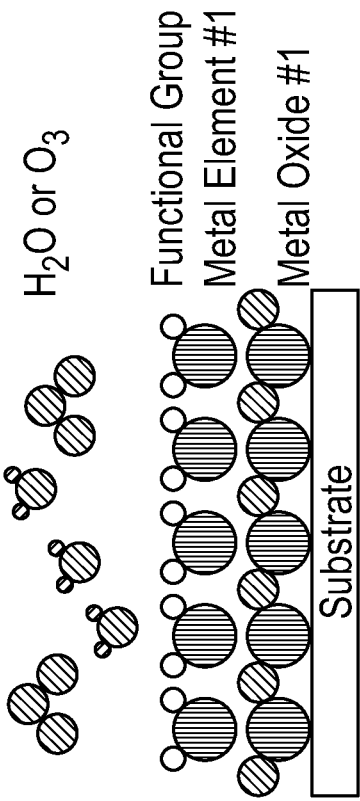
FIG. 4A
FIG. 4B
FIG. 4C
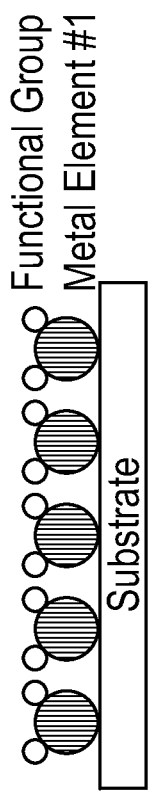
FIG. 3A
FIG. 3B
FIG. 3C

COATING OF ELECTRODE MATERIALS FOR ENERGY STORAGE DEVICES

CROSS-REFERENCE TO RELATED APPLICATIONS

This application claims priority to U.S. Provisional Patent Application No. 62/962,638, entitled Battery Materials and Electrolyte Excess Battery Cell by Jin-Myoung Lim, Fantai Kong, and Mark Griffin filed Jan. 17, 2020 the contents of which are hereby incorporated by reference. This application claims priority to U.S. Provisional Patent Application No. 62/976,699, entitled MULTI-ELEMENTAL AND MULTI-FUNCTIONAL LAYER-BY-LAYER DEPOSITION FOR NICKEL-RICH CATHODES AND GRAPHITE-SILICON COMPOSITE ANODES ASSISTED BY ATOMIC LAYER DEPOSITION by Jin-Myoung Lim, Fantai Kong, and Mark Griffin filed Feb. 14, 2020 the contents of which are hereby incorporated by reference.

TECHNICAL FIELD

This invention relates to energy storage devices and electrical storage in general.

BACKGROUND

The use of lithium-ion batteries has substantially increased in recent years, starting with electronics and expanding into large-scale applications including the growing electric and hybrid vehicle industry and utility-scale energy storage markets. Current energy density has been limited to less than 200 Wh/kg due to the limitations of lower energy cathode and anode materials.

Ni-rich oxides are one group of promising cathode materials that have specific capacities greater than 200 mAh/g under 4.3 V vs. Li/Li$^+$ operation. However, Ni-rich cathodes have surfaces vulnerable to oxidation, decomposition, and the formation of a solid-electrolyte interphase (SEI), which substantially shortens their lifetime and hampers their commercialization. Si anodes have a specific capacity of 4200 mAh/g, an enormous value compared to the currently commercialized graphite anodes (380 mAh/g), but they also suffer from severe SEI formation, volume expansion, and fracturing. For this reason, researchers have tried to make composites of Si and graphite, but the cyclic stability remains too low for the composites to be commercialized.

These challenges can be addressed by extrinsic treatments such as coating or doping. When modifying the surface of electrode materials, functional advantages for certain properties can be achieved. These properties include protection, ionic and electronic conductivities, packing, recyclability, and mixing capability of the material(s).

In a solid state battery system, the surface challenge becomes more crucial. Due to the absence of liquid electrolytes, it is difficult to establish Li ion conduction pathways from the point of contact between electrode particle and solid electrolyte particle, reducing ionic conductivity. This low ionic conductivity of the solid state system hampers the commercialization of solid state Li batteries. Therefore, it is crucial to develop a coating for electrode and electrolyte surfaces to improve interfacial ionic conductivity.

Atomic layer deposition (ALD) as a technique has been considered an effective method to achieve uniform and homogeneous coating on a substrate. However, the conventional ALD process does not guarantee a uniform and homogeneous coating on a particle surface. Although alternative ALD techniques which use rotary or fluidization mechanisms have been intensively developed, sub-micron sized particles with a strong agglomerating character are difficult to coat conformally. These agglomerated particles should be de-aggregated to individual particles before initiating a coating process. In order to overcome this challenge, this disclosure incorporates a ball-mill mechanism into the ALD technique.

Based on the above approach, this disclosure provides a commercially viable way to address surface instability and enable specific capacities greater than 300 Wh/kg in a Li-ion battery and solid state Li battery system.

BRIEF DESCRIPTION OF THE DRAWINGS

FIGS. 1A-1E are graphical representations of untreated and treated electrode particles according to the embodiments of this disclosure.

FIGS. 2A-2B are illustrations of metal doping performed by atomic layer deposition.

FIGS. 3A-3C are illustrations of single layer binary metal oxide coating performed by atomic layer deposition.

FIGS. 4A-4C are illustrations of second cycle of binary metal oxide atomic layer deposition coating to make double layer binary oxide.

Figure 5A:
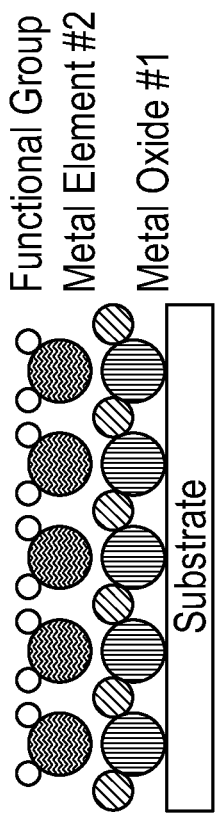
FIGS. 5A-5F are illustrations of a ternary metal oxide coating performed by atomic layer deposition.
Figure 5B:
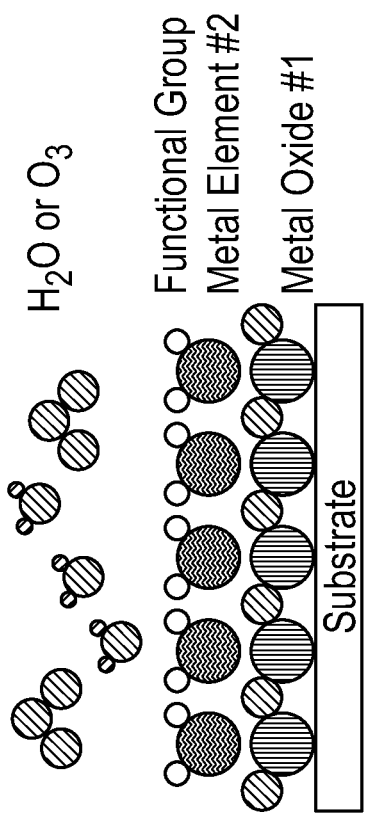
Figure 5C:
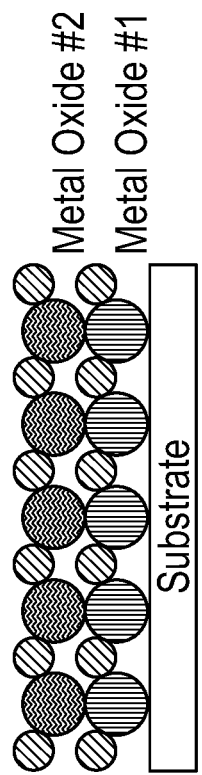
Figure 5D:
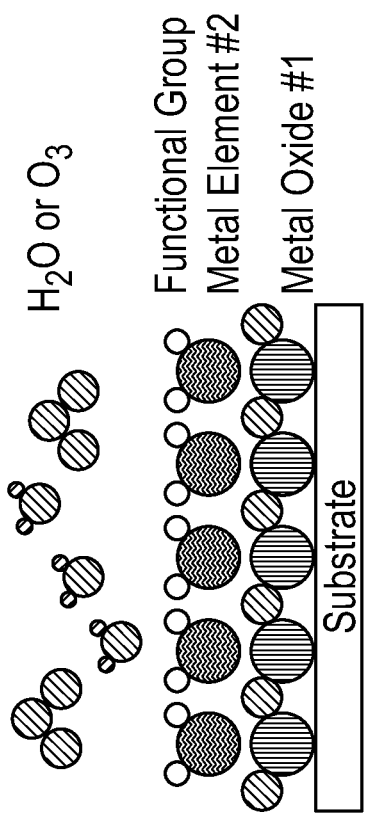
Figure 5E:
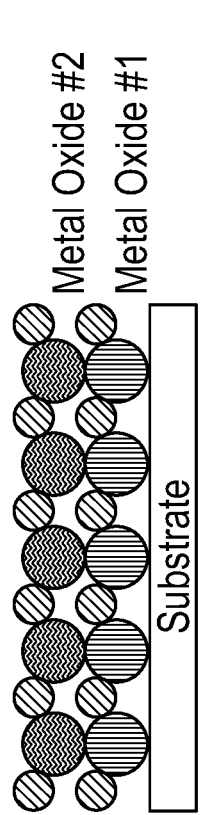
Figure 5F:
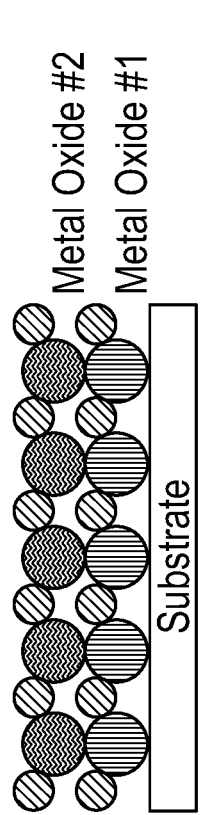
Figure 6A:
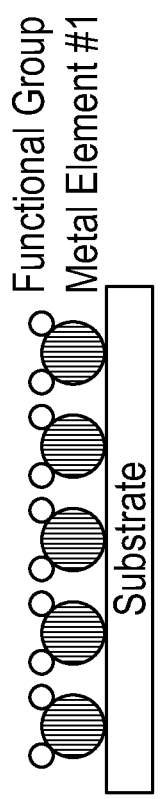
FIGS. 6A-6I are illustrations of quaternary metal oxide coating performed by atomic layer deposition.
Figure 6B:
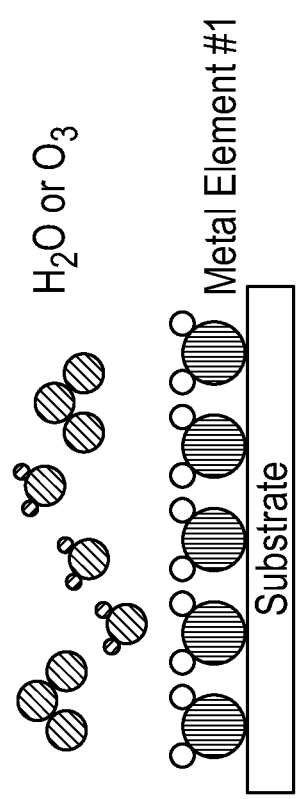
Figure 6C:
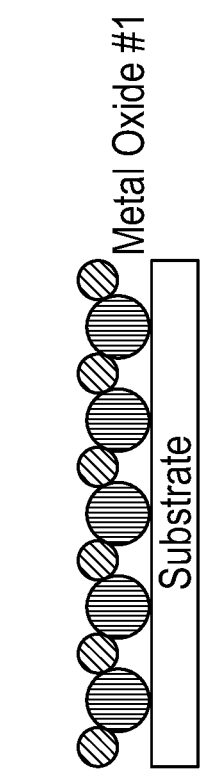
Figure 6D:
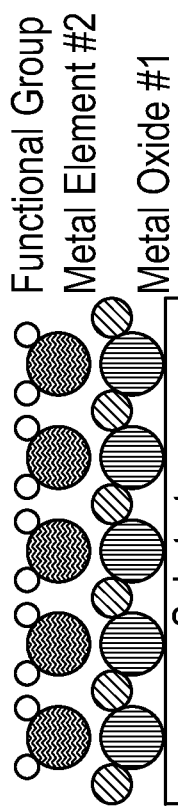
Figure 6E:
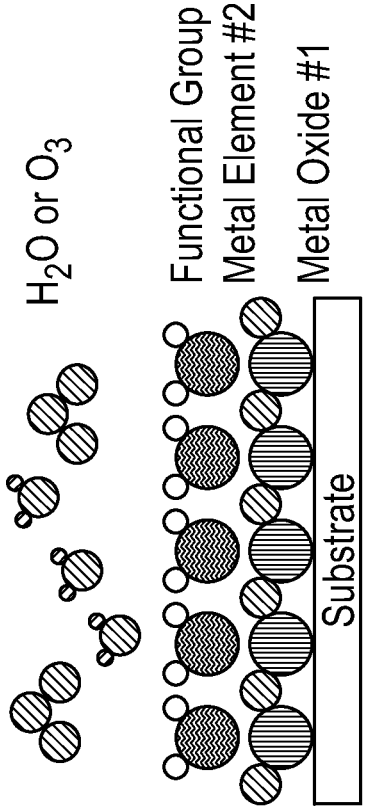
Figure 6F:
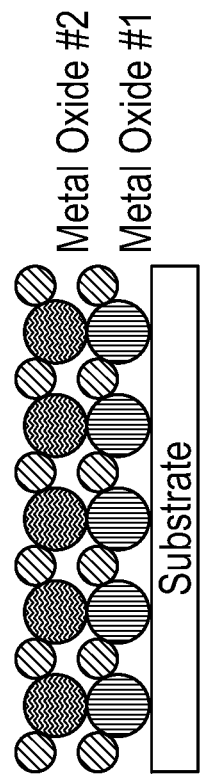
Figure 6G:
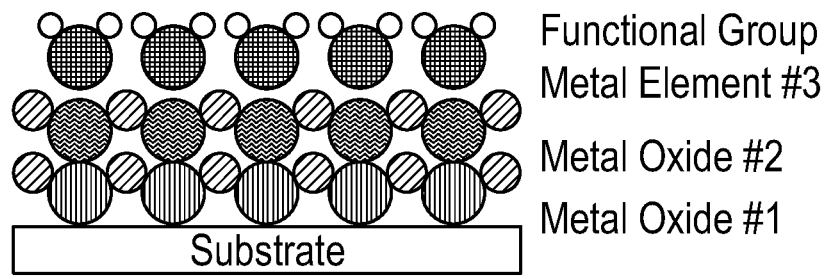
Figure 6H:
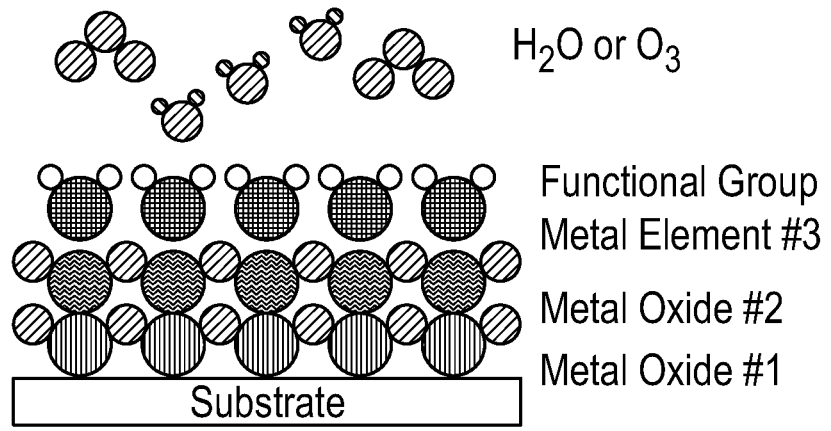
Figure 6I:
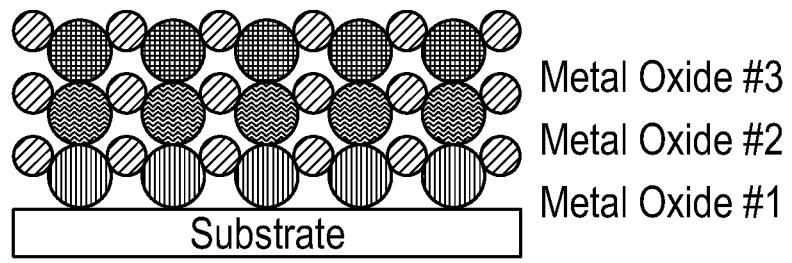

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

SUMMARY

Example embodiments include a coating on an electrode material. The electrode material includes Ni-rich and low Co layered cathode materials, and silicon-carbon composite anode materials for Li-ion and solid-state Li batteries. The coating can be a protecting material from oxidation, reduction, decomposition, or dissolution of the electrode material that improves cycle performance and extends the lifetime of the energy storage. The coating can be an electrically conductive material that facilitates fast charging and discharging processes. The coating can deliver a fast ion transfer as well as a compatibility to a solid electrolyte. The coating can modify the surface character of component materials so that the coated materials can have higher compaction and homogeneity between other electrode components.

Another embodiment includes a coating material including a combination of multi-layer ultrathin and uniform metal oxide coatings and conductive polymer coating. The metal oxide coating can contribute to the protection of the electrode surface. The residual Li and the metal oxide coating can generate a Li-ion conducting surface. The metal oxide can control the electrochemical window to be more compatible with the solid electrolyte. The conductive polymer coating can contribute to higher electrical conductivity at surface. The surface can be modified to have high packing density and interparticle attraction by the conductive polymer coating.

Another embodiment includes a coating process for the multi-layer ultrathin and uniform metal oxide coating. A ball milling process can be incorporated into an atomic layer deposition technique. The mechanical force imposed by the ball milling effectively exposes particle surfaces to ALD precursors regardless of the particle size and morphology. In particular, nano-sized particles are likely to form conglomerates and generate a strong agglomerated secondary particle. In this scenario, the contacted surfaces in the conglomerates cannot be exposed to ALD precursors, leading to a non-uniform and non-homogeneous coating. Conventional powder ALD utilizing rotary and fluidization mechanism may not be able to separate the conglomerates due to the relatively weaker mechanical force generated from inert gas alone. In this disclosure, the ball milling ALD technique may use ceramic balls to utilize a stronger mechanical force. Other controllable factors such as milling speed and time enhance the separating effect even further, resulting in uniform and homogeneous coatings regardless of particle size, morphology, and surface properties.

Another embodiment includes a direct recycling process of the coated electrode material. The coated electrode material is protected enough for reuse without a substantial treatment or process. The treatment for the coated electrode material includes washing and re-lithiation.

Example embodiments include a battery including at least one of (i) a cathode including a nickel-rich material and a first sub-nanoscale metal oxide coating on the nickel-rich material; and (ii) an anode including an anode material and a second sub-nanoscale metal oxide coating disposed on the anode material. In certain embodiments, the nickel-rich material include $Li_{1+a}Ni_xCo_yMn_zAl_{1-x-y-z}O_2$ ($0.0<=a<=1.0$, $0.5<=x<=1.0$, $0.0<=y<=0.1$, $0.0<=z<=0.1$), less than 0.05 mol of impurities and other elements, and less than 5% by weight of residual lithium compounds on the surface; and one or more of a single crystalline primary particle and a combination of secondary and primary particles.

In certain embodiments, the anode material comprises a silicon (Si) and graphite (C) composite with less than 0.05 mol of impurities and other elements.

In certain embodiments, the anode material comprises a composite of silicon and one or more carbonaceous materials, wherein the composite of silicon and one or more carbonaceous materials includes at least five percent silicon and less than ninety-five percent of the one or more carbonaceous materials, and wherein the carbonaceous materials include one or more of graphite, amorphous carbon, graphene, and carbon nanotube.

In certain embodiments, the cathode and the anode further comprise a conductive polymer coating.

In certain embodiments, the conductive polymer coating is disposed on the cathode and the anode by one or more of solution mixing, vacuum filtration, cross-linking, and vacuum drying.

In certain embodiments, the conductive polymer and additives include one or more of polypyrrole, polyaniline, and poly(3,4-ethylenedioxythiophene)polymer, carbon nanotubes, graphene, conductive carbon, Cu, Ag, Au, Pt, and Os.

In certain embodiments, the conductive polymer coating is applied, at least in part, by dissolving a surfactant into a solvent by stirring for 10 min to 1 hours, dependent on the solubility at a temperature between 10° C. and 50° C.; mixing the conductive polymer and additive into a solution for 1 to 24 hours at a temperature between 50° C. and 120° C.; drying in a vacuum at a temperature between 80° C. and 200° C. for 6 to 24 hours; and collecting the coated powder by using filtration.

In certain embodiments, the surfactant comprises one or more of sodium dodecyl sulfonate, benalkonium chloride, cocamidopropyl betain, polyvinylpyrrolidone, polyurethane, polystyrene, polyvinylidene fluoride, cetyl alcohol, polytetrafluoroethylene, ethyl cellulose, nitrocellulose, and carboxymethyl cellulose.

In certain embodiments, the solvent comprises one or more of N-methyl-2-pyrrolidinone, ethanol, isopropyl alcohol, acetone, dimethyl carbonate, diethyl carbonate, and ethyl-methyl carbonate.

In certain embodiments, one or more of the first sub-nanoscale metal oxide coating and the second sub-nanoscale metal oxide coating include one or more of surface doping; island and cluster coating; and conformal layered coating provided by the use of one or more of lithium metal oxides, binary metal oxides, ternary metal oxides, and quaternary metal oxides.

In certain embodiments, one or more of the first sub-nanoscale metal oxide coating and the second sub-nanoscale metal oxide coating are deposited, at least in part, by one or more of atomic layer deposition; chemical vapor deposition; pulsed laser deposition; and physical vapor deposition.

In certain embodiments, the atomic layer deposition includes providing a ball-milling mechanism, the ball-milling mechanism including a rotating reactor with a plurality of balls, wherein the plurality of balls comprises one or more of $ZrO2$, $TiO2$, stainless steel, and $Al2O3$; performing the atomic layer deposition at a deposition temperature between 20 to 400° C.; providing one or more metal precursors, wherein the metal precursors comprise one or more of Al, Ti, Co, Ni, Cu, Si, Ge, Se, Zr, Nb, W, Sn, Ga, Li, Mg, Sr, Ba, Fe, Hf, Ru, Ta, V, Y; wherein the atomic layer deposition is performed at a pulse (dose) time for a metal precursor between 0.05 to 60 second to fill the reactor full; wherein the atomic layer deposition is performed with one or more pulses (doses) of the same or different metal precursors to form different metal elements on the same layer; wherein the atomic layer deposition is performed an exposure time between 1 to 3600 second until saturation; wherein the atomic layer deposition is performed for a purge time until it reaches an appropriate vacuum state; wherein the atomic layer deposition is performed with $H2O$ and/or ozone to attach oxygen on the metal precursor surface; wherein the atomic layer deposition is performed for one or more cycles; and wherein the metal oxide coating has a thickness of less than 1 nm.

Another example embodiment includes a method of recycling electrodes of a battery, the method including recycling one or more cathodes and one or more anodes at the end-of-life of the battery by one or more of separation and regeneration.

Example embodiments include wherein the separation includes one or more of dispersing into one or more solvents including N-methyl-2-pyrrolidinone, ethanol, isopropyl alcohol, acetone, acetonitrile, dimethyl carbonate, diethyl carbonate, and ethyl-methyl carbonate; agitating by using one or more of sonication, centrifugation, shear mixing, shaking, vibration, agitation, milling, and stir; and collecting by utilizing one or more of filtration and centrifugation.

Example embodiments include wherein the regeneration includes one or more of rinsing by using one or more solvents including N-methyl-2-pyrrolidinone, ethanol, isopropyl alcohol, acetone, acetonitrile, dimethyl carbonate, diethyl carbonate, and ethyl-methyl carbonate; re-lithiating by utilizing one or more of electrochemical lithiation, chemical lithiation, and thermal lithiation; and annealing in an oxidizing, reducing, or ambient air environment between 80° C. and 1200° C.

Another example embodiment includes a method of forming one or more electrodes for a battery, the method including providing a cathode material; providing an anode material; coating the cathode material with a first sub-nanoscale metal oxide coating; and coating the anode material with a second sub-nanoscale metal oxide coating.

Example embodiments include, wherein the cathode material comprises a nickel-rich material including $Li_{1+a}Ni_xCo_yMn_zAl_{1-x-y-z}O_2$ ($0.0<=a<=1.0$, $0.5<=x<=1.0$, $0.0<=y<=0.1$, $0.0<=z<=0.1$) with less than 0.05 mol of impurities and other elements, and less than 5 percent by weight of residual lithium compounds on the surface; and one or more of a single crystalline primary particle configuration and a combination of secondary and primary particles; and the anode material comprises a composite selected from the group of composites consisting of (i) a silicon (Si) and graphite (C) composite with less than 0.05 mol of impurities and other elements; and (ii) a composite of silicon and one or more carbonaceous materials, wherein the composite of silicon and one or more carbonaceous materials includes at least five percent silicon and less than ninety-five percent of the one or more carbonaceous materials, and wherein the carbonaceous materials include one or more of graphite, amorphous carbon, graphene, and carbon nanotube.

Example embodiments include coating the cathode material with a first sub-nanoscale metal oxide coating comprises performing a first atomic layer deposition to coat the cathode material with the first sub-nanoscale metal oxide coating; and coating the anode material with a second sub-nanoscale metal oxide coating comprises performing a second atomic layer deposition to coat the cathode material with the second sub-nanoscale metal oxide coating.

Example embodiments include, wherein performing the first atomic layer deposition to coat the cathode material with the first sub-nanoscale metal oxide coating further includes ball milling the cathode material within a rotating reactor containing a plurality of balls, wherein the plurality of balls comprises one or more of $ZrO_2$, $TiO_2$, stainless steel, and $Al_2O_3$.

Example embodiments include coating the cathode material with a conductive polymer coating. In example embodiments, coating the cathode material with a conductive polymer coating comprises one or more of solution mixing, vacuum filtration, cross-linking, and vacuum drying. In example embodiments, the conductive polymer and additive include one or more of polypyrrole, polyaniline, and poly(3,4-ethylenedioxythiophene)polymer, carbon nanotubes, graphene, conductive carbon, Cu, Ag, Au, Pt, and Os. In example embodiments, coating the cathode material with a conductive polymer and additive coating includes dissolving a surfactant into a solvent by stirring for 10 min to 1 hours, dependent on the solubility at a temperature of between 10° C. and 50° C.; mixing the conductive polymer into a solution for 1 to 24 hours at a temperature between 50° C. and 120° C.; drying in a vacuum at a temperature of between 80° C. and 200° C. for 6 to 24 hours; and collecting the coated powder by using filtration. In example embodiments the surfactant comprises one or more of sodium dodecyl sulfonate, benalkonium chloride, cocamidopropyl betain, polyvinylpyrrolidone, polyurethane, polystyrene, polyvinylidene fluoride, cetyl alcohol, polytetrafluoroethylene, ethyl cellulose, nitrocellulose, and carboxymethyl cellulose. In example embodiments the solvent comprises one or more of N-methyl-2-pyrrolidinone, ethanol, isopropyl alcohol, acetone, dimethyl carbonate, diethyl carbonate, and ethylmethyl carbonate.

Another embodiment includes a method for a single layer deposition on an anode or cathode material including loading the anode or cathode material into a reactor of an atomic layer deposition system; increasing the temperature inside the reactor to between 20 and 400° C.; reducing the pressure inside the reactor to less than 0.7 torr; dosing a first metal precursor by atomic layer deposition one or more times; wherein a first metal precursor is selected from the group consisting of Al, Ti, Co, Ni, Cu, Si, Ge, Se, Zr, Nb, W, Sn, Ga, Li, Mg, Sr, Ba, Fe, Hf, Ru, Ta, V, Y; dosing takes place to fill the reactor full and exposing until saturation has occurred; reducing the pressure inside the reactor after doping until the pressure is less than 0.7 torr; and dosing an oxygen source one or more times until saturation occurs, wherein the oxygen source comprises H2O or ozone.

Example embodiment further include ball milling the anode or cathode material in a rotating reactor containing a plurality of balls, wherein the plurality of balls comprises one or more of $ZrO_2$, $TiO_2$, stainless steel, and $Al_2O_3$.

Example embodiments include reducing the pressure inside the reactor to less than 0.7 torr; dosing a second metal precursor by atomic layer deposition one or more times; wherein the second metal precursor is selected from the group consisting Al, Ti, Co, Ni, Cu, Si, Ge, Se, Zr, Nb, W, Sn, Ga, Li, Mg, Sr, Ba, Fe, Hf, Ru, Ta, V, Y; dosing takes place to fill the reactor and exposing until saturation has occurred; reducing the pressure inside the reactor after doping until the pressure is less than 0.7 torr; and dosing an oxygen source one or more times until saturation occurs, wherein the oxygen source comprises H2O or ozone.

Example embodiments include reducing the pressure inside the reactor to less than 0.7 torr; dosing a third metal precursor by atomic layer deposition one or more times; wherein the third metal precursor is selected from the group consisting of Al, Ti, Co, Ni, Cu, Si, Ge, Se, Zr, Nb, W, Sn, Ga, Li, Mg, Sr, Ba, Fe, Hf, Ru, Ta, V, Y; dosing takes place to fill the reactor full and exposing until saturation has occurred; reducing the pressure inside the reactor after doping until the pressure is less than 0.7 torr; and dosing an oxygen source one or more times until saturation occurs, wherein the oxygen source comprises H2O or ozone.

DETAILED DESCRIPTION

In energy storage applications, electrode materials for cathodes and anodes of Li batteries have intrinsic material properties. Many high energy electrode materials [FIG. 1a] face challenges including surface degradation during operation, instability in air/moisture, reactive surfaces, fracturing, gas evolution, low/high temperature instability, and sluggish ion/electron kinetics. These cause degradation during cycling and storage in various temperatures and failure to deliver fast charging and discharging. These challenges should be addressed by extrinsic surface treatments such as coating. When modifying the surface of electrode materials, functional advantages for certain properties can be achieved. These properties include protectiveness, conductivities both ionic and electronic, packing, recyclability, and mixing capability of the material(s). The surface characteristics became far more crucial in all solid-state battery system (ASSB). In the conventional Li-ion batteries, liquid electrolytes make sure of conduction pathways of Li ions in the system. Due to the absence of liquid component in ASSB system, the ionic conductivity is significantly compromised. For this reason, a coating on the particle surfaces has been spotlighted the importance in ASSB system.

The protectiveness property has two parts. One is a protection from air and moisture during storage before cell assembly. The other is protection from electrolyte decomposition or reduction after cell assembly. Most battery electrode materials are unstable in air and moisture when in their pristine, as-prepared, powder state. This reduces storage life and shipping windows for the electrode materials. During battery operation, electrolyte decomposition happens on the cathode surface and electrolyte reduction happens on anode surface. These side reactions on the electrode surfaces result in the consumption of electrolyte, the generation of undesired compounds, and the degradation of the electrodes themselves, ultimately causing energy, capacity, and lifetime of the battery to decrease significantly.

The conductive property refers to ionic (Li-ion) and electronic (electron) conductivities. The ionic conductivity helps Li-ion diffusion in and out of the surface of the cathode and anode. The electronic conductivity is the measure of how fast the electron can move on the surface. Overall, this conductivity property facilitates the charge and discharge reactions on the surface. As mentioned, the electrode particles must have both ionic and electronic conductivities, and it affects ASSB system much more dramatically. The coating should provide sufficient electronic conductivity to current collector and at the same time sufficient ionic conductivity to electrolytes.

The packing property contributes to high volumetric energy density by achieving high electrode density. Inter-particle attraction can be enhanced by surface modification, resulting in a densely packed electrode configuration. A high packing density for an electrode enables more electrode materials to be stacked up in smaller volumes, producing higher volumetric energy.

The mixing property contributes to the electrode sheet preparation process. Aggregation can be occurred during the electrode slurry and sheet fabrication processes. This phenomenon happens when the particle is in the nanometer scale and when mixing two different powders with different surface properties. Controlling surface properties for better homogeneity in composites, slurries, and electrodes improves the mixing property.

Ni-rich oxides ($Li_{1+a}Ni_xCo_yMn_zAl_{1-x-y-z}O_2$; $0.0<=a<=1.0$, $0.5<=x<=1.0$, $0.0<=y<=0.1$, $0.0<=z<=0.1$) are one group of promising cathode materials that have more than 200 mAh/g under 4.3 V vs. $Li/Li^+$ operation. However, Ni-rich cathodes have surfaces that are vulnerable to oxidation, decomposition, and the formation of solid-electrolyte interphase (SEI), substantially shortening their lifetime and lowering thermal stability, resulting in hindering their commercialization. Furthermore, Ni-rich oxides have an unignorable volume expansion (~7%) during charge and discharge process that induces inter-particle fracture and cracking in a polycrystalline particle morphology consisting of a combination of primary and secondary particles with grain boundaries. For this reason, a single crystalline particle morphology without grain boundaries have been considered as a next generation configuration of Ni-rich oxide cathode materials, but the surface vulnerability challenges mentioned above become more severe due to the large surface area of the single-crystalline smaller particles. Therefore, a surface modification of the single crystalline Ni-rich oxide cathode materials is crucial to address the challenges and improve overall Li battery performances.

With the above challenges, cathode materials should be further developed for solid state battery systems to match compatibility with solid electrolytes. With this interfacial enhancement, furthermore, the composite electrode structure maintaining high ionic conductivity since there is no liquid electrolyte to infiltrate the cathode porosity and facilitate ion transport different from conventional Li ion batteries. For this reason, the surface coating and additives possessing both high ionic and electronic conductivities are the most essential components for the practical integration into cathode. Ni-rich cathode materials usually have around 5% residual Li sources on the surface which is unnecessary residue from the synthesis process. We can use it for a metal oxide coating into forming Li-metal-oxide coatings without adding additional Li source during the coating process. The Li-metal-oxide coatings have both ionic and electronic conduction property that is crucial in solid state battery system. Further, the Li-metal-oxide coatings can be a compatible interface to match electrochemical window with solid electrolytes.

Si anodes can have a specific capacity of 4200 mAh/g, an enormous value compared to the currently commercialized graphite anode (380 mAh/g), but Si also suffers from severe SEI formation, volume expansion, and fracturing. For this reason, researchers have tried to make composites of Si and graphite, but the cyclic stability is still too low to be commercialized. Also, if the Si particles are nano-sized, aggregation of Si powder hampers the generation of a stable composite structure of Si and graphite. Graphite has a lubricant property so as not to form a homogeneous mixture with Si particles. In addition to the difficulty faced in creating an adequate Si-graphite composite, the material is electrochemically vulnerable during battery operation as well.

These challenges should be addressed by extrinsic treatments such as doping or coating. In this disclosure, we present a surface preparation process that achieves the desired functional advantages for all aforementioned properties by introducing the combinations of metal/transition metal oxide coatings, conductive polymer coating, and additives into the battery electrode material surfaces. In this disclosure, a coating method includes atomic layer deposition assisted by ball mill to accomplish pinhole-free, homogeneous, uniform, and conformal ultrathin coatings by controlling and depositing atomic layer-by-layer by using self-limiting mechanism. Ball-mill is a scalable and commercialize-able method to mix particles with various shape and morphology. During the ball-mill process, the particles constantly move around and are exposed to the gas environment in the reactor. Operating the ball-milling process during the exposure time in the ALD process improves the uniformity and homogeneity of the coating. That is to say, ball mill operation during the deposition increases exposures of particle surfaces to the precursors, resulting in uniform coating without a pinhole at various particle sizes and morphologies. In particular, nano-sized powders aggregate easily to form conglomerates, and the surface area between particles in a conglomerate is not able to be exposed by precursor meaning that that area cannot be coated. Ball mill breaks down the conglomerates and assists to provide uniformity of coating. Furthermore, ball mill atomic layer deposition provides scalable and cost-effective coatings.

FIGS. 1A-1E are graphical representation of untreated and treated electrode particles according to embodiments of this disclosure. FIG. 1A is a graphical representation of a core electrode particle. FIG. 1B is a graphical representation of an electrode particle with sub-nanoscale metal oxide deposition. In certain example implementations, sub-nanoscale metal oxide deposition may include one or more of surface doping, island, and clustered coating. FIG. 1C is a graphical representation of an electrode particle with a conductive polymer coating on the electrode of 1B. FIG. 1D is a graphical representation of an electrode with conductive polymer coating on the sub-nanoscale metal oxide deposition of the electrode of FIG. 1C. FIG. 1E is a graphical representation of a sub-nanoscale metal oxide deposition on the conductive polymer coating of the electrode of FIG. 1D.

In some embodiments, batteries, including the battery disclosed herein, may incorporate electrode sheets doped by atomic layer deposition (ALD). Such ALD doped electrode sheets may present several advantages over electrode sheets known in the art. FIG. 2 provides an illustration of electrode sheets known in the art and an illustration of an embodiment of ALD doped electrode sheets according to the current disclosure.

Energy storage electrode materials such as cathodes and anodes materials of Li-ion batteries have intrinsic material properties. Many high energy electrode materials (FIG. 1A) intrinsically suffer from surface degradation during operation, instability in air/moisture, reactive surface, fracture, gas evolution, low/high temperature instability, and sluggish ion/electron kinetics. These cause degradations during cycling and storage in various temperatures, and failure to deliver fast charging and discharging. These challenges may be addressed by extrinsic treatments such as doping or coating. There have been efforts to coat the electrode materials with oxide, carbide, nitride, and fluoride by using ALD. However, it was found out that coating more than 1 nm would cause deterioration from electronic insulation and carrier-ion (e.g. Li ion) blocking on surface. In this regard, a one or multi-elemental surface doping or coating approach by using ALD and post-treatments may be advantageous, which can be followed by subsequent conductive and polymeric coatings.

The use of lithium-ion batteries has substantially increased in recent years, starting with electronics and expanding into large-scale applications, including the growing electric and hybrid vehicle industry, and utility-scale energy storage markets. However, the technologies to enable recycling of these batteries has not kept pace. Recycling batteries are an inevitable direction owing to the shortage of the transition metal and alkali metal resources despite the rapid growth of the battery demand. In this context, recycling methods based on the stable and protected electrode materials and sheets produced by atomic layer deposition (ALD) disclosed herein may be advantageous.

In one embodiment of an ALD doped electrode sheet, such as that illustrated by FIG. 2$b$, may be prepared to a method of preparing surface doping on battery electrode sheets: performing one to three ALD cycles at temperature between 20 to 400° C.; elements of the doping include Al, Ti, Co, Ni, Cu, Si, Ge, Se, Zr, Nb, W, Sn, Ga, Li, Mg, Sr, Ba, Fe, or combinations thereof. In another embodiment, a method of performing post-treatments on the ALD-doped battery electrode sheets to control vacancy and induce surface reconstructions may include: performing heat treatments in reductive atmospheres including AR, N2, Ar/H2, or N2/H2 at temperature between 20 to 1200° C.; performing heat treatments in oxidative atmospheres including Air, O2 or combination thereof at temperature between 20 to 400° C.; performing chemical treatments in aqueous or non-aqueous chemical solutions.

In another embodiment, a method of depositing conductive coatings on top of the ALD-doped battery electrode sheets may include: performing carbon-based coatings by mixing with $C_xH_yO_z$ compounds in aqueous or non-aqueous solutions, followed by drying and annealing at temperature between 50 to 800° C.; performing ALD coatings of conductive materials such as metals (e.g. W, Ti, Sn, Cu, Al, etc.) and conductive ceramics (e.g. $PbO_2$, $RuO_2$, TiN, $TiB_2$, $MoSi_2$, n-$BaTiO_3$, $Fe_2O_3$, $Ti_2O_3$, $ReO_3$, $IrO_2$, $YBa_2Cu_3O_{7-x}$, etc.). Such a method may be used to produce a doped electrode sheet, such as the electrode sheet illustrated in FIG. 2$b$.

In another embodiment, a method of preparing polymeric coatings on top of the ALD-doped battery electrode sheets may include: performing ALD coatings of conductive polymers which includes, but is not limited to, polypyrrole, polyaniline, or poly(3,4-ethylenedioxythiophene); or binding polymers such as, but not limited to, polyvinylidene fluoride, polytetrafluoroethylene, polyethylene oxides, ethyl cellulose, nitrocellulose or carboxymethyl cellulose. In some embodiments, a method for forming an ALD doped electrode sheet may include a combination of the embodiments described above.

Figure 25:
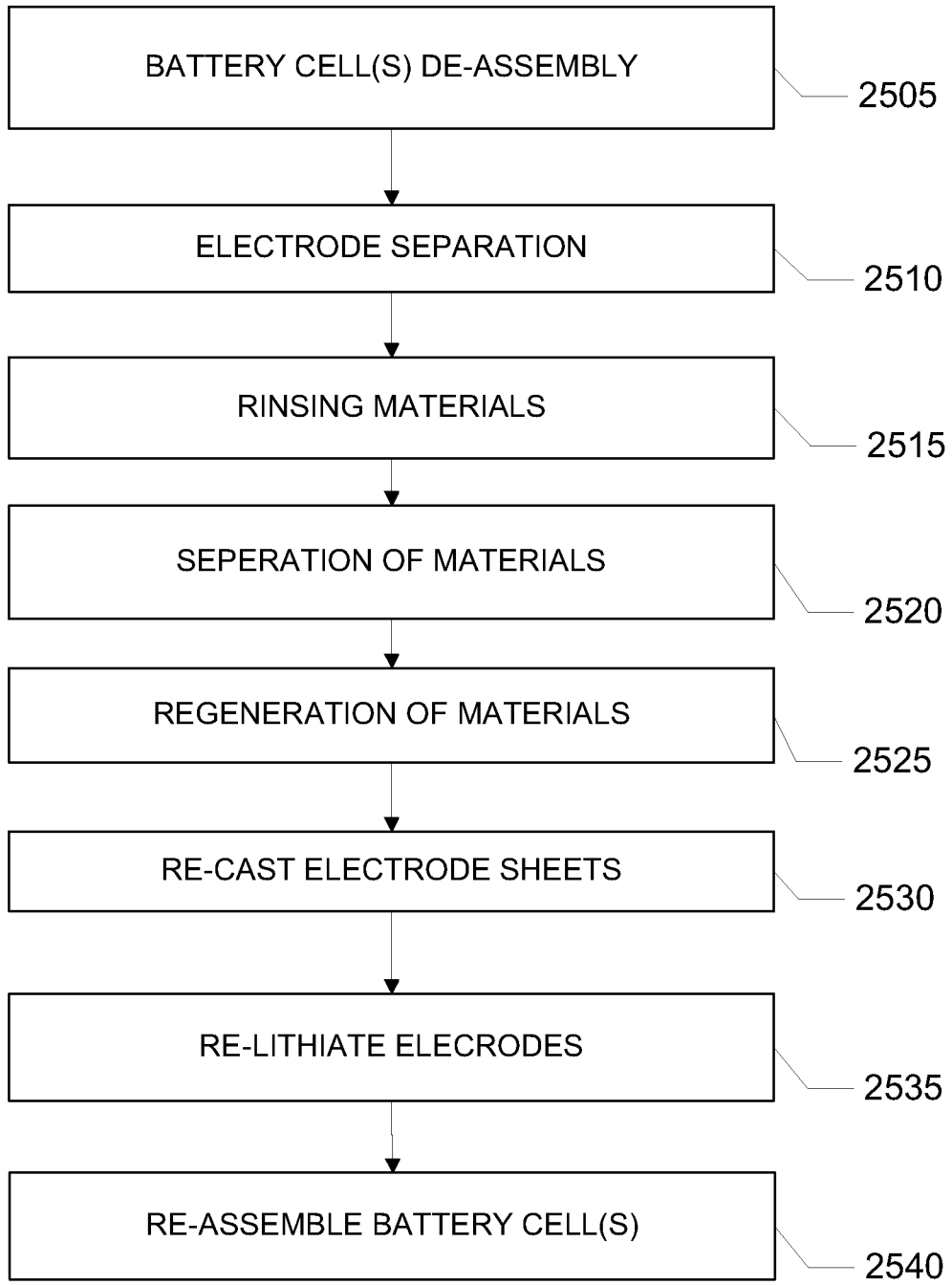
FIG. 25 is a flow chart of an example method of a direct recycling.

Another embodiment of the present disclosure relates to a recycling method of the surface protected battery electrode sheets introduced above embodiments: performing battery cell de-assembly, rinsing materials, separation of materials, regeneration of materials, re-cast electrode sheets, re-lithiating electrodes, and re-assemble battery cells. FIG. 25 illustrates an example method for recycling battery electrode sheets. The embodiment illustrated in FIG. 25 may include the following steps: Battery cell de-assembly includes tearing apart packaging of battery cells; separating electrodes (cathode and anode), and separator. Next, rinsing materials perform in organic solvents not dissolving binders and conducting agents such as dimethyl carbonate, ethyl-methyl carbonate, diethyl carbonate, etc. Next, re-lithiation includes electrochemical re-lithiation, chemical re-lithiation, and thermal re-lithiation. The electrochemical re-lithiation includes performing electrochemical lithiation from Li metal in Li+-contained electrolytes. The chemical re-lithiation includes contacting or mixing with a lithiation source such as Li metal and isobutyl lithium. The thermal re-lithiation includes mixing and then annealing with a lithium precursor such as LiOH, $Li_2CO_3$, $LiO_2$, as such, followed by heat treatment between 100 to 1200° C.

Additionally, ALD techniques may be used to provide doped battery electrode particles. FIGS. 1A-1E provide illustrations of electrode particles, according to certain embodiments of the present disclosure.

FIG. 1B illustrates an electrode particle resulting from a method of preparing surface coating or doping on battery electrode particles which includes performing one to five ALD cycles at temperature between 20 to 400° C.; elements of the coating or doping include one or more of Al, Ti, Co, Ni, Cu, Si, Ge, Se, Zr, Nb, W, Sn, Ga, Li, Mg, Sr, Ba, Fe, or combinations thereof. In another embodiment, a method of performing post-treatments on the ALD-coated/-doped battery electrode particles to control vacancy and induce surface reconstructions may include: performing heat treatments at temperature between 20 to 1200° C.; performing heat treatments in reductive atmospheres including Ar, N2, Ar/H2, or N2/H2; performing heat treatments in oxidative atmospheres including Air, $O_2$ or combination thereof performing chemical treatments in aqueous or non-aqueous chemical solutions.

In one embodiment, a method of conducting conductive coatings on top of the ALD-coated/-doped battery electrode particles may include: performing carbon-based coatings by mixing with CxHyOz compounds in aqueous or non-aqueous solutions, followed by drying and annealing at temperature between 50 to 800° C.; performing ALD coatings of conductive materials such as metals (for example, W, Ti, Sn, Cu, Al, etc.) and conductive ceramics (for example. $PbO_2$, $RuO_2$, TiN, $TiB_2$, $MoSi_2$, n-$BaTiO_3$, $Fe_2O_3$, $Ti_2O_3$, $ReO_3$, $IrO_2$, $YBa_2Cu_3O_{7-x}$, etc.). The electrode particle illustrated by FIG. 1$d$ may result from the embodiment described above.

In one embodiment, a method of preparing polymeric coatings on top of the ALD-doped battery electrode particles may include: performing ALD coatings of conductive polymers which may include, but is not limited to, polypyrrole, polyaniline, or poly(3,4-ethylenedioxythiophene); or binding polymers such as, but not limited to, polyvinylidene fluoride, polytetrafluoroethylene, ethyl cellulose, nitrocellulose or carboxymethyl cellulose. The electrode particle illustrated by FIG. 1d may result from the embodiment described above.

In another embodiment, any two or more of the methods described herein may be combined. The electrode particle illustrated by FIGS. 1d and 1e may result from a combination of the embodiments described above.

In another embodiment, the ALD technique used here includes ball-mill mechanism to increase homogeneity and uniformity of ALD coatings. When the particle size is small and the particle is favorably form conglomerates, the existing ALD mechanism is not working well to achieve a homogeneous and uniform coating. Example embodiments combine the use of the ball mill with ALD to improve the homogeneity and uniformity of the coating.

In certain embodiments, core cathode materials (such as those shown in FIG. 1A) include Ni-rich and low Co cathodes (for example, where $Li_{1+a}Ni_xCo_yMn_zAl_{1-x-y-z}O_2$; $0.0 \leq a \leq 1.0$, $0.5 \leq x \leq 1.0$, $0.0 \leq y \leq 0.1$, $0.0 \leq z \leq 0.1$, hereafter Ni-rich cathodes) in which less than 0.05 mol of impurities and other elements and less than 5 percentage by weight of residual lithium compounds on the surface can co-exist. The crystal structure of Ni-rich cathodes includes a layered crystal structure. The particle size ranges from 100 nm to 50 um. The particle morphology includes single crystalline structure consisting of primary particles without grain boundaries and polycrystalline structure consisting of primary and secondary particles with grain boundaries. Other kinds of cathode materials can be enhanced by the disclosed methods and most likely obtain a substantial performance improvement. In certain implementations, Ni-rich and low Co cathodes have particularly unstable surfaces in air and during battery operation, as well as having lower packing density. For this reason, the methods of this disclosure may be more effectiveness on Ni-rich and low Co cathodes. In certain example embodiments, the cathode particles can consist of a single crystal configuration or a combination of secondary and primary particles. Since this surface process is a methodology applying directly to the powder state of the material, this can be used for both particle configurations regardless of morphology, size, shape, and configurations.

Example core anode materials (such as those shown in FIG. 1A) include graphite (C) and silicon (Si) in which less than 0.05 mol of impurities and other elements can co-exist. Also, anode materials can be a composite of silicon (>5%) and carbonaceous materials (<95%) such as graphite, amorphous carbon, graphene, carbon nanotube, etc. The silicon includes crystalline and amorphous structure. The particle size of the silicon ranges from 5 nm to 10 um. The graphite includes natural graphite, artificial graphite, and synthetic graphite. The particle size of the graphite ranges from 1 um to 50 um. The surface preparation method can also be used for better homogenization of silicon and carbonaceous materials in order to form a homogeneous composite, slurry, and electrode.

FIGS. 2A-2B illustrate metal doping on particle surface assisted by atomic layer deposition. In certain example embodiments, the doping is done by ALD without imposing $O^2$ components such as $H_2O$ or $O_3$. FIG. 2A illustrates a dose process of a metal precursor consisting of metal element and functional group into the reactor. FIG. 2B illustrates a doping process by detaching the functional group and stabilizing the metal ion that includes annealing, heating, curing, aging, or a combination of these. Other embodiments may use one or more of chemical vapor deposition, pulse laser deposition, or physical vapor deposition.

FIGS. 3A-3C illustrate single layer binary metal oxide coating assisted by atonic layer deposition. FIG. 3A illustrates a dose process of a metal precursor consisting of metal element and functional group into the reactor. FIG. 3B illustrates a dose process of $O^{2-}$ component such as H2O or O3. FIG. 3C describes a coated metal oxide on the substrate.

In certain example embodiments, sub-nanoscale metal/transition metal oxide dopings/coatings can be achieved by one or more of chemical vapor deposition, pulse laser deposition, atomic layer deposition, and other deposition techniques. In certain examples of this disclosure, the oxide doping/coating is performed by atomic layer deposition. Other example deposition methods include particle atomic layer deposition with ball mill mechanism.

The use of lithium-ion batteries has substantially increased in recent years, starting with electronics and expanding into large-scale applications including the growing electric and hybrid vehicle industry and utility-scale energy storage markets. Energy density of existing lithium-ion batteries has been limited to less than 200 Wh/kg due to selection of cathode and anode materials. Therefore, higher energy cathode and anode materials are desirable.

Nickel-rich (Ni-rich) oxides are one group of promising cathode materials that demonstrate more than 200 mAh/g under 4.3 V vs. Li/Li$^+$ operation. However, Ni-rich cathodes are vulnerable surface to oxidation, decomposition, and formation of solid-electrolyte interphase (SEI), substantially shortening their lifetime. Because of this shorter life compared to conventional lithium-ion battery cathodes commercialization of Ni-rich cathodes has not been feasible. Likewise, silicon (Si) anodes have a specific capacity of 4200 mAh/g. This is substantially larger than the currently commercialized graphite anodes (380 mAh/g). However, silicon anodes also suffer severe SEI formation, volume expansion, and fracture. Attempts have been made to make composites of Si and graphite, but the cyclic stability of the resulting composites has remained too low for the composites to be commercialized.

The present disclosure addresses these challenges by extrinsic treatments such as doping or coating. In some embodiments, the use of multi-elemental and multi-functional doping and ultrathin (<1 nm) coatings through layer-by-layer deposition by using atomic layer deposition provides for improved cathode and anode characteristics. Additionally, conductive polymer and carbon coatings may provide enhanced electronic network and higher packing density of the electrodes. The layer-by-layer deposition technology of the present disclosure provides a commercially viable way to address surface instability and enable more than 300 Wh/kg in a Li-ion battery systems by using well-protected Ni-rich cathodes and Si/graphite composite anodes.

Ni-rich cathodes and Si/Graphite composite anodes are candidates for future Li-ion battery materials with the potential to achieve over 300 Wh/kg in a full cell. However, current implementations of Ni-rich cathodes and Si/Graphite composite anodes have several disadvantages that may result than a shorter lifetime than is commercially viable. The methods and apparatus disclosed herein makes it possible to commercialize Ni-rich cathodes and Si/Graphite composite anodes by addressing their challenges on the surface level, which enables production of high energy battery materials with prolonged lifetime. Specific advantages of the methods and compositions disclosed herein include suppression of surface oxidation on surface, suppression of gas evolution on surface, suppression of solid electrolyte interphase, suppression of crack generation and propagation, extended storage life, extended cycle life, and faster kinetics.

The cathode and anode materials described below may be applied to any lithium-ion battery, including solid-state lithium batteries, lithium metal batteries, lithium sulfur batteries, and lithium air batteries. Further the metal and metal oxide deposition and doping techniques described below may be applied to any electrode material, including the ALD deposited electrode materials described above.

The active electrode materials of the present disclosure are described below. Cathode materials include Ni-rich cathodes. In some embodiments, the Ni-rich cathode includes less than 0.05 mol of impurities and other elements and less than 5 percentage by weight of residual lithium compounds on the surface. In a certain embodiments, the Ni-rich cathode may have the formula $Li_{1+a}Ni_xCo_yMn_zAl_{1-x-y-z}O_2$ where $0.0<=a<=1.0, 0.5<=x<=1.0, 0.0<=y<=0.1, 0.0<=z<=0.1$. In a particular embodiment, the Ni-rich cathode may have the formula $Li_{1+a}Ni_xCo_yMn_zAl_{1-x-y-z}O_2$ where $0.0<=a<=1.0, 0.5<=x<=1.0, 0.0<=y<=0.1, 0.0<=z<=0.1$ and the Ni-rich cathode includes less than 0.05 mol of impurities and other elements and less than 5 percentage by weight of residual lithium compounds on the surface.

Anode materials may include graphite (C). In some embodiments, a graphite anode may include less than 0.05 mol of other elements. Anode materials may also include silicon (Si). A silicon anode may, in some embodiments, include less than 0.05 mol of other elements. Anode materials may also include a composite of graphite and silicon anodes. In some embodiments, a graphite and silicon composite anode may include less than 0.05 mol of other elements.

The cathodes and anodes of the present disclosure may be fashioned as cathode and anode electrode sheets, wherein the cathode or anode material is disposed in a sheet or film like manner. Cathode electrode sheets may include Ni-rich cathode powder (for example. the Ni-rich cathode material describe above), a conductive carbon powder, and a polymeric binder on an aluminum foil, plate, or film. Anode electrode sheets may include a graphite and silicon composite anode as described above, conductive carbon powder, and polymeric binder on a copper foil, plate, or film. The conductive carbon powder of the cathode and anode electrode sheets may include one or more of carbon black, acetylene black, and ketjen black. The polymeric binder of the cathode or anode electrode sheets may include one or more of polyvinylidene fluoride, polytetrafluoroethylene, carboxymethyl cellulose, and Styrene-Butadiene Rubber.

Cathode and anode materials and cathode and anode electrode sheets may, in some embodiments, have an oxide coating. A method for preparing a metal oxide coating on cathode and anode powders and cathode and anode electrode sheets may include the following steps. First, an atomic layer deposition is performed on the cathode or anode material or sheet at a deposition temperature between 20 and 400° C. Possible metal precursors for performing the atomic layer deposition include trimethylaluminum for Al, tetrakis(dimethylamido)titanium for Ti, diethylzinc for Zn, tetrakis(dimethylamido)zirconium for Zr, and tetrakis(dimethylamido)hafnium for Hf In certain implementation, the elements that may be coated include one or more of Al, Ti, Co, Ni, Cu, Si, Ge, Se, Zr, Nb, W, Sn, Ga, Li, Mg, Sr, Ba, Fe, Hf, Ru, Ta, V, Y. The atomic layer deposition may be performed at a pulse (dose) time for a metal precursor between 0.05 to 60 second to fill the reactor full. In some embodiments, an atomic layer deposition may be performed with one or more pulses (doses) of the same or different metal precursors to deposit different metal elements on the same layer. In some embodiments, atomic layer deposition may be performed with an exposure time between 1 and 3600 seconds until saturation occurs. In some embodiments, atomic layer deposition may be performed with a purge time between 60 and 180 seconds until it reaches an appropriate vacuum state. In other example embodiments, the atomic layer deposition may be performed with an exposure time between 1 and 3600 seconds until saturation. In some embodiments, atomic layer deposition may be performed with H2O and/or ozone to attach oxygen on the metal precursor surface. In some embodiments, the atomic layer deposition may be cycled multiple times.

Figure 26:
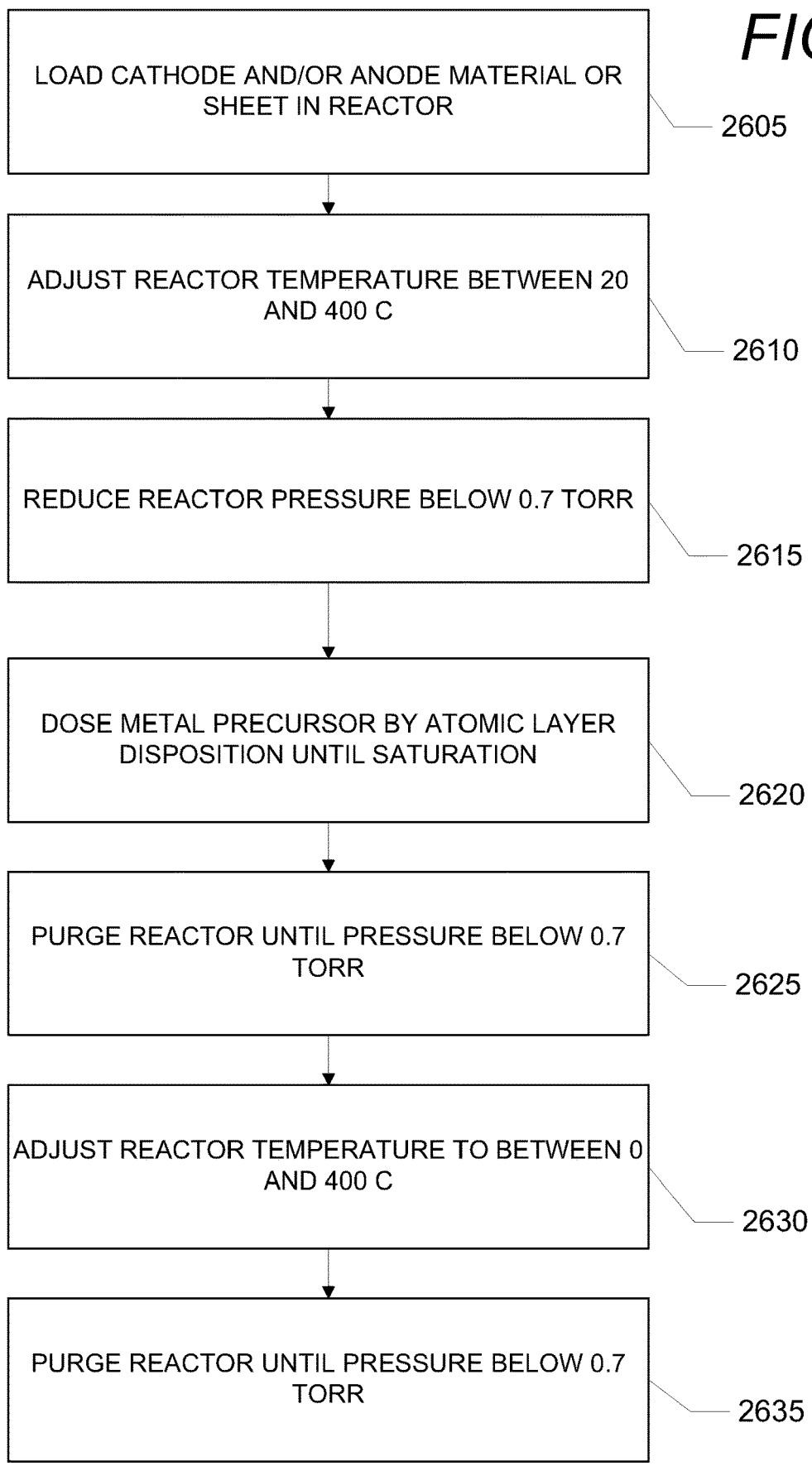
FIGS. 26-28 are flow charts of example methods of applying metal oxide coatings to electrodes.

Cathode and anode materials and cathode and anode electrode sheets may also be doped with various metals. FIG. 2A-2B are illustrations of metal doping performed by atomic layer deposition. A method of metal doping prepared by an atomic layer deposition is described as follows and shown in FIG. 26. First, cathode or anode powder, or cathode or anode electrode sheet, may be loaded in the reactor of the atomic layer deposition system (block 2605). The temperature of the reactor may be increased to between 20 and 400° C. (block 2610). The pressure inside the reactor may be reduced to less than 0.7 torr (block 2615). A metal precursor as described above, may be dosed by atomic layer disposition one or more times as described in the preceding paragraph (block 2620). an exposure time between 1 and 120 seconds may be used until saturation occurs. Next, the reactor may be purged until it reaches the previous vacuum state of less than 0.7 torr (block 2625). In some embodiments, the purge time may be between 60 and 180 seconds. Next, the temperature in the reactor may be increased to decompose the functional group of the metal precursor in a vacuum or inert atmosphere between 80 and 400° C. (block 2630). Next, the reactor may be purged until it reaches the previous vacuum state less than 0.7 torr (block 2635).

Figure 27:
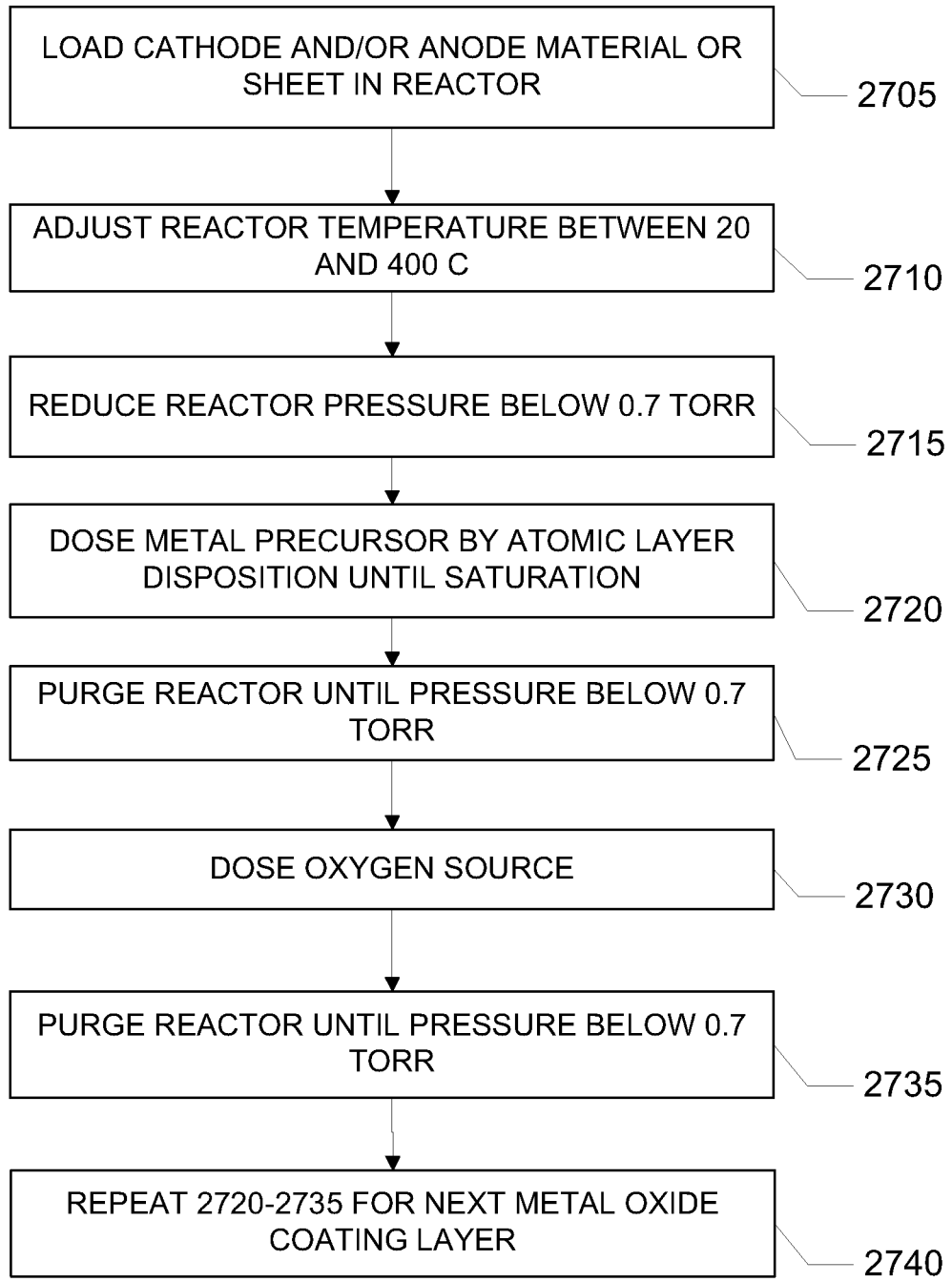

In some embodiments, two metal oxide coatings (a "binary metal oxide coating") may be prepared on the cathode and anode materials and sheets of the present disclosure. A method for preparing a binary metal oxide coating prepared by an atomic layer deposition is described below and illustrated in FIGS. 3A-C and 4A-C and shown as a flow chart in FIG. 27. First, a cathode or anode powder, or cathode or anode electrode sheet, may be loaded in the reactor of the atomic layer deposition system (block 2705). Next, the temperature of the reactor may be increased to between 20 and 400° C. (block 2710). Next, the pressure inside the reactor may be reduced to less than 0.7 torr (block 2715). Next, a metal precursor as described above, may be dosed by atomic layer deposition one or more times as described above (block 2720). An exposure time between 1 and 120 seconds may be used until saturation occurs. Next, the reactor may be purged until it reaches the previous vacuum state of less than 0.7 torr (block 2725). In some embodiments, the purge time may be between 60 and 180 seconds. Next, an oxygen source, such as H2O and/or ozone, may be dosed one or more times (block 2730). An exposure time between 1 and 120 seconds may be used until saturation occurs. Next, reactor may be purged until it reaches the previous vacuum state of less than 0.7 torr (block 2735). Finally, the above steps, beginning with dosing a metal precursor by atomic layer deposition, may be repeated to form a binary metal oxide coating (block 2740), as illustrated in FIG. 4.

Figure 28:
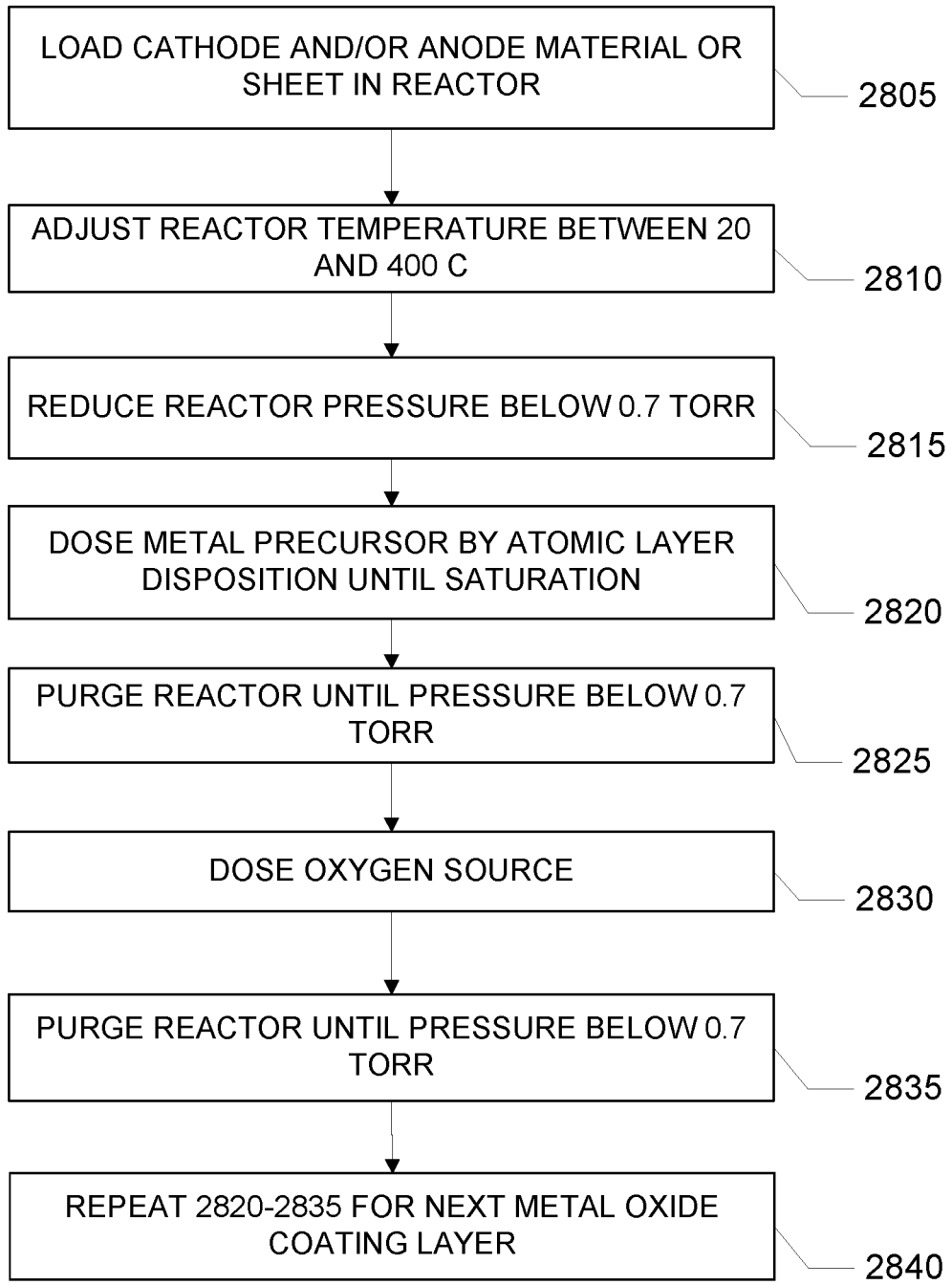

In some embodiments, two, three, or more different metal oxide coatings (a "ternary" or "quaternary" metal oxide coating) may be prepared on the cathode and anode materials and sheets of the present disclosure. FIGS. 5A-5F illustrate a method of preparing a ternary metal oxide coating. FIG. 6A-6I illustrate a method of preparing a quaternary metal oxide coat. FIG. 28 is a flow chart of the method for preparing ternary or quaternary metal oxide coatings. A method for preparing ternary and quaternary metal oxide coating by an atomic layer deposition is described as follows. First, a cathode or anode powder, or cathode or anode electrode sheet, may be loaded in the reactor of the atomic layer deposition system (block 2805). Next, the temperature of the reactor may be increased to between 20 and 400° C. (block 2810). Next, the pressure inside the reactor may be reduced to less than 0.7 torr (block 2815). Next, a metal precursor as described above, may be dosed by atomic layer deposition one or more times as described above (block 2820). An exposure time between 1 and 3600 seconds may be used until saturation occurs. Next, the reactor may be purged until it reaches the previous vacuum state of less than 0.7 torr (block 2825). In some embodiments, the purge time may be between 60 and 180 seconds. Next, an oxygen source, such as H2O and/or ozone, may be dosed one or more times (block 2830). An exposure time between 1 and 3600 seconds may be used until saturation occurs. Next, reactor may be purged until it reaches the previous vacuum state of less than 0.7 torr (block 2835). Next, the steps beginning with dosing a metal precursor by atomic layer deposition may be repeated with a different metal precursor one or more times to form ternary (FIGS. 5A-5F) or quaternary (FIG. 6A-6I) metal oxide precursors (block 2840).

Figure 7A:
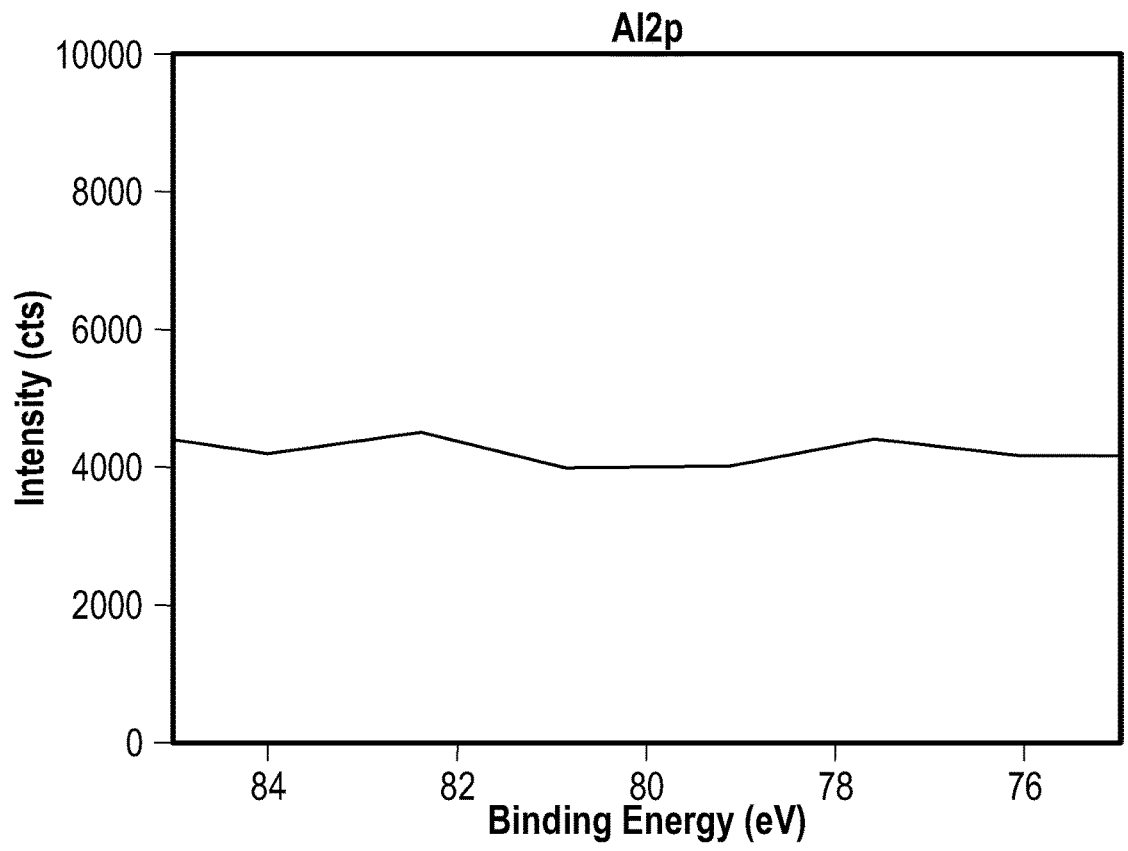
FIGS. 7A-7C are illustrations of X-ray photoelectron spectra of pristine (uncoated) Ni-rich oxide.
Figure 7B:
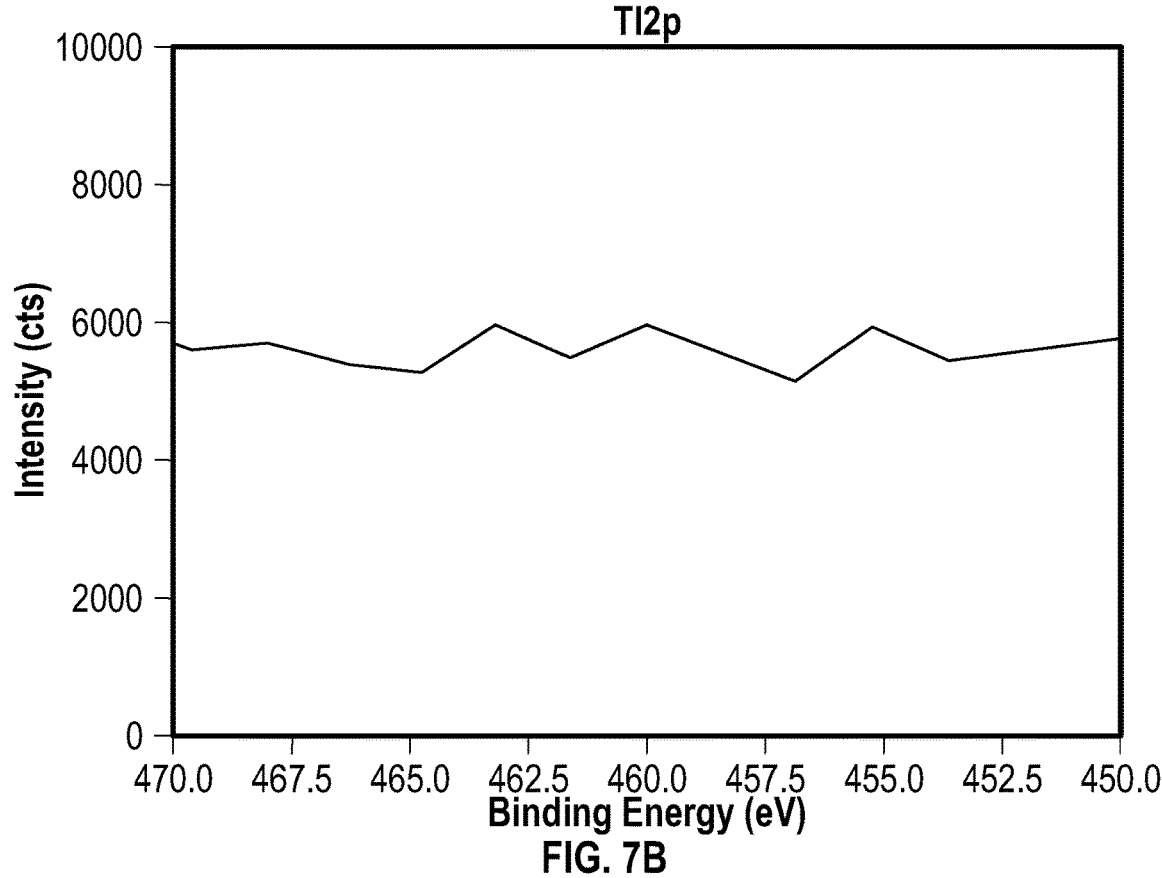
Figure 7C:
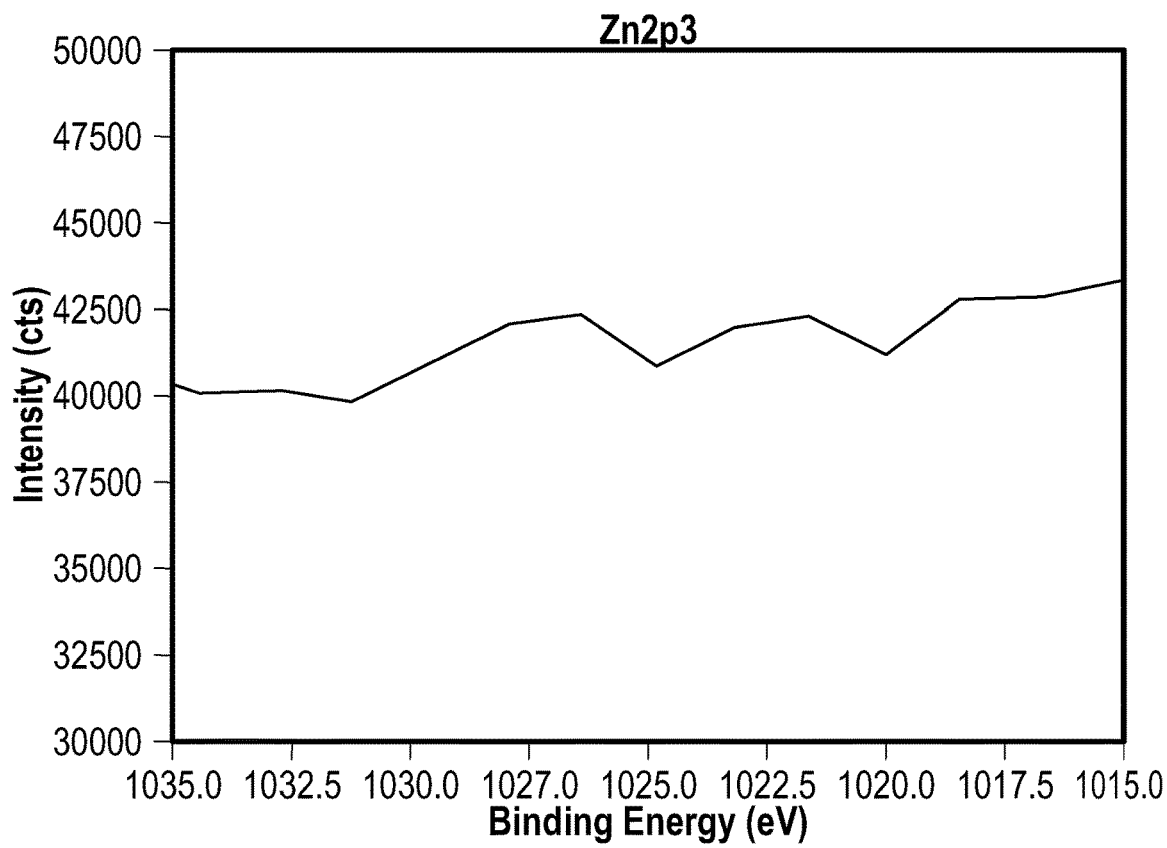
Figure 8A:
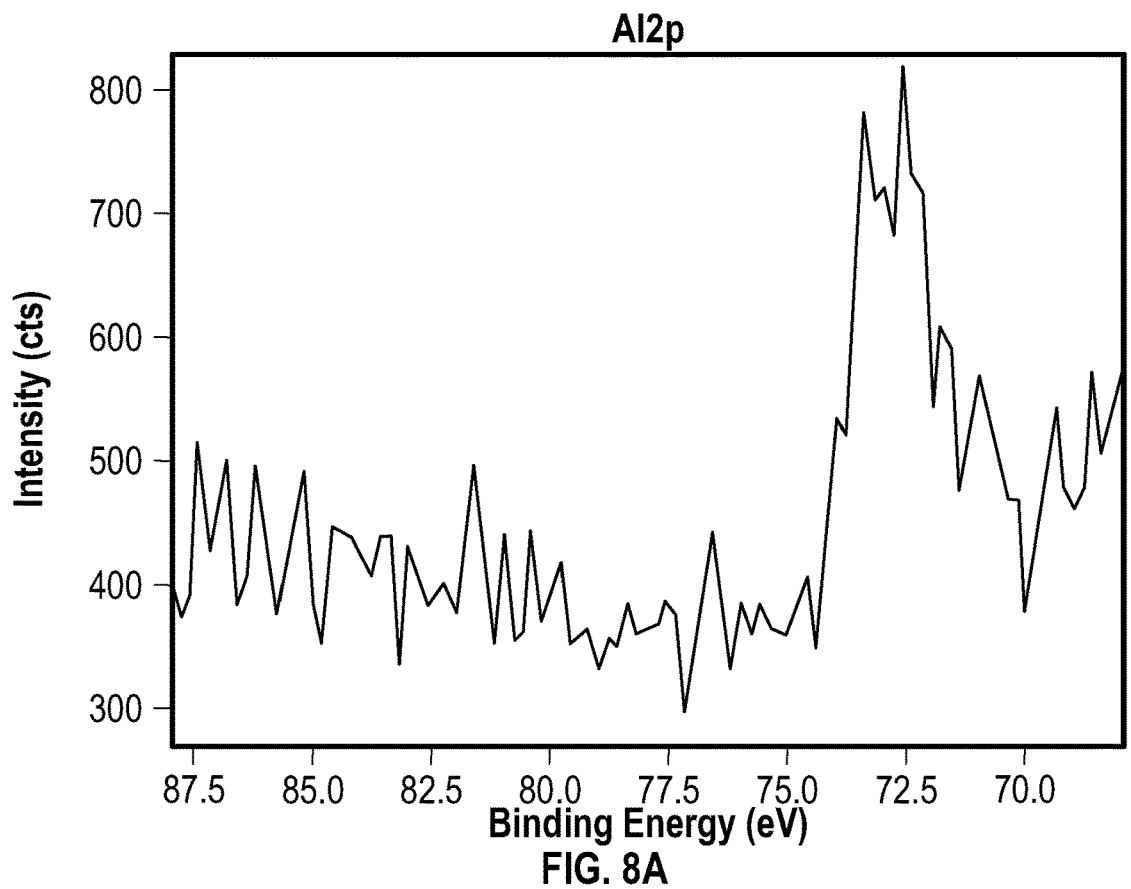
FIGS. 8A-8C are illustration of X-ray photoelectron spectra of Al—O, Ti—O, and Zn—O coated Ni-rich oxide.
Figure 8B:
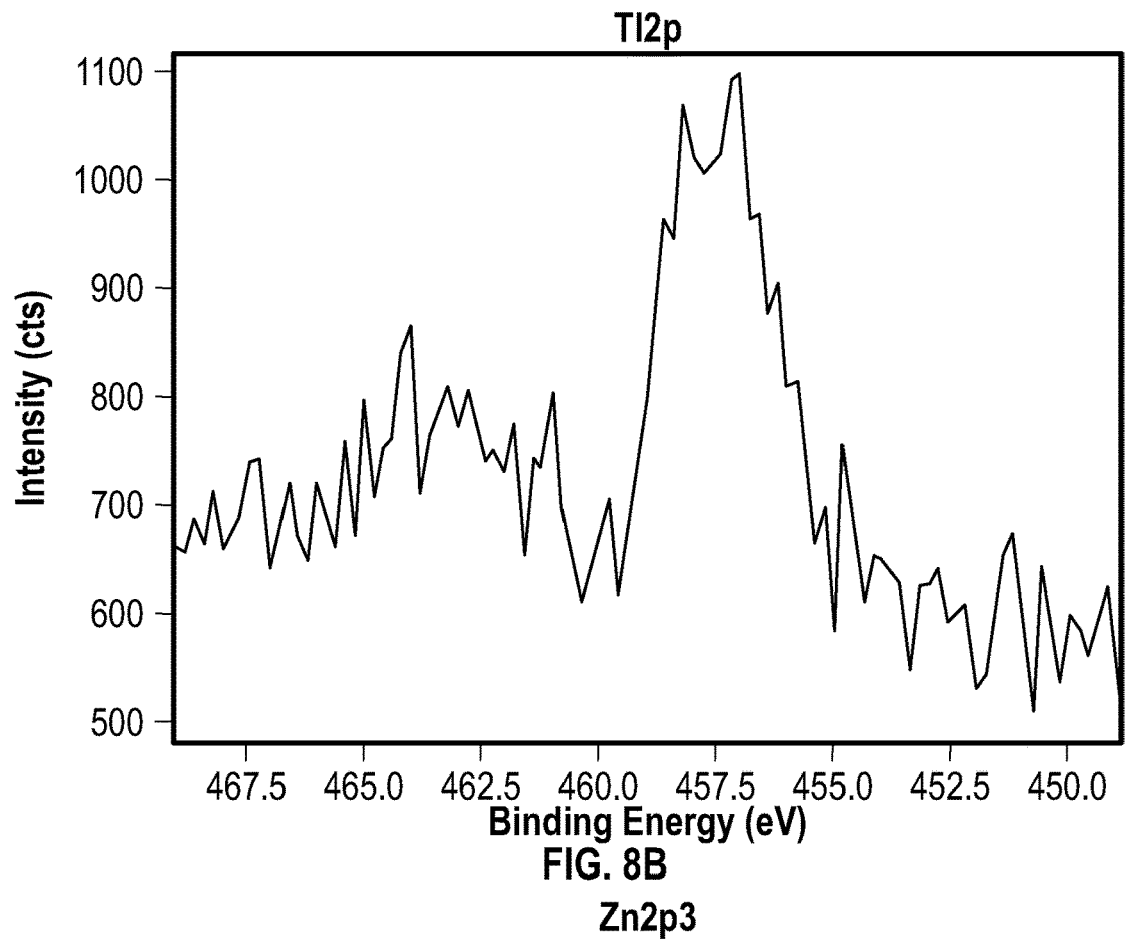
Figure 8C:
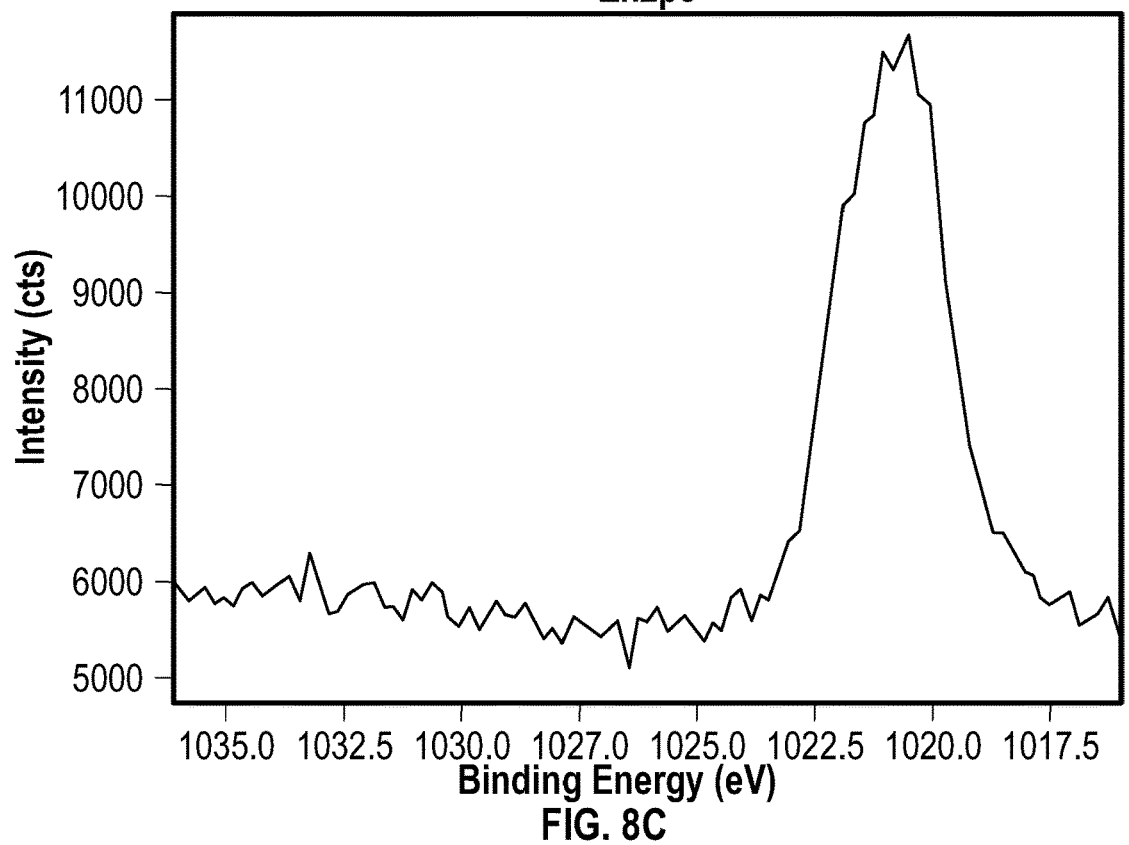

Evidence of the atomic layer deposition coatings disclosed here in provided by X-ray photoelectron spectroscopy is shown in FIGS. 7 and 8. Pristine (uncoated) Ni-rich oxides shows no peaks in the spectra, as illustrated in FIG. 7. FIG. 8 shows that aluminum Oxide (Al—O) coated Ni-rich oxides shows a peak in the Al2p spectra, titanium oxide (Ti—O) coated Ni-rich oxides shows a peak in the Ti2p spectra, and zinc oxide (Zn—O) coated Ni-rich oxides shows a peak in the Zn2p3 spectra.

Figure 9:
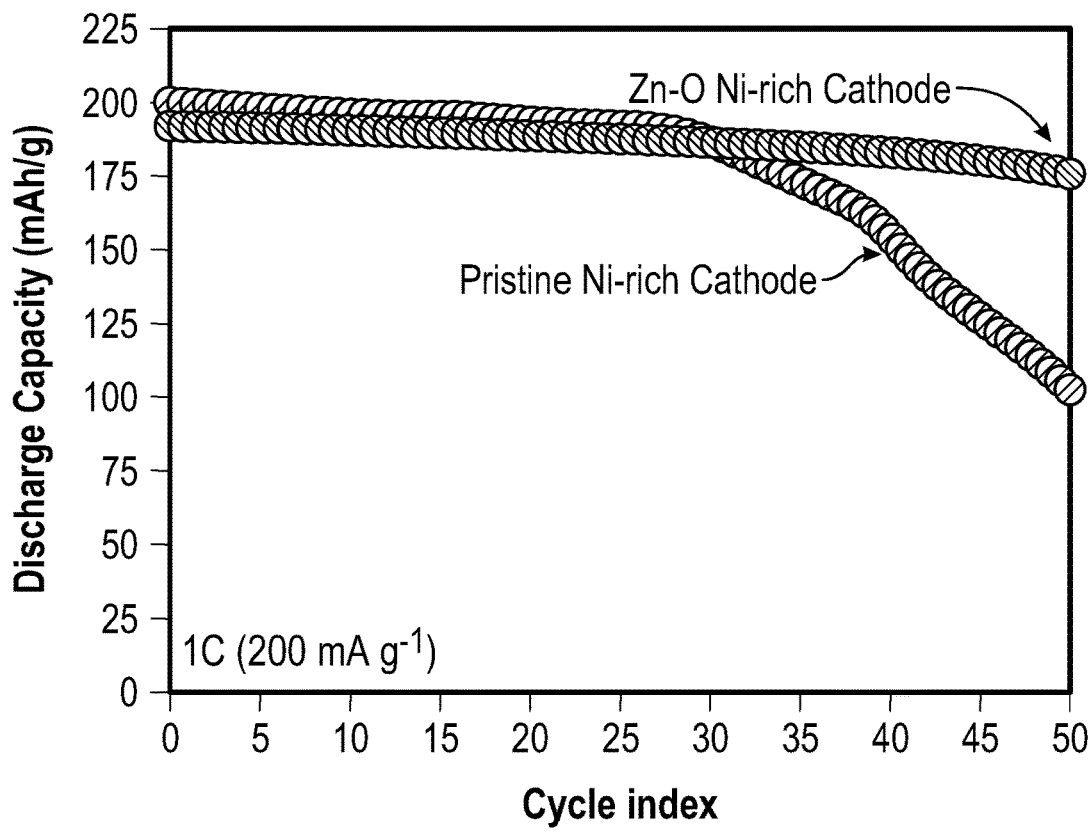
FIG. 9 is an illustration of charge and discharge profiles of pristine and Al—O coated Ni-rich cathodes at 0.1 C (20 mA g$^{-1}$).
Figure 10:
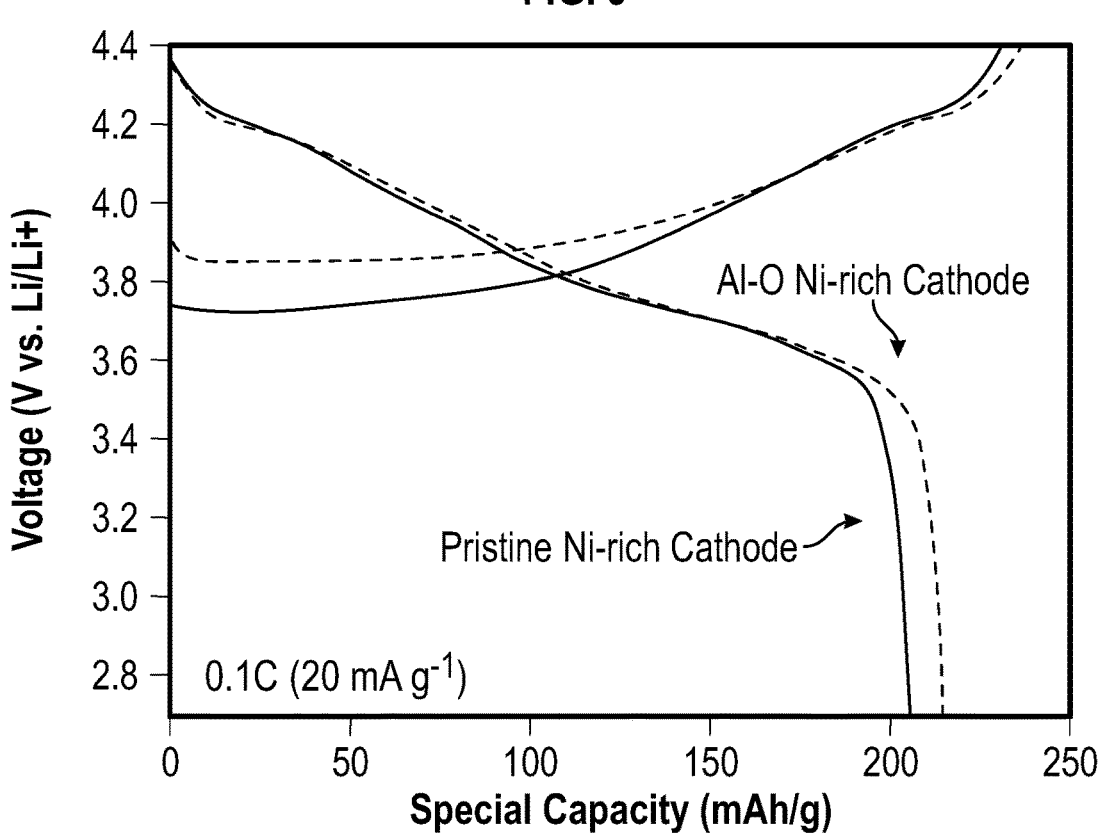
FIG. 10 is an illustration of rate capability of pristine and Al—O coated Ni-rich cathodes at 0.1 C (20 mA g$^{-1}$), 0.2 C (40 mA g$^{-1}$), 0.5 C (100 mA g$^{-1}$), 1 C (200 mA g$^{-1}$), 2 C (400 mA g$^{-1}$), 5 C (1000 mA g$^{-1}$).
Figure 11:
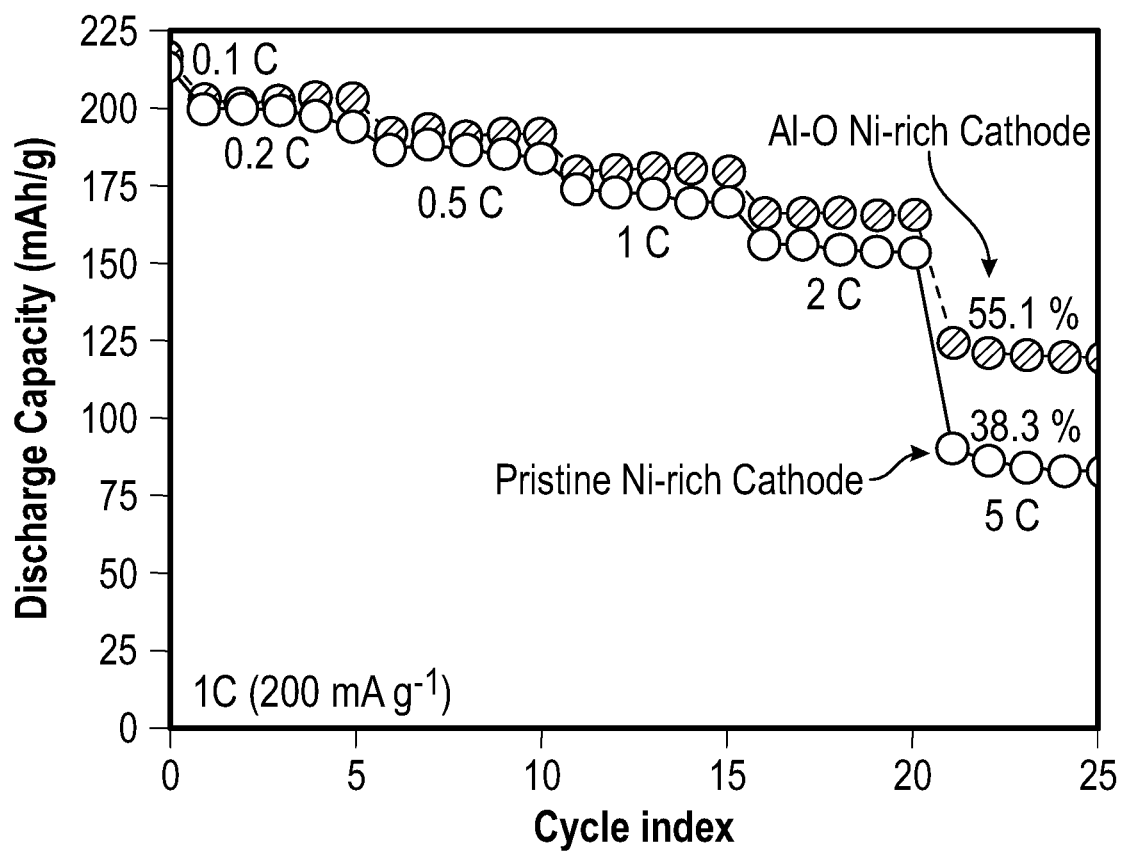
FIG. 11 is an illustration of rate capability of pristine (uncoated) and aluminum oxide coated Ni-rich cathode (LiNi$_{0.8}$Co$_{0.1}$Mn$_{0.1}$O$_2$) half cells between 2.7 and 4.4 V vs. Li/Li$^+$ at 0.1 C, 0.2 C, 0.5 C, 1 C, 2 C, and 5 C. Sub-nanoscale aluminum oxide coating improves the charge and discharge capacities at various C-rates (0.1 C, 0.2 C, 0.5 C, 1 C, 2 C, and 5 C) due to an enhanced surface conductivity on the 80% Ni Ni-rich cathode material.

Half-cell data of pristine and coated Ni-rich oxides are sown in FIGS. 9-11. FIG. 9 is an illustration of cycle performance of pristine and Zn—O coated Ni-rich cathodes at 1 C (200 mA g-1). FIG. 10 is an illustration of charge and discharge profiles of pristine and Al—O coated Ni-rich cathodes at 0.1 C (20 mA g-1). FIG. 11 is an illustration of rate capability of pristine and Al—O coated Ni-rich cathodes at 0.1 C (20 mA g-1), 0.2 C (40 mA g-1), 0.5 C (100 mA g-1), 1 C (200 mA g-1), 2 C (400 mA g-1), 5 C (1000 mA g-1).

Figure 12:
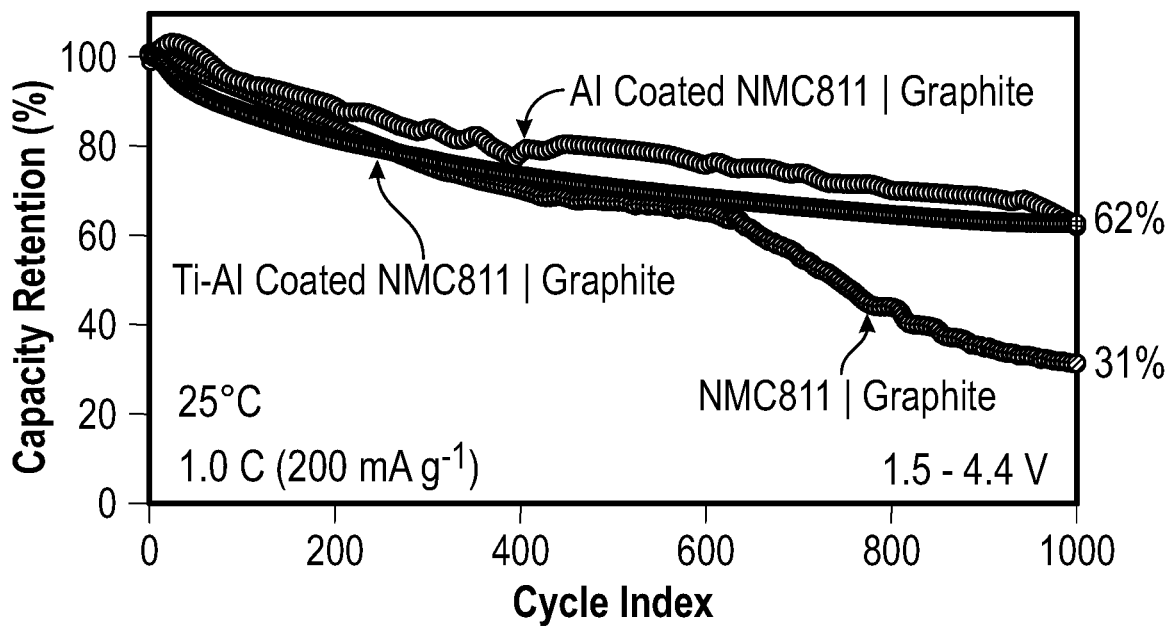
FIG. 12 is an illustration of cycle performance of pristine (uncoated), aluminum oxide coated, and titanium aluminum oxide coated Ni-rich cathode (LiNi$_{0.8}$Co$_{0.1}$Mn$_{0.1}$O$_2$) full cells with graphite anodes at 1 C (200 mA g$^{-1}$) between 1.5 and 4.4 V. Sub-nanoscale binary oxide (aluminum oxide) and ternary oxide (titanium aluminum oxide) coatings improve surface protection on the 80% Ni Ni-rich cathode material, resulting in improved cycle performance at the higher cut-off voltage of 4.4 V.
Figure 13:
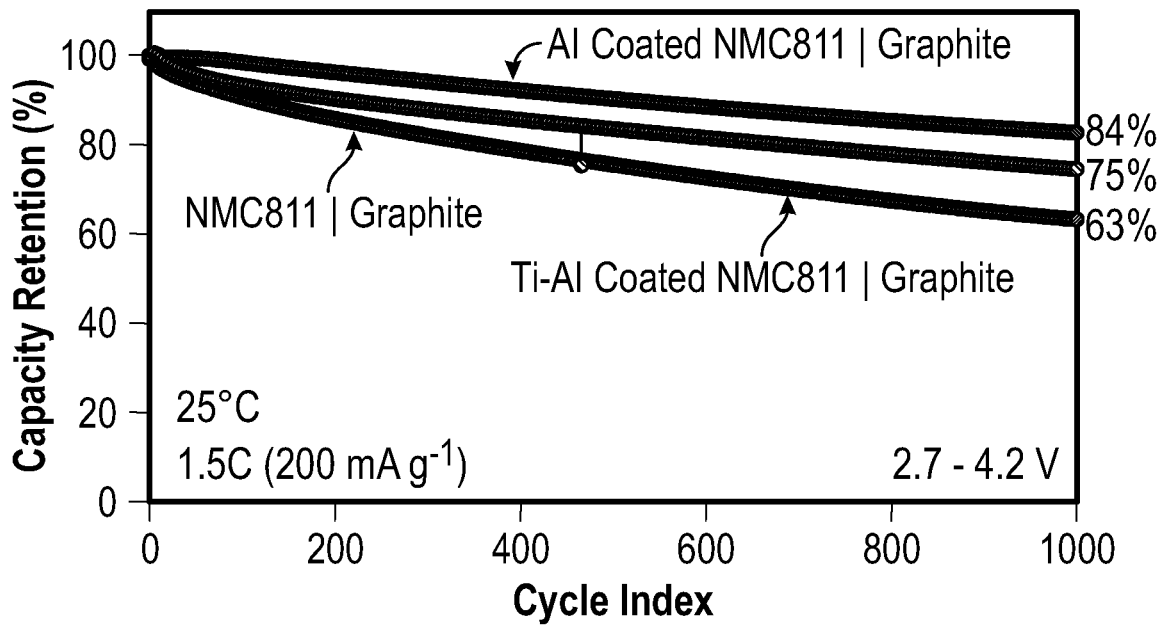
FIG. 13 is an illustration of cycle performance of pristine (uncoated), aluminum oxide coated, and titanium aluminum oxide coated Ni-rich cathode (LiNi$_{0.8}$Co$_{0.1}$Mn$_{0.1}$O$_2$) full cells with graphite anodes at 1 C (200 mA g$^{-1}$) between 2.7 and 4.2 V. Sub-nanoscale binary oxide (aluminum oxide) and ternary oxide (titanium aluminum oxide) coatings improve surface protection on the 80% Ni Ni-rich cathode material, resulting in improved cycle performance at the typical cut-off voltage of 4.2 V.
Figure 14:
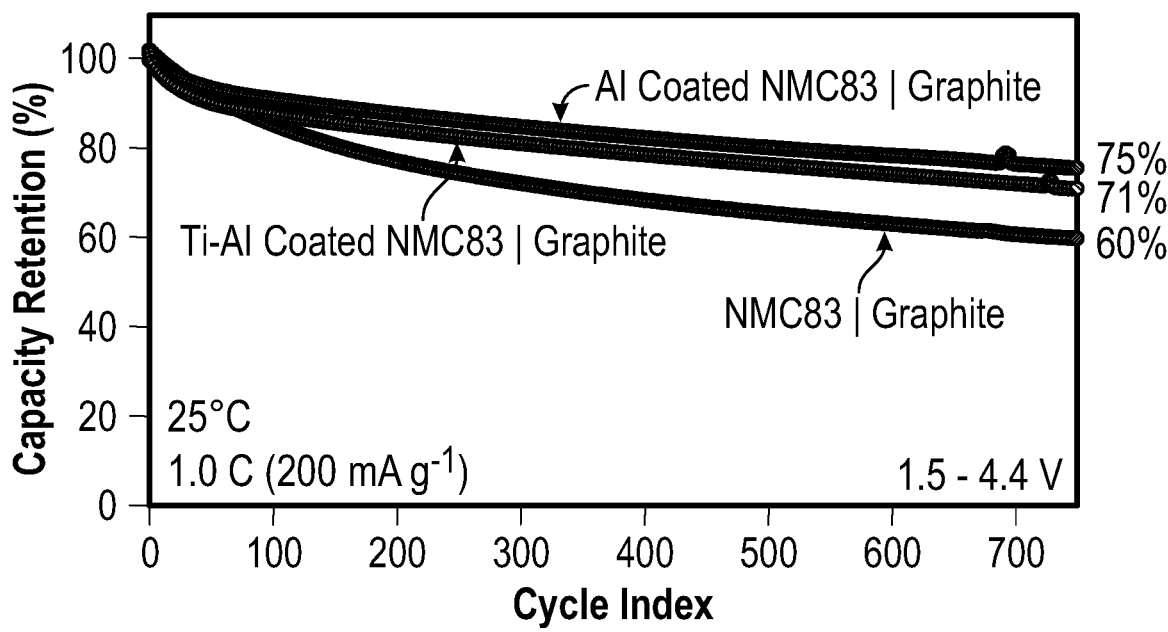
FIG. 14 is an illustration of cycle performance of pristine (uncoated), aluminum oxide coated, and titanium aluminum oxide coated Ni-rich cathode ($LiNi_{0.83}Co_{0.09}Mn_{0.08}O_2$) full cells with graphite anodes at 1 C (200 mA $g^{-1}$) between 1.5 and 4.4 V. Sub-nanoscale binary oxide (aluminum oxide) and ternary oxide (titanium aluminum oxide) coatings improve surface protection on the 83% Ni Ni-rich cathode material, resulting in improved cycle performance at the higher cut-off voltage of 4.4 V.
Figure 15:
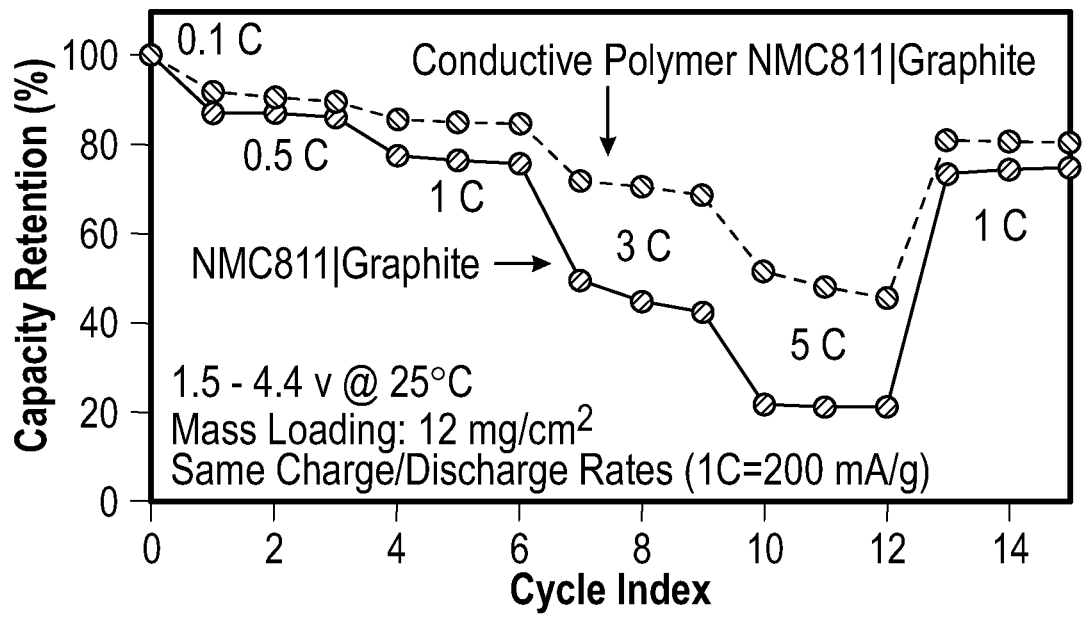
FIG. 15 is an illustration of rate capability of pristine (uncoated) and conductive polymer Ni-rich cathode ($LiNi_{0.8}Co_{0.1}Mn_{0.1}O_2$) full cells with graphite anodes between 1.5 and 4.4 V at 0.1 C, 0.5 C, 1 C, 3 C, and 5 C. Conductive polymer coating using polyaniline improves surface conductivity on the 80% Ni Ni-rich cathode material, resulting in improved rate capability at the higher cut-off voltage of 4.4 V.
Figure 16:
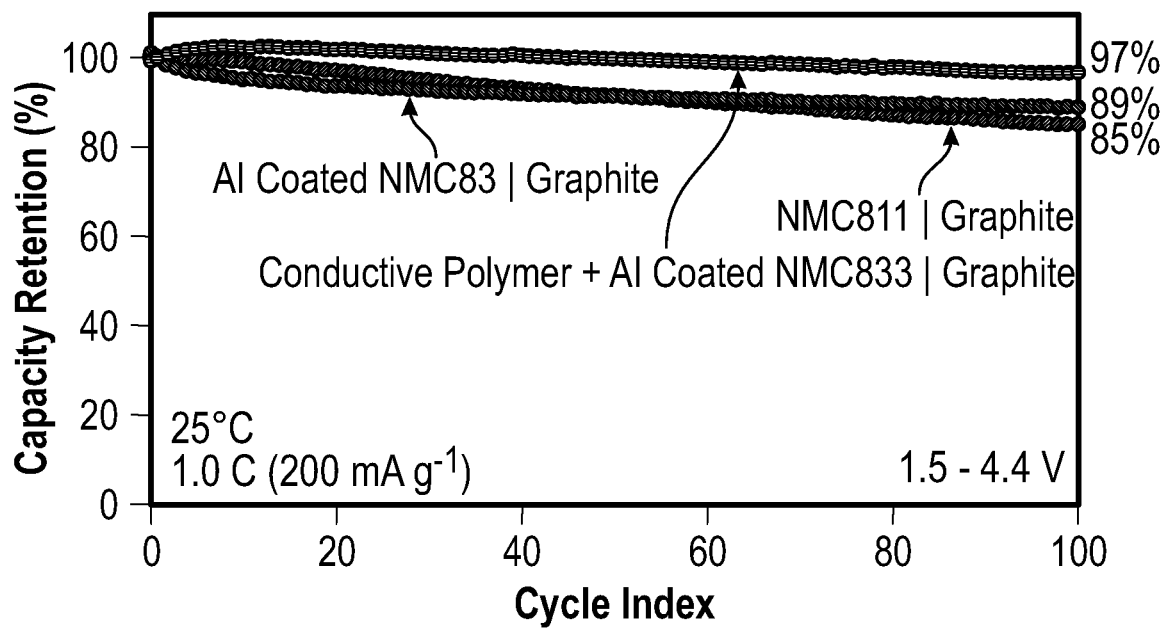
FIG. 16 is an illustration of cycle performance of pristine (uncoated), aluminum oxide coated, and conductive polymer/aluminum oxide coated Ni-rich cathode ($LiNi_{0.83}Co_{0.09}Mn_{0.08}O_2$) full cells with graphite anodes at 1 C (200 mA $g^{-1}$) between 1.5 and 4.4 V. Sub-nanoscale binary oxide (aluminum oxide) coating improves surface protection on the 83% Ni Ni-rich cathode material, resulting in improved cycle performance at the higher cut-off voltage of 4.4 V. The combination of conductive polymer and sub-nanoscale binary oxide coatings further improves the cycle performance of the 83% Ni Ni-rich cathode material at the high cut-off voltage of 4.4 V.

Full-cell data of pristine and coated Ni-rich oxides with graphite as a counter electrode are shown in FIGS. 12-16. FIG. 12 is an illustration of cycle performance of pristine (uncoated), aluminum oxide coated, and titanium aluminum oxide coated Ni-rich cathode ($LiNi_{0.8}Co_{0.1}Mn_{0.1}O_2$) full cells with graphite anodes at 1 C (200 mA $g^{-1}$) between 1.5 and 4.4 V. FIG. 13 is an illustration of cycle performance of pristine (uncoated), aluminum oxide coated, and titanium aluminum oxide coated Ni-rich cathode ($LiNi_{0.8}Co_{0.1}Mn_{0.1}O_2$) full cells with graphite anodes at 1 C (200 mA $g^{-1}$) between 2.7 and 4.2 V. FIG. 14 is an illustration of cycle performance of pristine (uncoated), aluminum oxide coated, and titanium aluminum oxide coated Ni-rich cathode ($LiNi_{0.83}Co_{0.09}Mn_{0.08}O_2$) full cells with graphite anodes at 1 C (200 mA $g^{-1}$) between 1.5 and 4.4 V. FIG. 15 is an illustration of rate capability of pristine (uncoated) and conductive polymer Ni-rich cathode ($LiNi_{0.8}Co_{0.1}Mn_{0.1}O_2$) full cells with graphite anodes between 1.5 and 4.4 V at 0.1 C, 0.5 C, 1 C, 3 C, and 5 C. FIG. 16 is an illustration of cycle performance of pristine (uncoated), aluminum oxide coated, and conductive polymer/aluminum oxide coated Ni-rich cathode ($LiNi_{0.83}Co_{0.09}Mn_{0.08}O_2$) full cells with graphite anodes at 1 C (200 mA $g^{-1}$) between 1.5 and 4.4 V.

Example conductive polymer coatings can be achieved by various methods such as solid-state method, sol-gel method, and hydrothermal, but in certain embodiments, anon-aqueous, non-annealing coating method is used. This example method does not require a high temperature annealing process and a filtration process, resulting in a cost-effective, scale-able, and commercialization-friendly process.

Figure 29:
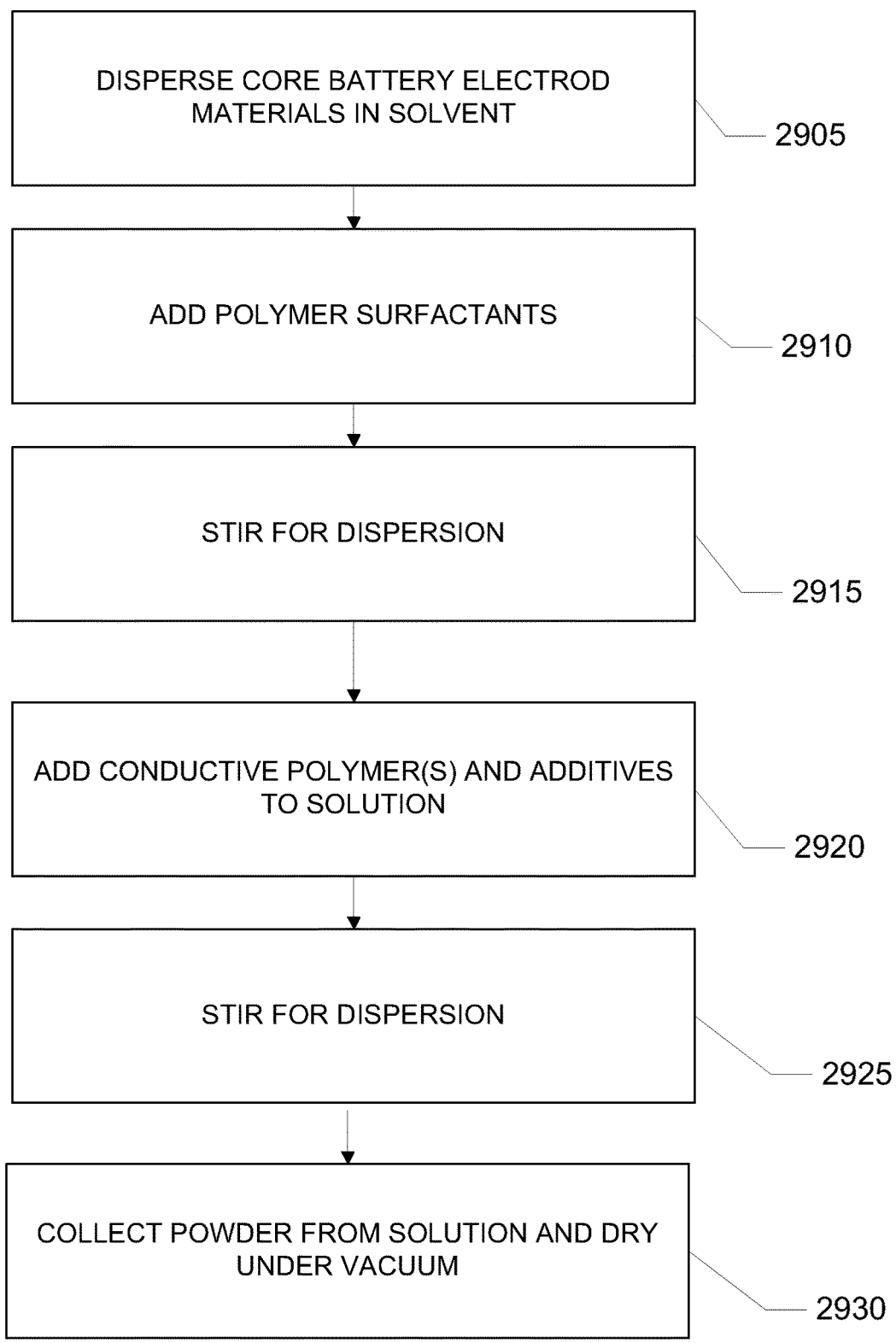
FIG. 29 is a flow chart of an example method of applying one or more conductive polymer coatings to electrodes.

A method of conductive polymer coating of electrodes is shown in FIG. 29. Example core battery electrode (for example, cathode and/or anode) materials are dispersed into the solvents (block 2905). Example solvents include but are not limited to N-methyl-2-pyrrolidinone, ethanol, isopropyl alcohol, acetone, dimethyl carbonate, diethyl carbonate, and ethyl-methyl carbonate. In certain example embodiments, the dispersion is performed without aggregating.

Polymer surfactants are added (block 2910). Example polymer surfactants include but are not limited to sodium dodecyl sulfonate, benalkonium chloride, cocamidopropyl betain, polyvinylpyrrolidone, polyurethane, polystyrene, polyvinylidene fluoride, cetyl alcohol, polytetrafluoroethylene, ethyl cellulose, nitrocellulose and carboxymethyl cellulose.

Stirring is then performed for a complete dispersion (block 2915). The stirring time is between 10 min to 1 hours depending on the solubility. The temperature for blocks 2905-2915 is between 10° C. and 50° C.

One or more conductive polymers and/or additives are then added to the solution (block 2920). Example conductive polymers include but are not limited to polypyrrole, polyaniline, and poly(3,4-ethylenedioxythiophene). Example additives for the conductive polymer coating include but are not limited to amorphous carbon, conductive carbon, conductive graphite, hard carbon, soft carbon, carbon nanotubes, graphene, Cu, Ag, Au, Pt, and Os.

In certain embodiments, the process then includes stirring for complete dispersion (block 2925). The stirring time is between 1 hours to 24 hours depending on the solubility. The temperature is between 50° C. and 120° C.

In certain example embodiments, the powder in the solution at block 2925 is collected and dried under a vacuum (block 2930). The temperature is between 80° C. and 200° C., and the drying time is between 6 hours and 24 hours. Any level of vacuum lower than ambient atmosphere is acceptable. During the collecting process, in certain embodiments, washing with solvents and filtration processed can be performed. Example solvents include but are not limited to N-methyl-2-pyrrolidinone, ethanol, isopropyl alcohol, acetone, dimethyl carbonate, diethyl carbonate, and ethyl-methyl carbonate.

Evidence of improved cycle performance of a zinc oxide coated Ni-rich cathode ($LiNi_{0.8}Co_{0.1}Mn_{0.1}O_2$) half cell over pristine uncoated Ni-rich cathode at 1 C (200 mA $g^{-1}$) between 2.7 and 4.4 V versus Li/Li$^+$ is shown in FIG. 9. In this example implementation, four cycles of zinc oxide coating were performed by using atomic layer deposition assisted by rotary mechanism. Diethylzinc was used for zinc precursor and ozone was used for oxygen precursor. The coated Ni-rich cathode was mixed with carbon black and PVDF with the ratio of 90:5:5 to form a slurry to be casted onto an aluminum foil. The casted electrode was dried and calendared to be prepared for a half cell assembly. The half cell was assembled in a coin cell geometry with a Li foil as a counter electrode. Sub-nanoscale zinc oxide coating on the 80% Ni Ni-rich cathode material has the role of surface protection, resulting in improved cycle retention compared to that of uncoated Ni-rich oxide cathode.

Evidence of larger specific capacity of an aluminum oxide coated Ni-rich cathode ($LiNi_{0.8}Co_{0.1}Mn_{0.1}O_2$) half cell over pristine uncoated Ni-rich cathode at 0.1 C (200 mA $g^{-1}$) between 2.7 and 4.4 V vs. Li/Li+ is shown in FIG. 10. In this example implementation, four cycles of aluminum oxide coating were performed by using atomic layer deposition assisted by rotary mechanism. Trimethylaluminum was used for aluminum precursor and ozone was used for oxygen precursor. The coated Ni-rich cathode was mixed with carbon black and PVDF with the ratio of 90:5:5 to form a slurry to be casted onto an aluminum foil. The casted electrode was dried and calendared to be prepared for a half cell assembly. The half cell was assembled in a coin cell geometry with a Li foil as a counter electrode. Sub-nanoscale aluminum oxide coating on the 80% Ni-rich cathode material improves the discharge capacity at the first cycle at the lower C-rate, improving the first cycle Coulombic efficiency.

Evidence of enhanced rate capability of an aluminum oxide coated Ni-rich cathode ($LiNi_{0.8}Co_{0.1}Mn_{0.1}O_2$) half cell over pristine uncoated Ni-rich cathode at 0.1 C (200 mA $g^{-1}$) between 2.7 and 4.4 V vs. Li/Li$^+$ at 0.1 C, 0.2 C, 0.5 C, 1 C, 2 C, and 5 C is shown in FIG. 11. In this example implementation, four cycles of aluminum oxide coating were performed by using atomic layer deposition assisted by rotary mechanism. Trimethylaluminum was used for aluminum precursor and ozone was used for oxygen precursor. The coated Ni-rich cathode was mixed with carbon black and PVDF with the ratio of 90:5:5 to form a slurry to be casted onto an aluminum foil. The casted electrode was dried and calendared to be prepared for a half cell assembly. The half cell was assembled in a coin cell geometry with a Li foil as a counter electrode. Sub-nanoscale aluminum oxide coating improves the charge and discharge capacities at various C-rates (0.1 C, 0.2 C, 0.5 C, 1 C, 2 C, and 5 C) due to an enhanced surface conductivity on the 80% Ni Ni-rich cathode material.

Evidence of improved cycle performance of aluminum oxide coated and titanium aluminum oxide coated Ni-rich cathode ($LiNi_{0.8}Co_{0.1}Mn_{0.1}O_2$) full cells with graphite anodes compared to pristine (uncoated) Ni-rich cathode at 1 C (200 mA g−1) between 1.5 and 4.4 is shown in FIG. 12. In this example implementation, four cycles of aluminum oxide coating were performed for aluminum oxide coated Ni-rich cathode, and two cycles of titanium oxide and subsequent two cycles of aluminum oxide coating were conducted for titanium aluminum coated Ni-rich cathode. Both were by using atomic layer deposition assisted by rotary mechanism. Trimethylaluminum was used for aluminum precursor, tetrakis(dimethylamido)titanium for titanium precursor, and ozone was used for oxygen precursor. The coated Ni-rich cathode was mixed with carbon black and PVDF with the ratio of 90:5:5 to form a slurry to be casted onto an aluminum foil. The graphite anode was prepared by mixing with carbon black and PVDF with the ratio of 90:5:5 to form a slurry and casted onto a copper foil. The casted electrodes were dried and calendared to be prepared for a full cell assembly. The full cell was assembled in a coin cell geometry. Sub-nanoscale binary oxide (aluminum oxide) and ternary oxide (titanium aluminum oxide) coatings improve surface protection on the 80% Ni Ni-rich cathode material, resulting in improved cycle performance at the higher cut-off voltage of 4.4 V.

Evidence of improved cycle performance of aluminum oxide coated and titanium aluminum oxide coated Ni-rich cathode ($LiNi_{0.8}Co_{0.1}Mn_{0.1}O_2$) full cells with graphite anodes compared to the pristine at 1 C (200 mA $g^{-1}$) between 2.7 and 4.2 V is shown in FIG. 13. In this example implementation, four cycles of aluminum oxide coating were performed for aluminum oxide coated Ni-rich cathode, and two cycles of titanium oxide and subsequent two cycles of aluminum oxide coating were conducted for titanium aluminum coated Ni-rich cathode. Both were by using atomic layer deposition assisted by rotary mechanism. Trimethylaluminum was used for aluminum precursor, tetrakis(dimethylamido)titanium for titanium precursor, and ozone was used for oxygen precursor. The coated Ni-rich cathode was mixed with carbon black and PVDF with the ratio of 90:5:5 to form a slurry to be casted onto an aluminum foil. The graphite anode was prepared by mixing with carbon black and PVDF with the ratio of 90:5:5 to form a slurry and casted onto a copper foil. The casted electrodes were dried and calendared to be prepared for a full cell assembly. The full cell was assembled in a coin cell geometry. Sub-nanoscale binary oxide (aluminum oxide) and ternary oxide (titanium aluminum oxide) coatings improve surface protection on the 80% Ni Ni-rich cathode material, resulting in improved cycle performance at the typical cut-off voltage of 4.2 V.

Evidence of improved cycle performance of aluminum oxide and titanium aluminum oxide coated Ni-rich cathode ($LiNi_{0.83}Co_{0.09}Mn_{0.08}O_2$) full cells with graphite anodes at 1 C (200 mA $g^{-1}$) between 1.5 and 4.4 V is shown in FIG. 14. In this example implementation, four cycles of aluminum oxide coating were performed for aluminum oxide coated Ni-rich cathode, and two cycles of titanium oxide and subsequent two cycles of aluminum oxide coating were conducted for titanium aluminum coated Ni-rich cathode. Both were by using atomic layer deposition assisted by rotary mechanism. Trimethylaluminum was used for aluminum precursor, tetrakis(dimethylamido)titanium for titanium precursor, and ozone was used for oxygen precursor. The coated Ni-rich cathode was mixed with carbon black and PVDF with the ratio of 90:5:5 to form a slurry to be casted onto an aluminum foil. The graphite anode was prepared by mixing with carbon black and PVDF with the ratio of 90:5:5 to form a slurry and casted onto a copper foil. The casted electrodes were dried and calendared to be prepared for a full cell assembly. The full cell was assembled in a coin cell geometry. Sub-nanoscale binary oxide (aluminum oxide) and ternary oxide (titanium aluminum oxide) coatings improve surface protection on the 83% Ni Ni-rich cathode material, resulting in improved cycle performance at the higher cut-off voltage of 4.4 V.

Evidence of enhanced rate capability of a conductive polymer Ni-rich cathode ($LiNi_{0.8}Co_{0.1}Mn_{0.1}O_2$) full cell with a graphite anode between 1.5 and 4.4 V at 0.1 C, 0.5 C, 1 C, 3 C, and 5 C is shown in FIG. 15. In this specific example, the 80% Ni Ni-rich cathode was dispersed in N-methyl-2-pyrrolidinone with polyvinylpyrrolidone. After a full dispersion, polyaniline was added and mixed. The coated Ni-rich cathode powder in the solution was collected and dried in vacuum. The coated Ni-rich cathode was mixed with carbon black and PVDF with the ratio of 90:5:5 to form a slurry to be casted onto an aluminum foil. The graphite anode was prepared by mixing with carbon black and PVDF with the ratio of 90:5:5 to form a slurry and casted onto a copper foil. The casted electrodes were dried and calendared to be prepared for a full cell assembly. The full cell was assembled in a coin cell geometry. Conductive polymer coating using polyaniline improves surface conductivity on the 80% Ni Ni-rich cathode material, resulting in improved rate capability at the higher cut-off voltage of 4.4 V.

Evidence of improved cycle performance of aluminum oxide coated and conductive polymer/aluminum oxide coated Ni-rich cathode ($LiNi_{0.8}Co_{0.1}Mn_{0.1}O_2$) full cells with graphite anodes at 1 C (200 mA g$^{-1}$) between 1.5 and 4.4 V is shown in FIG. 16. FIG. 16 shows cycle performance of pristine (uncoated), aluminum oxide coated, and conductive polymer/aluminum oxide coated Ni-rich cathode ($LiNi_{0.83}Co_{0.09}Mn_{0.08}O_2$) full cells with graphite anodes at 1 C (200 mA g$^{-1}$) between 1.5 and 4.4 V. In this specific example, four cycles of aluminum oxide coating were performed by using atomic layer deposition assisted by rotary mechanism. Trimethylaluminum was used for aluminum precursor and ozone was used for oxygen precursor. the aluminum coated 80% Ni Ni-rich cathode powder was dispersed in N-methyl-2-pyrrolidinone with polyvinylpyrrolidone. After a full dispersion, polyaniline was added and mixed. The coated Ni-rich cathode powder in the solution was collected and dried in vacuum. The coated cathodes were mixed with carbon black and PVDF with the ratio of 90:5:5 to form a slurry to be casted onto an aluminum foil. The graphite anode was prepared by mixing with carbon black and PVDF with the ratio of 90:5:5 to form a slurry and casted onto a copper foil. The casted electrodes were dried and calendared to be prepared for a full cell assembly. The full cell was assembled in a coin cell geometry. Sub-nanoscale binary oxide (aluminum oxide) coating improves surface protection on the 83% Ni Ni-rich cathode material, resulting in improved cycle performance at the higher cut-off voltage of 4.4 V. The combination of conductive polymer and sub-nanoscale binary oxide coatings further improves the cycle performance of the 83% Ni Ni-rich cathode material at the high cut-off voltage of 4.4 V.

Figure 17A:
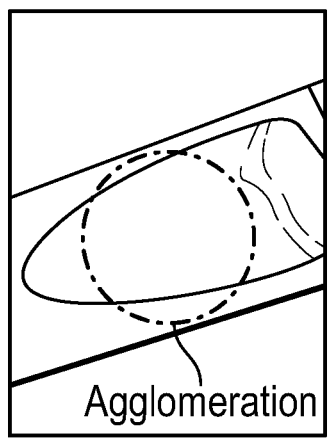
FIGS. 17A-17C are illustrations of electrode photos of (17A, 17B) pristine (uncoated) silicon-graphite composite and (17C) titanium oxide coated silicon-graphite composite. Pristine (uncoated) silicon-graphite composite electrode shows (17A) agglomeration of particles and (17B) fractures due to the inhomogeneity of the electrode slurry resulting from incompatible surface chemistry between silicon and graphite. With the titanium oxide coating, the inhomogeneity and incompatibility were addressed, and the electrode shows no agglomeration, aggregation, nor fractures as observed in (17C).
Figure 17B:
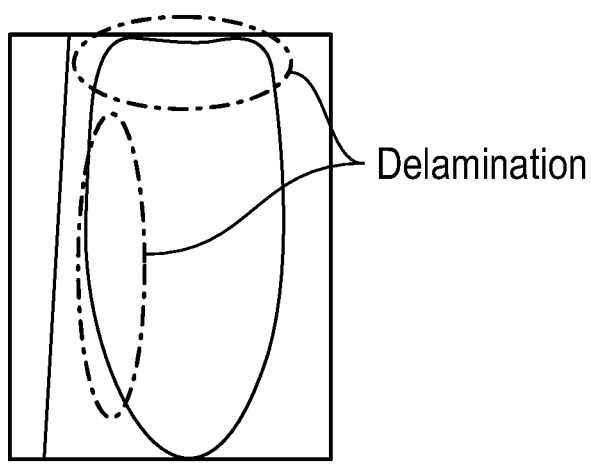
Figure 17C:
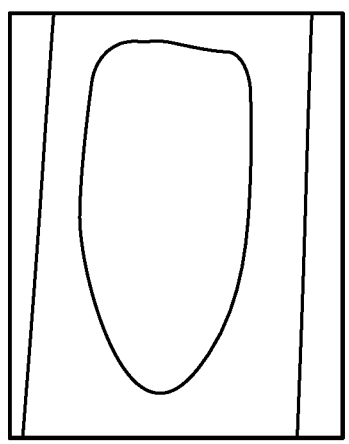

Evidence of improved homogeneity of the silicon-graphite composite anode as shown in the electrode photos of a (a, b) pristine (uncoated) silicon-graphite composite and a (c) titanium oxide coated silicon and graphite composite is shown in FIG. 17. In this specific example, 5% uncoated silicon and 95% graphite powders were mixed. The homogeneous silicon-graphite mixture was mixed with carbon black and PVDF with the ratio of 90:5:5 to form a slurry to be casted onto a carbon-coated copper foil. For titanium oxide coated silicon-graphite composite, ten cycles of titanium oxide coating were performed by using atomic layer deposition assisted by ball-mill mechanism. Tetrakis(dimethylamido)titanium was used for titanium precursor and ozone was used for oxygen precursor. Then, the coated silicon powder missed with graphite powder with the ratio of 5:95. The homogeneous silicon-graphite mixture was mixed with carbon black and PVDF with the ratio of 90:5:5 to form a slurry to be casted onto a carbon-coated copper foil. FIG. 17a shows agglomeration of particles and FIG. 17b shows mechanical fractures due to the inhomogeneity of electrode. FIG. 17 is an illustration of electrode photos of (a, b) pristine (uncoated) silicon-graphite composite and (c) titanium oxide coated silicon-graphite composite. Pristine (uncoated) silicon-graphite composite electrode shows (a) agglomeration of particles and (b) fractures due to the inhomogeneity of the electrode slurry resulting from incompatible surface chemistry between silicon and graphite. With the titanium oxide coating, the inhomogeneity and incompatibility were addressed, and the electrode shows no agglomeration, aggregation, nor fractures as observed in (c).

Figure 18A:
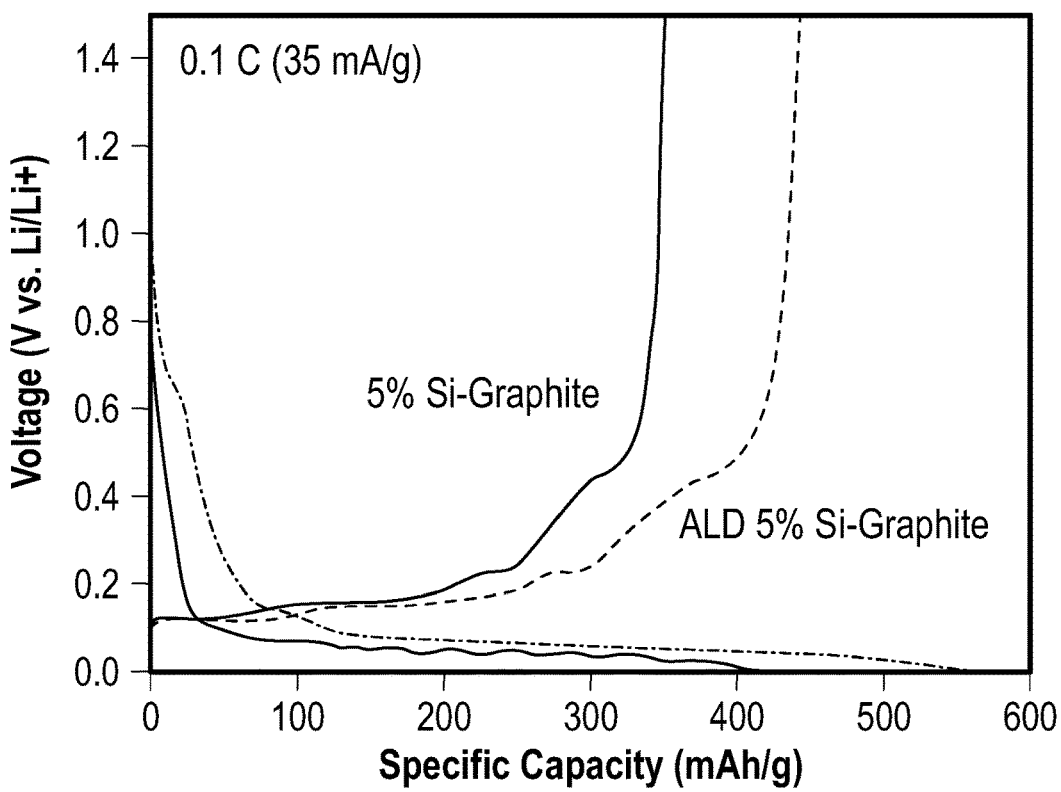
FIGS. 18A and 18B are illustrations of charge and discharge profiles of pristine (uncoated) and titanium oxide coated silicon-graphite composite anode half cells at (a) 0.1 C (35 mA $g^{-1}$) and (b) 0.5 C (175 mA $g^{-1}$) between 0.01 and 1.5 V vs. $Li/Li^+$.
Figure 18B:
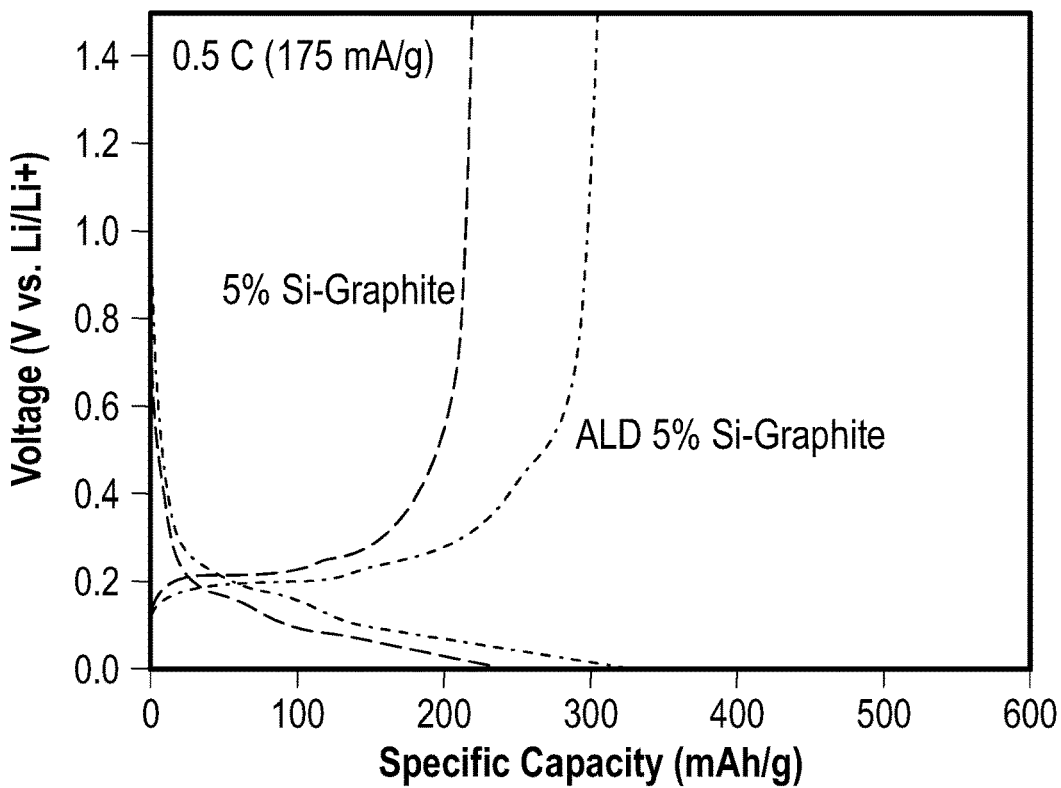

Evidence of improved charge and discharge behaviors of a titanium oxide coated silicon-graphite composite anode half cell at (a) 0.1 C (35 mA g$^{-1}$) and (b) 0.5 C (175 mA g$^{-1}$) between 0.01 and 1.5 V vs. Li/Li$^+$ as shown in FIG. 18. In this specific example, 5% uncoated silicon and 95% graphite powders were mixed. The homogeneous silicon-graphite mixture was mixed with carbon black and PVDF with the ratio of 90:5:5 to form a slurry to be casted onto a carbon-coated copper foil. For titanium oxide coated silicon-graphite composite, ten cycles of titanium oxide coating were performed by using atomic layer deposition assisted by ball-mill mechanism. Tetrakis(dimethylamido)titanium was used for titanium precursor and ozone was used for oxygen precursor. Then, the coated silicon powder missed with graphite powder with the ratio of 5:95. The homogeneous silicon-graphite mixture was mixed with carbon black and PVDF with the ratio of 90:5:5 to form a slurry to be casted onto a carbon-coated copper foil. The casted electrode was dried and calendared to be prepared for a half cell assembly. The half cell was assembled in a coin cell geometry with a Li foil as a counter electrode. FIG. 18 shows charge and discharge profiles of pristine (uncoated) and titanium oxide coated silicon-graphite composite anode half cells at (a) 0.1 C (35 mA g−1) and (b) 0.5 C (175 mA g−1) between 0.01 and 1.5 V vs. Li/Li+. As described above in FIG. 18, the improved silicon-graphite composite electrode shows larger charge and discharge capacities at both 0.1 C and 0.5 C rates.

Figure 19A:
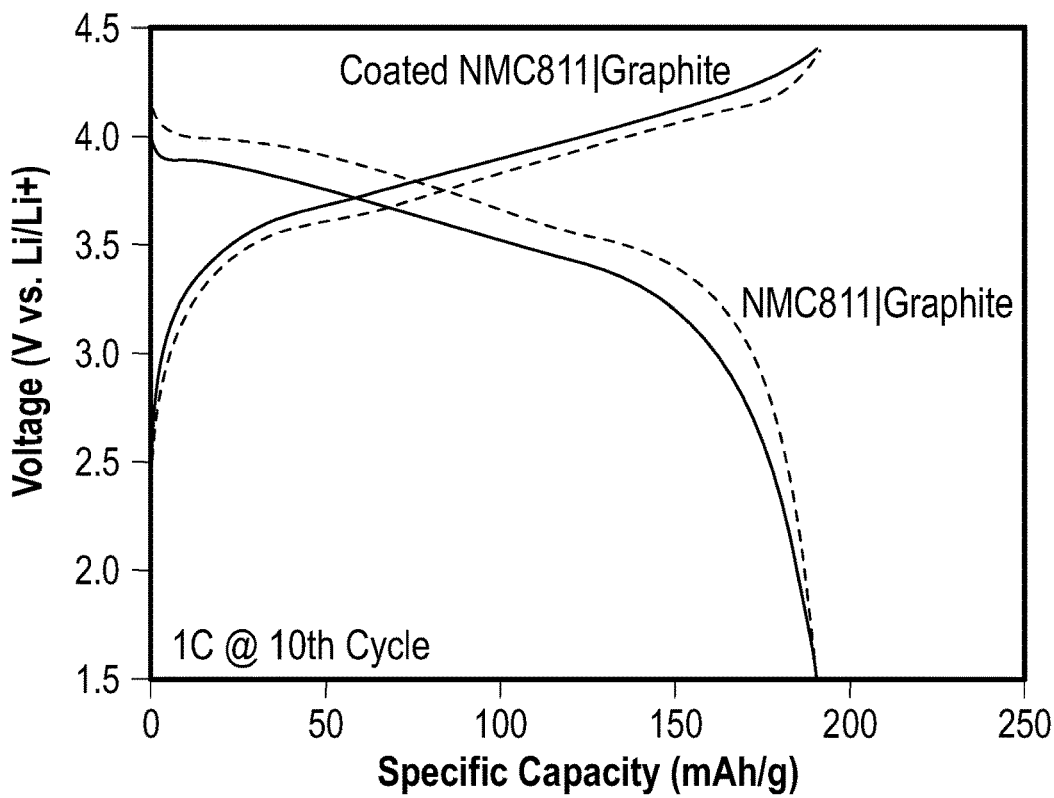
FIGS. 19A-19C are illustrations of charge and discharge profiles of pristine (uncoated; gray) and titanium aluminum oxide coated Ni-rich cathode ($LiNi_{0.8}Co_{0.1}Mn_{0.1}O_2$; navy) full cells with graphite anode at 1 C (200 mA $g^{-1}$) between 2.5 and 4.4 V vs. $Li/Li^+$ (19A) at 10th cycle, (19B) at 1000th cycle, and (19C) after direct recycling.
Figure 19B:
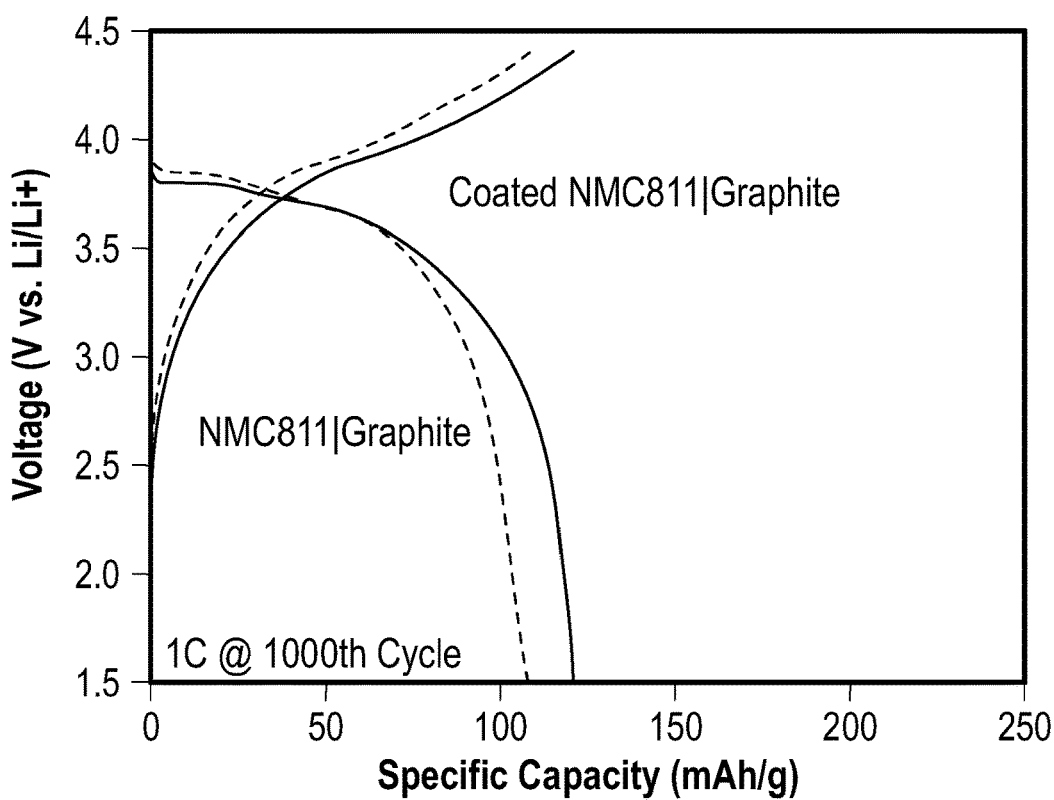
Figure 19C:
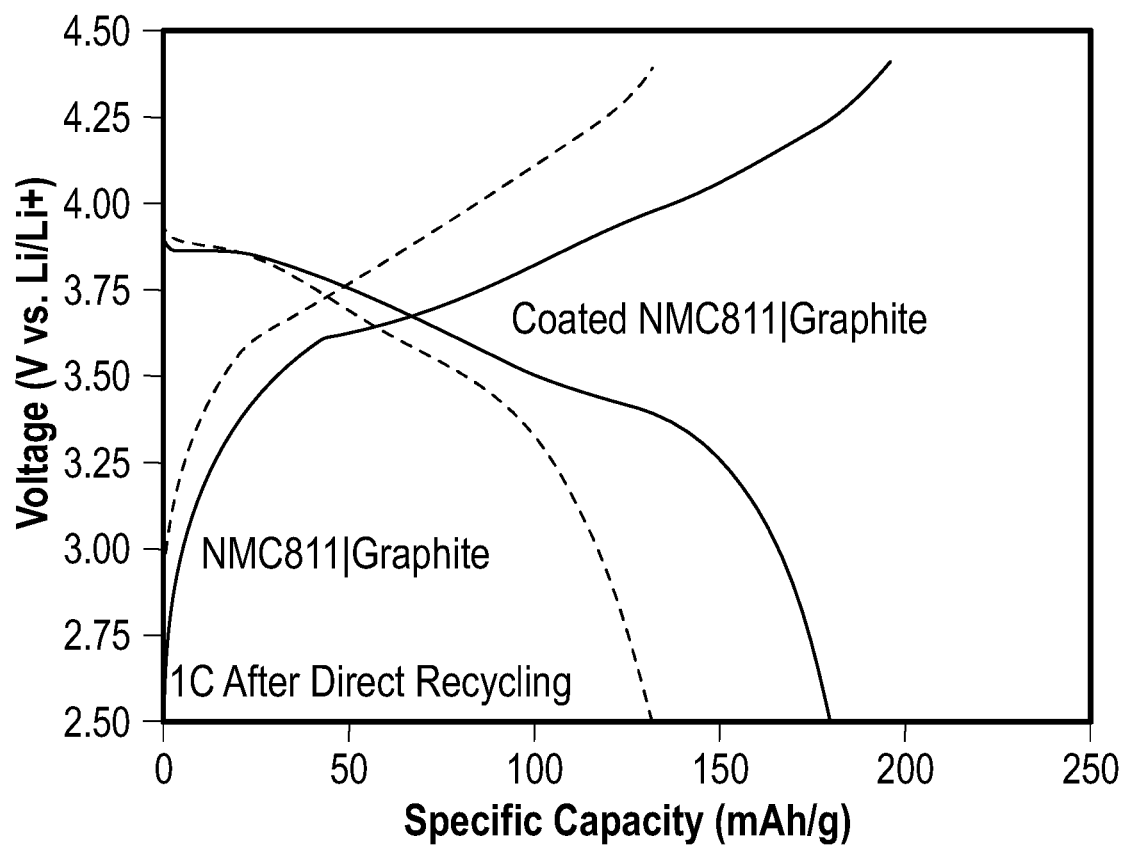

Evidence of improved direct recycling rate of conductive polymer/aluminum oxide coated Ni-rich cathode ($LiNi_{0.8}Co_{0.1}Mn_{0.1}O_2$) full cells with graphite anodes compared to uncoated Ni-rich cathode in FIG. 19. FIG. 19 shows Charge and discharge profiles of pristine (uncoated; gray) and titanium aluminum oxide coated Ni-rich cathode ($LiNi_{0.8}Co_{0.1}Mn_{0.1}O_2$; navy) full cells with graphite anode at 1 C (200 mA g$^{-1}$) between 2.5 and 4.4 V (a) at 10th cycle, (b) at 1000th cycle, and (c) after direct recycling. In this specific example, two cycles of titanium oxide and subsequent two cycles of aluminum oxide coating were conducted for titanium aluminum coated Ni-rich cathode by using atomic layer deposition assisted by rotary mechanism. Trimethylaluminum was used for aluminum precursor, tetrakis (dimethylamido)titanium for titanium precursor, and ozone was used for oxygen precursor. The coated Ni-rich cathode was mixed with carbon black and PVDF with the ratio of 90:5:5 to form a slurry to be casted onto an aluminum foil. The graphite anode was prepared by mixing with carbon black and PVDF with the ratio of 90:5:5 to form a slurry and casted onto a copper foil. The casted electrodes were dried and calendared to be prepared for a full cell assembly. The full cell was assembled in a coin cell geometry. The assembled full cell was cycled at 1 C (200 mA g$^{-1}$) between 2.5 and 4.4 V for 1000 cycles, and followed by the direct recycling scheme shown in FIG. 25. The wash process was performed by using N-methyl-2-pyrrolidinone, and the re-lithiation process was conducted by an electrochemical method with Li foil as a counter electrode. After the direct recycling, the coated sample showed more than 90% recovery rate while the uncoated sample showed around 68% recovery rate. The titanium aluminum oxide coating here contributed to the improved protection of the vulnerable cathode surface, resulting in the higher recovery rate after the direct recycling at 1000$^{th}$ cycle.

Figure 20A:
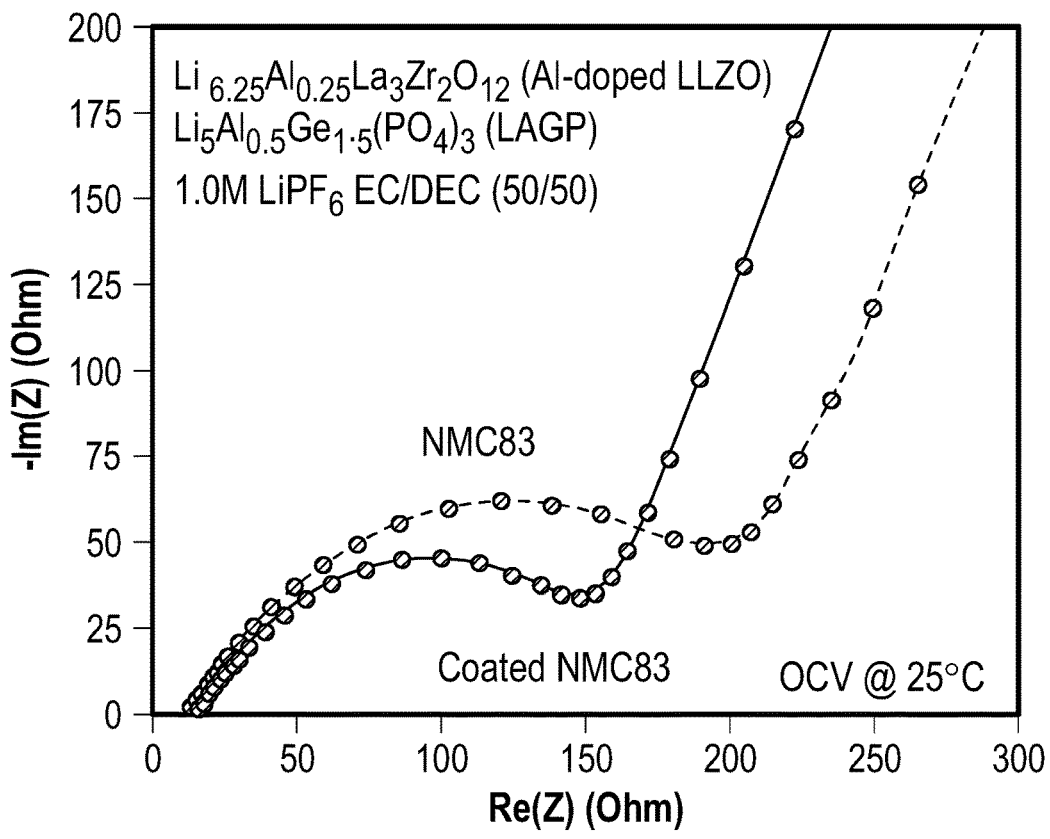
FIGS. 20A-20B are illustrations of (20A) electrochemical impedance spectra of uncoated (gray) and zirconium oxide coated (navy) Ni-rich cathode ($LiNi_{0.83}Co_{0.09}Mn_{0.08}O_2$), and (20B) cyclic voltammetry profiles of uncoated and titanium aluminum oxide coated Ni-rich cathode ($LiNi_{0.83}Co_{0.09}Mn_{0.08}O_2$) in semi solid state battery system consisting of $Li_{6.25}Al_{0.25}La_3Zr_2O_{12}$, $Li_5Al_{0.5}Ge_{1.5}(PO_4)_3$, and 1.0M $LiPF_6$ ethylene carbonate/diethyl carbonate (50/50).
Figure 20B:
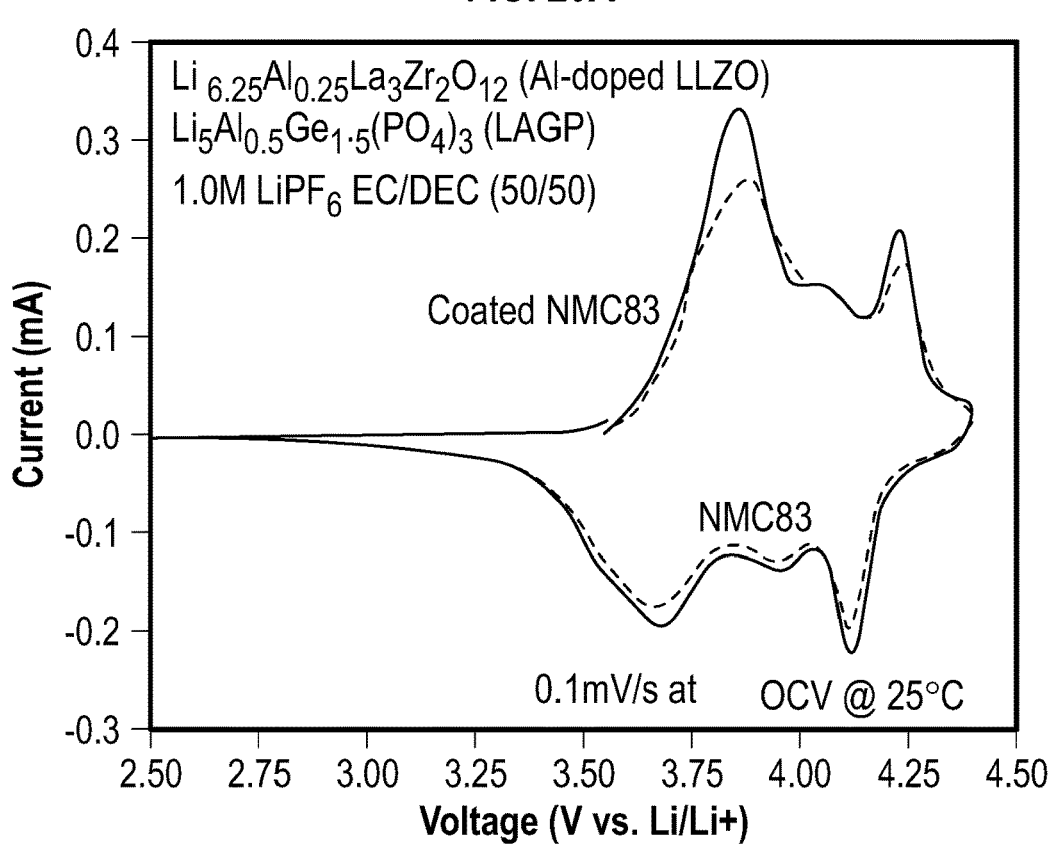

Evidence of reduced interfacial impedance of zirconium oxide coated Ni-rich cathode ($LiNi_{0.8}Co_{0.1}Mn_{0.1}O_2$) in semi solid state battery cell composed of $Li_{6.25}Al_{0.25}La_3Zr_2O_{12}$, $Li_5Al_{0.5}Ge_{1.5}(PO_4)_3$, and 1.0M $LiPF_6$ ethylene carbonate/diethyl carbonate (50/50) in FIG. 20. In this specific example, four cycles of zirconium oxide coating were performed by using atomic layer deposition assisted by ball-mill mechanism. Tetrakis(dimethylamido)zirconium was used for zirconium precursor and ozone was used for oxygen precursor. The coated Ni-rich cathode was mixed with $Li_{6.25}Al_{0.25}La_3Zr_2O_{12}$, carbon black and PVDF with the ratio of 75:15:5:5 to form a slurry to be casted onto an aluminum foil. The casted electrode was dried and calendared to be prepared for a half cell assembly. The half cell was assembled in a coin cell geometry with a Li foil as a counter electrode and pelletized $Li_5Al_{0.5}Ge_{1.5}(PO_4)_3$ as a solid electrolyte film with less than 2 μl of 1.0M $LiPF_6$ ethylene carbonate/diethyl carbonate (50/50). The electrochemical impedance spectra were measured from 1 MHz to 200 mHz at 10 mV amplitude. The cyclic voltammetry was measured at 0.1 mV/s from 2.5 V to 4.4 V vs. Li/Li+ at room temperature. The zirconium coated 83% Ni Ni-rich cathode showed lower impedance than that of uncoated 83% Ni Ni-rich cathode as shown in FIG. 20A, meaning that the coated cathode surface was modified to more conductive compared to the uncoated cathode. In the same context, the conductive interface between solid electrolyte and cathode attributes larger current during the voltage sweep as shown in FIG. 20B.

Figure 21:
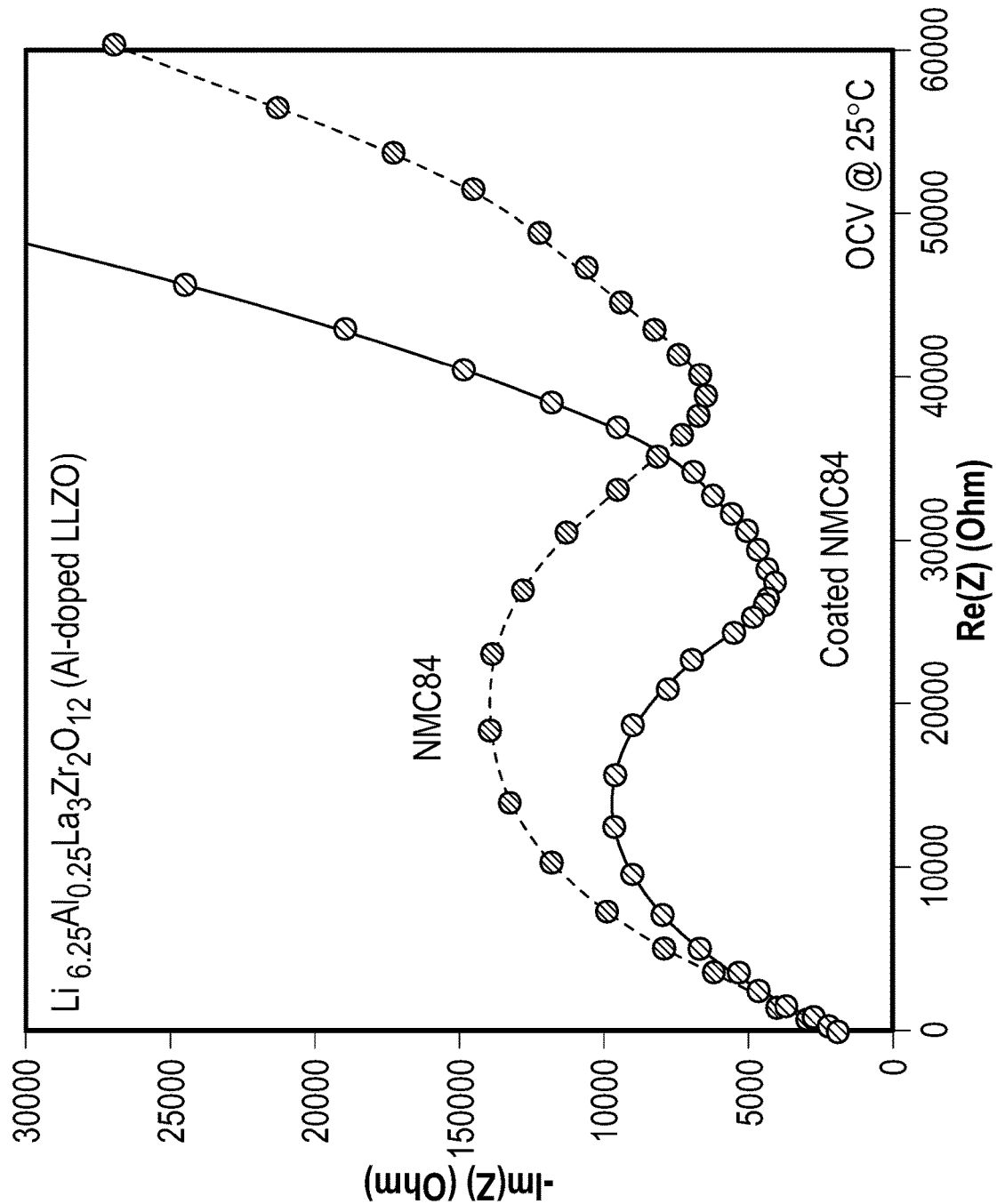
FIG. 21 is an illustration of Electrochemical impedance spectra of uncoated (gray) and zirconium oxide coated (navy) Ni-rich cathode ($LiNi_{0.84}Co_{0.08}Mn_{0.08}O_2$) in all solid state battery system consisting of $Li_{6.25}Al_{0.25}La_3Zr_2O_{12}$, as a solid electrolyte.

Evidence of reduced interfacial impedance of zirconium oxide coated Ni-rich cathode ($LiNi_{0.84}Co_{0.08}Mn_{0.08}O_2$) in all solid state battery system consisting of $Li_{6.25}Al_{0.25}La_3Zr_2O_{12}$ as a solid electrolyte layer in FIG. 21. In this specific example, four cycles of zirconium oxide coating were performed by using atomic layer deposition assisted by ball-mill mechanism. Tetrakis(dimethylamido)zirconium was used for zirconium precursor and ozone was used for oxygen precursor. The coated Ni-rich cathode was mixed with $Li_{6.25}Al_{0.25}La_3Zr_2O_{12}$, carbon black and PVDF with the ratio of 75:15:5:5 to form a slurry to be casted onto an aluminum foil. The casted electrode was dried and calendared to be prepared for a half cell assembly. The half cell was assembled in a coin cell geometry with a Li foil as a counter electrode and a $Li_{6.25}Al_{0.25}La_3Zr_2O_{12}$ film as a solid electrolyte layer. The electrochemical impedance spectra were measured from 1 MHz to 200 mHz at 10 mV amplitude. The zirconium coated 84% Ni Ni-rich cathode showed lower impedance than that of uncoated 84% Ni Ni-rich cathode as shown in FIG. 21, meaning that the coated cathode surface was modified to more conductive compared to the uncoated cathode.

Figure 22:
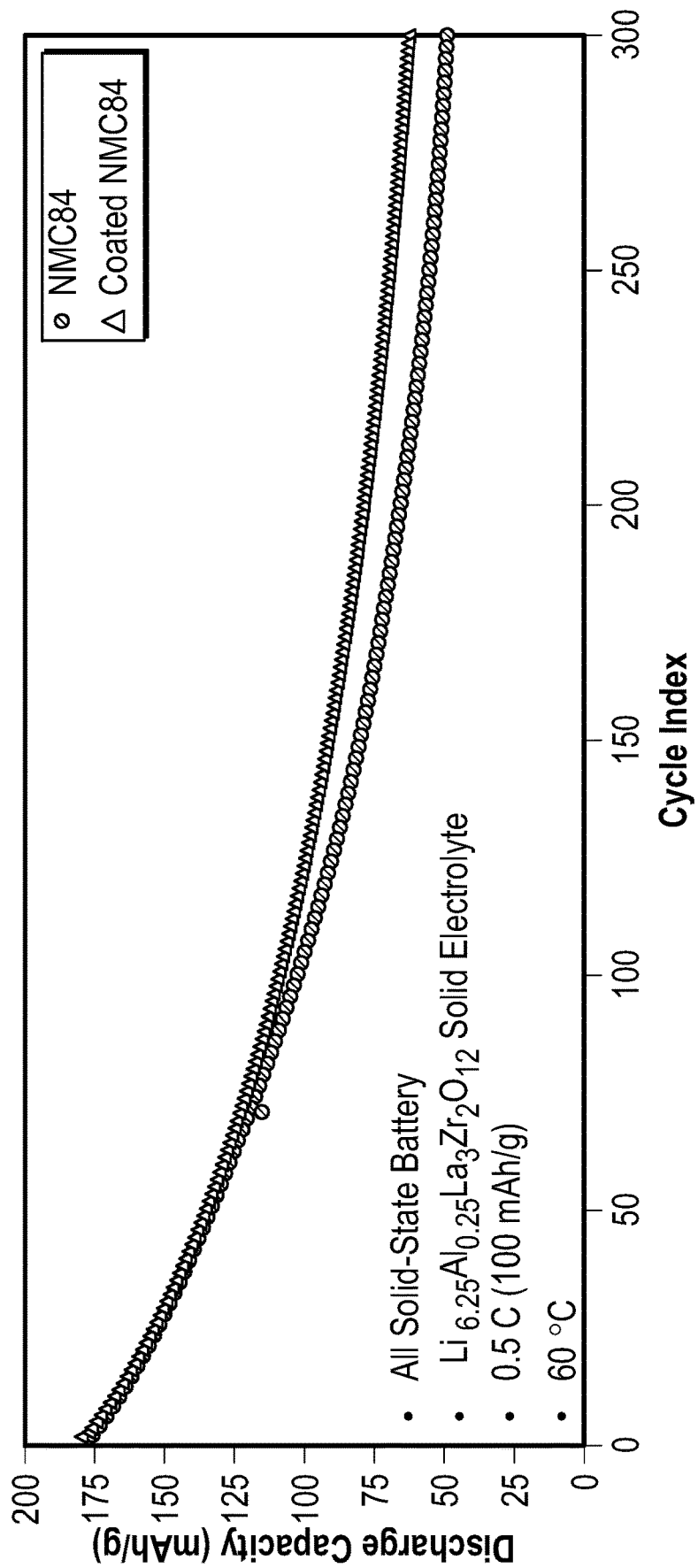
FIG. 22 is an illustration of cycle performance of pristine (uncoated), zirconium oxide coated Ni-rich cathode ($LiNi_{0.84}Co_{0.08}Mn_{0.08}O_2$) all solid-state battery cells with $Li_{6.25}Al_{0.25}La_3Zr_2O_{12}$ as a solid electrolyte and Li foil as a counter electrode at 1 C (200 mA $g^{-1}$) between 2.5 and 4.4 V at 60° C.

FIG. 22 illustrates cycle performance of pristine (uncoated), zirconium oxide coated Ni-rich cathode ($LiNi_{0.84}Co_{0.08}Mn_{0.08}O_2$) all solid-state battery cells with $Li_{6.25}Al_{0.25}La_3Zr_2O_{12}$ as a solid electrolyte and Li foil as a counter electrode at 1 C (200 mA $g^{-1}$) between 2.5 and 4.4 V at 60° C. In this specific example, four cycles of zirconium oxide coating were performed by using atomic layer deposition assisted by ball-mill mechanism. Tetrakis(dimethylamido)zirconium was used for zirconium precursor and ozone was used for oxygen precursor. The coated Ni-rich cathode was mixed with $Li_{6.25}Al_{0.25}La_3Zr_2O_{12}$, carbon black and PVDF with the ratio of 75:15:5:5 to form a slurry to be casted onto an aluminum foil. The casted electrode was dried and calendared to be prepared for a half cell assembly. The half cell was assembled in a coin cell geometry with a Li foil as a counter electrode and a $Li_{6.25}Al_{0.25}La_3Zr_2O_{12}$ film as a solid electrolyte layer. The zirconium coating not only improves the interfacial conductivity as shown in FIG. 21, but also protects the surface resulting that the coated 84% Ni Ni-rich cathode shows improved cycle performance.

Figure 23:
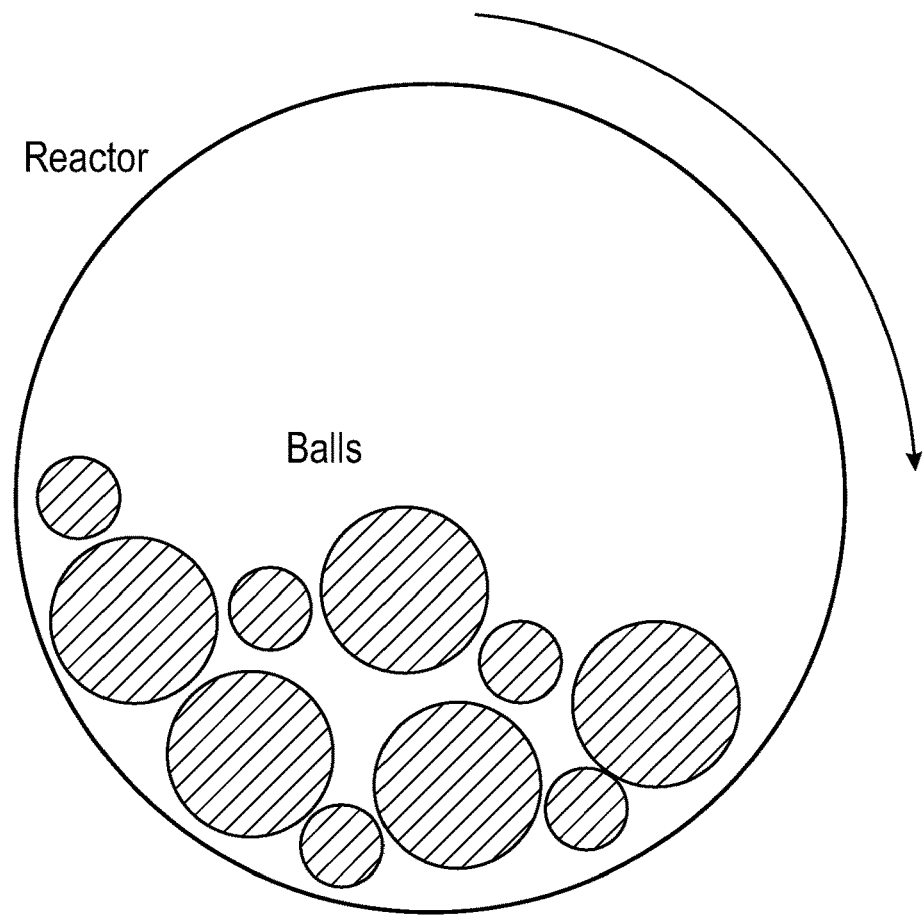
FIG. 23 is a diagram of an example ball milling mechanism for atomic layer deposition.

FIG. 23 illustrates an example ball milling mechanism for atomic layer deposition. The example ball milling mechanism rotating reactor with a plurality of balls. The plurality of balls comprises one or more of $ZrO_2$, $TiO_2$, stainless steel, and $Al_2O_3$. The electrode (for example, anode or cathode) be to sub-nanoscale coated is introduced into the reactor. Parameters of the ball milling process includes the amount of balls in the reactor, the amount of particle samples, the size of balls, the rotating speed of the reactor, the time of rotation, the shape of inner wall of the reactor, the direction of rotation, and the motion of rotation. The amount of balls ranges from 1% to 70% of the volume of the reactor. In certain example embodiments, the balls are 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 percent of the volume of the reactor. The amount of particle samples ranges from 20% to 100% of the volume of the balls. In certain example embodiments, the particle sample are 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 percent of the volume of the balls. The size of balls ranges from 1 um in diameter to the half of the reactor's diameter in diameter. The diameter of example reactors ranges from 2 cm to 20 m, and the height of example reactors ranges from 5 cm to 50 m. The rotating speed of the reactor ranges from 1 rpm to 6000 rpm. In certain example embodiments, the rotating speed of the reactor is 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, 100, 101, 102, 103, 104, 105, 106, 107, 108, 109, 110, 111, 112, 113, 114, 115, 116, 117, 118, 119, 120, 121, 122, 123, 124, 125, 126, 127, 128, 129, 130, 131, 132, 133, 134, 135, 136, 137, 138, 139, 140, 141, 142, 143, 144, 145, 146, 147, 148, 149, 150, 151, 152, 153, 154, 155, 156, 157, 158, 159, 160, 161, 162, 163, 164, 165, 166, 167, 168, 169, 170, 171, 172, 173, 174, 175, 176, 177, 178, 179, 180, 181, 182, 183, 184, 185, 186, 187, 188, 189, 190, 191, 192, 193, 194, 195, 196, 197, 198, 199, 200, 201, 202, 203, 204, 205, 206, 207, 208, 209, 210, 211, 212, 213, 214, 215, 216, 217, 218, 219, 220, 221, 222, 223, 224, 225, 226, 227, 228, 229, 230, 231, 232, 233, 234, 235, 236, 237, 238, 239, 240, 241, 242, 243, 244, 245, 246, 247, 248, 249, 250, 251, 252, 253, 254, 255, 256, 257, 258, 259, 260, 261, 262, 263, 264, 265, 266, 267, 268, 269, 270, 271, 272, 273, 274, 275, 276, 277, 278, 279, 280, 281, 282, 283, 284, 285, 286, 287, 288, 289, 290, 291, 292, 293, 294, 295, 296, 297, 298, 299, 300, 301, 302, 303, 304, 305, 306, 307, 308, 309, 310, 311, 312, 313, 314, 315, 316, 317, 318, 319, 320, 321, 322, 323, 324, 325, 326, 327, 328, 329, 330, 331, 332, 333, 334, 335, 336, 337, 338, 339, 340, 341, 342, 343, 344, 345, 346, 347, 348, 349, 350, 351, 352, 353, 354, 355, 356, 357, 358, 359, 360, 361, 362, 363, 364, 365, 366, 367, 368, 369, 370, 371, 372, 373, 374, 375, 376, 377, 378, 379, 380, 381, 382, 383, 384, 385, 386, 387, 388, 389, 390, 391, 392, 393, 394, 395, 396, 397, 398, 399, 400, 401, 402, 403, 404, 405, 406, 407, 408, 409, 410, 411, 412, 413, 414, 415, 416, 417, 418, 419, 420, 421, 422, 423, 424, 425, 426, 427, 428, 429, 430, 431, 432, 433, 434, 435, 436, 437, 438, 439, 440, 441, 442, 443, 444, 445, 446, 447, 448, 449, 450, 451, 452, 453, 454, 455, 456, 457, 458, 459, 460, 461, 462, 463, 464, 465, 466, 467, 468, 469, 470, 471, 472, 473, 474, 475, 476, 477, 478, 479, 480, 481, 482, 483, 484, 485, 486, 487, 488, 489, 490, 491, 492, 493, 494, 495, 496, 497, 498, 499, 500, 501, 502, 503, 504, 505, 506, 507, 508, 509, 510, 511, 512, 513, 514, 515, 516, 517, 518, 519, 520, 521, 522, 523, 524, 525, 526, 527, 528, 529, 530, 531, 532, 533, 534, 535, 536, 537, 538, 539, 540, 541, 542, 543, 544, 545, 546, 547, 548, 549, 550, 551, 552, 553, 554, 555, 556, 557, 558, 559, 560, 561, 562, 563, 564, 565, 566, 567, 568, 569, 570, 571, 572, 573, 574, 575, 576, 577, 578, 579, 580, 581, 582, 583, 584, 585, 586, 587, 588, 589, 590, 591, 592, 593, 594, 595, 596, 597, 598, 599, 600, 601, 602, 603, 604, 605, 606, 607, 608, 609, 610, 611, 612, 613, 614, 615, 616, 617, 618, 619, 620, 621, 622, 623, 624, 625, 626, 627, 628, 629, 630, 631, 632, 633, 634, 635, 636, 637, 638, 639, 640, 641, 642, 643, 644, 645, 646, 647, 648, 649, 650, 651, 652, 653, 654, 655, 656, 657, 658, 659, 660, 661, 662, 663, 664, 665, 666, 667, 668, 669, 670, 671, 672, 673, 674, 675, 676, 677, 678, 679, 680, 681, 682, 683, 684, 685, 686, 687, 688, 689, 690, 691, 692, 693, 694, 695, 696, 697, 698, 699, 700, 701, 702, 703, 704, 705, 706, 707, 708, 709, 710, 711, 712, 713, 714, 715, 716, 717, 718, 719, 720, 721, 722, 723, 724, 725, 726, 727, 728, 729, 730, 731, 732, 733, 734, 735, 736, 737, 738, 739, 740, 741, 742, 743, 744, 745, 746, 747, 748, 749, 750, 751, 752, 753, 754, 755, 756, 757, 758, 759, 760, 761, 762, 763, 764, 765, 766, 767, 768, 769, 770, 771, 772, 773, 774, 775, 776, 777, 778, 779, 780, 781, 782, 783, 784, 785, 786, 787, 788, 789, 790, 791, 792, 793, 794, 795, 796, 797, 798, 799, 800, 801, 802, 803, 804, 805, 806, 807, 808, 809, 810, 811, 812, 813, 814, 815, 816, 817, 818, 819, 820, 821, 822, 823, 824, 825, 826, 827, 828, 829, 830, 831, 832, 833, 834, 835, 836, 837, 838, 839, 840, 841, 842, 843, 844, 845, 846, 847, 848, 849, 850, 851, 852, 853, 854, 855, 856, 857, 858, 859, 860, 861, 862, 863, 864, 865, 866, 867, 868, 869, 870, 871, 872, 873, 874, 875, 876, 877, 878, 879, 880, 881, 882, 883, 884, 885, 886, 887, 888, 889, 890, 891, 892, 893, 894, 895, 896, 897, 898, 899, 900, 901, 902, 903, 904, 905, 906, 907, 908, 909, 910, 911, 912, 913, 914, 915, 916, 917, 918, 919, 920, 921, 922, 923, 924, 925, 926, 927, 928, 929, 930, 931, 932, 933, 934, 935, 936, 937, 938, 939, 940, 941, 942, 943, 944, 945, 946, 947, 948, 949, 950, 951, 952, 953, 954, 955, 956, 957, 958, 959, 960, 961, 962, 963, 964, 965, 966, 967, 968, 969, 970, 971, 972, 973, 974, 975, 976, 977, 978, 979, 980, 981, 982, 983, 984, 985, 986, 987, 988, 989, 990, 991, 992, 993, 994, 995, 996, 997, 998, 999, 1000, 1001, 1002, 1003, 1004, 1005, 1006, 1007, 1008, 1009, 1010, 1011, 1012, 1013, 1014, 1015, 1016, 1017, 1018, 1019, 1020, 1021, 1022, 1023, 1024, 1025, 1026, 1027, 1028, 1029, 1030, 1031, 1032, 1033, 1034, 1035, 1036, 1037, 1038, 1039, 1040, 1041, 1042, 1043, 1044, 1045, 1046, 1047, 1048, 1049, 1050, 1051, 1052, 1053, 1054, 1055, 1056, 1057, 1058, 1059, 1060, 1061, 1062, 1063, 1064, 1065, 1066, 1067, 1068, 1069, 1070, 1071, 1072, 1073, 1074, 1075, 1076, 1077, 1078, 1079, 1080, 1081, 1082, 1083, 1084, 1085, 1086, 1087, 1088, 1089, 1090, 1091, 1092, 1093, 1094, 1095, 1096, 1097, 1098, 1099, 1100, 1101, 1102, 1103, 1104, 1105, 1106, 1107, 1108, 1109, 1110, 1111, 1112, 1113, 1114, 1115, 1116, 1117, 1118, 1119, 1120, 1121, 1122, 1123, 1124, 1125, 1126, 1127, 1128, 1129, 1130, 1131, 1132, 1133, 1134, 1135, 1136, 1137, 1138, 1139, 1140, 1141, 1142, 1143, 1144, 1145, 1146, 1147, 1148, 1149, 1150, 1151, 1152, 1153, 1154, 1155, 1156, 1157, 1158, 1159, 1160, 1161, 1162, 1163, 1164, 1165, 1166, 1167, 1168, 1169, 1170, 1171, 1172, 1173, 1174, 1175, 1176, 1177, 1178, 1179, 1180, 1181, 1182, 1183, 1184, 1185, 1186, 1187, 1188, 1189, 1190, 1191, 1192, 1193, 1194, 1195, 1196, 1197, 1198, 1199, 1200, 1201, 1202, 1203, 1204, 1205, 1206, 1207, 1208, 1209, 1210, 1211, 1212, 1213, 1214, 1215, 1216, 1217, 1218, 1219, 1220, 1221, 1222, 1223, 1224, 1225, 1226, 1227, 1228, 1229, 1230, 1231, 1232, 1233, 1234, 1235, 1236, 1237, 1238, 1239, 1240, 1241, 1242, 1243, 1244, 1245, 1246, 1247, 1248, 1249, 1250, 1251, 1252, 1253, 1254, 1255, 1256, 1257, 1258, 1259, 1260, 1261, 1262, 1263, 1264, 1265, 1266, 1267, 1268, 1269, 1270, 1271, 1272, 1273, 1274, 1275, 1276, 1277, 1278, 1279, 1280, 1281, 1282, 1283, 1284, 1285, 1286, 1287, 1288, 1289, 1290, 1291, 1292, 1293, 1294, 1295, 1296, 1297, 1298, 1299, 1300, 1301, 1302, 1303, 1304, 1305, 1306, 1307, 1308, 1309, 1310, 1311, 1312, 1313, 1314, 1315, 1316, 1317, 1318, 1319, 1320, 1321, 1322, 1323, 1324, 1325, 1326, 1327, 1328, 1329, 1330, 1331, 1332, 1333, 1334, 1335, 1336, 1337, 1338, 1339, 1340, 1341, 1342, 1343, 1344, 1345, 1346, 1347, 1348, 1349, 1350, 1351, 1352, 1353, 1354, 1355, 1356, 1357, 1358, 1359, 1360, 1361, 1362, 1363, 1364, 1365, 1366, 1367, 1368, 1369, 1370, 1371, 1372, 1373, 1374, 1375, 1376, 1377, 1378, 1379, 1380, 1381, 1382, 1383, 1384, 1385, 1386, 1387, 1388, 1389, 1390, 1391, 1392, 1393, 1394, 1395, 1396, 1397, 1398, 1399, 1400, 1401, 1402, 1403, 1404, 1405, 1406, 1407, 1408, 1409, 1410, 1411, 1412, 1413, 1414, 1415, 1416, 1417, 1418, 1419, 1420, 1421, 1422, 1423, 1424, 1425, 1426, 1427, 1428, 1429, 1430, 1431, 1432, 1433, 1434, 1435, 1436, 1437, 1438, 1439, 1440, 1441, 1442, 1443, 1444, 1445, 1446, 1447, 1448, 1449, 1450, 1451, 1452, 1453, 1454, 1455, 1456, 1457, 1458, 1459, 1460, 1461, 1462, 1463, 1464, 1465, 1466, 1467, 1468, 1469, 1470, 1471, 1472, 1473, 1474, 1475, 1476, 1477, 1478, 1479, 1480, 1481, 1482, 1483, 1484, 1485, 1486, 1487, 1488, 1489, 1490, 1491, 1492, 1493, 1494, 1495, 1496, 1497, 1498, 1499, 1500, 1501, 1502, 1503, 1504, 1505, 1506, 1507, 1508, 1509, 1510, 1511, 1512, 1513, 1514, 1515, 1516, 1517, 1518, 1519, 1520, 1521, 1522, 1523, 1524, 1525, 1526, 1527, 1528, 1529, 1530, 1531, 1532, 1533, 1534, 1535, 1536, 1537, 1538, 1539, 1540, 1541, 1542, 1543, 1544, 1545, 1546, 1547, 1548, 1549, 1550, 1551, 1552, 1553, 1554, 1555, 1556, 1557, 1558, 1559, 1560, 1561, 1562, 1563, 1564, 1565, 1566, 1567, 1568, 1569, 1570, 1571, 1572, 1573, 1574, 1575, 1576, 1577, 1578, 1579, 1580, 1581, 1582, 1583, 1584, 1585, 1586, 1587, 1588, 1589, 1590, 1591, 1592, 1593, 1594, 1595, 1596, 1597, 1598, 1599, 1600, 1601, 1602, 1603, 1604, 1605, 1606, 1607, 1608, 1609, 1610, 1611, 1612, 1613, 1614, 1615, 1616, 1617, 1618, 1619, 1620, 1621, 1622, 1623, 1624, 1625, 1626, 1627, 1628, 1629, 1630, 1631, 1632, 1633, 1634, 1635, 1636, 1637, 1638, 1639, 1640, 1641, 1642, 1643, 1644, 1645, 1646, 1647, 1648, 1649, 1650, 1651, 1652, 1653, 1654, 1655, 1656, 1657, 1658, 1659, 1660, 1661, 1662, 1663, 1664, 1665, 1666, 1667, 1668, 1669, 1670, 1671, 1672, 1673, 1674, 1675, 1676, 1677, 1678, 1679, 1680, 1681, 1682, 1683, 1684, 1685, 1686, 1687, 1688, 1689, 1690, 1691, 1692, 1693, 1694, 1695, 1696, 1697, 1698, 1699, 1700, 1701, 1702, 1703, 1704, 1705, 1706, 1707, 1708, 1709, 1710, 1711, 1712, 1713, 1714, 1715, 1716, 1717, 1718, 1719, 1720, 1721, 1722, 1723, 1724, 1725, 1726, 1727, 1728, 1729, 1730, 1731, 1732, 1733, 1734, 1735, 1736, 1737, 1738, 1739, 1740, 1741, 1742, 1743, 1744, 1745, 1746, 1747, 1748, 1749, 1750, 1751, 1752, 1753, 1754, 1755, 1756, 1757, 1758, 1759, 1760, 1761, 1762, 1763, 1764, 1765, 1766, 1767, 1768, 1769, 1770, 1771, 1772, 1773, 1774, 1775, 1776, 1777, 1778, 1779, 1780, 1781, 1782, 1783, 1784, 1785, 1786, 1787, 1788, 1789, 1790, 1791, 1792, 1793, 1794, 1795, 1796, 1797, 1798, 1799, 1800, 1801, 1802, 1803, 1804, 1805, 1806, 1807, 1808, 1809, 1810, 1811, 1812, 1813, 1814, 1815, 1816, 1817, 1818, 1819, 1820, 1821, 1822, 1823, 1824, 1825, 1826, 1827, 1828, 1829, 1830, 1831, 1832, 1833, 1834, 1835, 1836, 1837, 1838, 1839, 1840, 1841, 1842, 1843, 1844, 1845, 1846, 1847, 1848, 1849, 1850, 1851, 1852, 1853, 1854, 1855, 1856, 1857, 1858, 1859, 1860, 1861, 1862, 1863, 1864, 1865, 1866, 1867, 1868, 1869, 1870, 1871, 1872, 1873, 1874, 1875, 1876, 1877, 1878, 1879, 1880, 1881, 1882, 1883, 1884, 1885, 1886, 1887, 1888, 1889, 1890, 1891, 1892, 1893, 1894, 1895, 1896, 1897, 1898, 1899, 1900, 1901, 1902, 1903, 1904, 1905, 1906, 1907, 1908, 1909, 1910, 1911, 1912, 1913, 1914, 1915, 1916, 1917, 1918, 1919, 1920, 1921, 1922, 1923, 1924, 1925, 1926, 1927, 1928, 1929, 1930, 1931, 1932, 1933, 1934, 1935, 1936, 1937, 1938, 1939, 1940, 1941, 1942, 1943, 1944, 1945, 1946, 1947, 1948, 1949, 1950, 1951, 1952, 1953, 1954, 1955, 1956, 1957, 1958, 1959, 1960, 1961, 1962, 1963, 1964, 1965, 1966, 1967, 1968, 1969, 1970, 1971, 1972, 1973, 1974, 1975, 1976, 1977, 1978, 1979, 1980, 1981, 1982, 1983, 1984, 1985, 1986, 1987, 1988, 1989, 1990, 1991, 1992, 1993, 1994, 1995, 1996, 1997, 1998, 1999, 2000, 2001, 2002, 2003, 2004, 2005, 2006, 2007, 2008, 2009, 2010, 2011, 2012, 2013, 2014, 2015, 2016, 2017, 2018, 2019, 2020, 2021, 2022, 2023, 2024, 2025, 2026, 2027, 2028, 2029, 2030, 2031, 2032, 2033, 2034, 2035, 2036, 2037, 2038, 2039, 2040, 2041, 2042, 2043, 2044, 2045, 2046, 2047, 2048, 2049, 2050, 2051, 2052, 2053, 2054, 2055, 2056, 2057, 2058, 2059, 2060, 2061, 2062, 2063, 2064, 2065, 2066, 2067, 2068, 2069, 2070, 2071, 2072, 2073, 2074, 2075, 2076, 2077, 2078, 2079, 2080, 2081, 2082, 2083, 2084, 2085, 2086, 2087, 2088, 2089, 2090, 2091, 2092, 2093, 2094, 2095, 2096, 2097, 2098, 2099, 2100, 2101, 2102, 2103, 2104, 2105, 2106, 2107, 2108, 2109, 2110, 2111, 2112, 2113, 2114, 2115, 2116, 2117, 2118, 2119, 2120, 2121, 2122, 2123, 2124, 2125, 2126, 2127, 2128, 2129, 2130, 2131, 2132, 2133, 2134, 2135, 2136, 2137, 2138, 2139, 2140, 2141, 2142, 2143, 2144, 2145, 2146, 2147, 2148, 2149, 2150, 2151, 2152, 2153, 2154, 2155, 2156, 2157, 2158, 2159, 2160, 2161, 2162, 2163, 2164, 2165, 2166, 2167, 2168, 2169, 2170, 2171, 2172, 2173, 2174, 2175, 2176, 2177, 2178, 2179, 2180, 2181, 2182, 2183, 2184, 2185, 2186, 2187, 2188, 2189, 2190, 2191, 2192, 2193, 2194, 2195, 2196, 2197, 2198, 2199, 2200, 2201, 2202, 2203, 2204, 2205, 2206, 2207, 2208, 2209, 2210, 2211, 2212, 2213, 2214, 2215, 2216, 2217, 2218, 2219, 2220, 2221, 2222, 2223, 2224, 2225, 2226, 2227, 2228, 2229, 2230, 2231, 2232, 2233, 2234, 2235, 2236, 2237, 2238, 2239, 2240, 2241, 2242, 2243, 2244, 2245, 2246, 2247, 2248, 2249, 2250, 2251, 2252, 2253, 2254, 2255, 2256, 2257, 2258, 2259, 2260, 2261, 2262, 2263, 2264, 2265, 2266, 2267, 2268, 2269, 2270, 2271, 2272, 2273, 2274, 2275, 2276, 2277, 2278, 2279, 2280, 2281, 2282, 2283, 2284, 2285, 2286, 2287, 2288, 2289, 2290, 2291, 2292, 2293, 2294, 2295, 2296, 2297, 2298, 2299, 2300, 2301, 2302, 2303, 2304, 2305, 2306, 2307, 2308, 2309, 2310, 2311, 2312, 2313, 2314, 2315, 2316, 2317, 2318, 2319, 2320, 2321, 2322, 2323, 2324, 2325, 2326, 2327, 2328, 2329, 2330, 2331, 2332, 2333, 2334, 2335, 2336, 2337, 2338, 2339, 2340, 2341, 2342, 2343, 2344, 2345, 2346, 2347, 2348, 2349, 2350, 2351, 2352, 2353, 2354, 2355, 2356, 2357, 2358, 2359, 2360, 2361, 2362, 2363, 2364, 2365, 2366, 2367, 2368, 2369, 2370, 2371, 2372, 2373, 2374, 2375, 2376, 2377, 2378, 2379, 2380, 2381, 2382, 2383, 2384, 2385, 2386, 2387, 2388, 2389, 2390, 2391, 2392, 2393, 2394, 2395, 2396, 2397, 2398, 2399, 2400, 2401, 2402, 2403, 2404, 2405, 2406, 2407, 2408, 2409, 2410, 2411, 2412, 2413, 2414, 2415, 2416, 2417, 2418, 2419, 2420, 2421, 2422, 2423, 2424, 2425, 2426, 2427, 2428, 2429, 2430, 2431, 2432, 2433, 2434, 2435, 2436, 2437, 2438, 2439, 2440, 2441, 2442, 2443, 2444, 2445, 2446, 2447, 2448, 2449, 2450, 2451, 2452, 2453, 2454, 2455, 2456, 2457, 2458, 2459, 2460, 2461, 2462, 2463, 2464, 2465, 2466, 2467, 2468, 2469, 2470, 2471, 2472, 2473, 2474, 2475, 2476, 2477, 2478, 2479, 2480, 2481, 2482, 2483, 2484, 2485, 2486, 2487, 2488, 2489, 2490, 2491, 2492, 2493, 2494, 2495, 2496, 2497, 2498, 2499, 2500, 2501, 2502, 2503, 2504, 2505, 2506, 2507, 2508, 2509, 2510, 2511, 2512, 2513, 2514, 2515, 2516, 2517, 2518, 2519, 2520, 2521, 2522, 2523, 2524, 2525, 2526, 2527, 2528, 2529, 2530, 2531, 2532, 2533, 2534, 2535, 2536, 2537, 2538, 2539, 2540, 2541, 2542, 2543, 2544, 2545, 2546, 2547, 2548, 2549, 2550, 2551, 2552, 2553, 2554, 2555, 2556, 2557, 2558, 2559, 2560, 2561, 2562, 2563, 2564, 2565, 2566, 2567, 2568, 2569, 2570, 2571, 2572, 2573, 2574, 2575, 2576, 2577, 2578, 2579, 2580, 2581, 2582, 2583, 2584, 2585, 2586, 2587, 2588, 2589, 2590, 2591, 2592, 2593, 2594, 2595, 2596, 2597, 2598, 2599, 2600, 2601, 2602, 2603, 2604, 2605, 2606, 2607, 2608, 2609, 2610, 2611, 2612, 2613, 2614, 2615, 2616, 2617, 2618, 2619, 2620, 2621, 2622, 2623, 2624, 2625, 2626, 2627, 2628, 2629, 2630, 2631, 2632, 2633, 2634, 2635, 2636, 2637, 2638, 2639, 2640, 2641, 2642, 2643, 2644, 2645, 2646, 2647, 2648, 2649, 2650, 2651, 2652, 2653, 2654, 2655, 2656, 2657, 2658, 2659, 2660, 2661, 2662, 2663, 2664, 2665, 2666, 2667, 2668, 2669, 2670, 2671, 2672, 2673, 2674, 2675, 2676, 2677, 2678, 2679, 2680, 2681, 2682, 2683, 2684, 2685, 2686, 2687, 2688, 2689, 2690, 2691, 2692, 2693, 2694, 2695, 2696, 2697, 2698, 2699, 2700, 2701, 2702, 2703, 2704, 2705, 2706, 2707, 2708, 2709, 2710, 2711, 2712, 2713, 2714, 2715, 2716, 2717, 2718, 2719, 2720, 2721, 2722, 2723, 2724, 2725, 2726, 2727, 2728, 2729, 2730, 2731, 2732, 2733, 2734, 2735, 2736, 2737, 2738, 2739, 2740, 2741, 2742, 2743, 2744, 2745, 2746, 2747, 2748, 2749, 2750, 2751, 2752, 2753, 2754, 2755, 2756, 2757, 2758, 2759, 2760, 2761, 2762, 2763, 2764, 2765, 2766, 2767, 2768, 2769, 2770, 2771, 2772, 2773, 2774, 2775, 2776, 2777, 2778, 2779, 2780, 2781, 2782, 2783, 2784, 2785, 2786, 2787, 2788, 2789, 2790, 2791, 2792, 2793, 2794, 2795, 2796, 2797, 2798, 2799, 2800, 2801, 2802, 2803, 2804, 2805, 2806, 2807, 2808, 2809, 2810, 2811, 2812, 2813, 2814, 2815, 2816, 2817, 2818, 2819, 2820, 2821, 2822, 2823, 2824, 2825, 2826, 2827, 2828, 2829, 2830, 2831, 2832, 2833, 2834, 2835, 2836, 2837, 2838, 2839, 2840, 2841, 2842, 2843, 2844, 2845, 2846, 2847, 2848, 2849, 2850, 2851, 2852, 2853, 2854, 2855, 2856, 2857, 2858, 2859, 2860, 2861, 2862, 2863, 2864, 2865, 2866, 2867, 2868, 2869, 2870, 2871, 2872, 2873, 2874, 2875, 2876, 2877, 2878, 2879, 2880, 2881, 2882, 2883, 2884, 2885, 2886, 2887, 2888, 2889, 2890, 2891, 2892, 2893, 2894, 2895, 2896, 2897, 2898, 2899, 2900, 2901, 2902, 2903, 2904, 2905, 2906, 2907, 2908, 2909, 2910, 2911, 2912, 2913, 2914, 2915, 2916, 2917, 2918, 2919, 2920, 2921, 2922, 2923, 2924, 2925, 2926, 2927, 2928, 2929, 2930, 2931, 2932, 2933, 2934, 2935, 2936, 2937, 2938, 2939, 2940, 2941, 2942, 2943, 2944, 2945, 2946, 2947, 2948, 2949, 2950, 2951, 2952, 2953, 2954, 2955, 2956, 2957, 2958, 2959, 2960, 2961, 2962, 2963, 2964, 2965, 2966, 2967, 2968, 2969, 2970, 2971, 2972, 2973, 2974, 2975, 2976, 2977, 2978, 2979, 2980, 2981, 2982, 2983, 2984, 2985, 2986, 2987, 2988, 2989, 2990, 2991, 2992, 2993, 2994, 2995, 2996, 2997, 2998, 2999, 3000, 3001, 3002, 3003, 3004, 3005, 3006, 3007, 3008, 3009, 3010, 3011, 3012, 3013, 3014, 3015, 3016, 3017, 3018, 3019, 3020, 3021, 3022, 3023, 3024, 3025, 3026, 3027, 3028, 3029, 3030, 3031, 3032, 3033, 3034, 3035, 3036, 3037, 3038, 3039, 3040, 3041, 3042, 3043, 3044, 3045, 3046, 3047, 3048, 3049, 3050, 3051, 3052, 3053, 3054, 3055, 3056, 3057, 3058, 3059, 3060, 3061, 3062, 3063, 3064, 3065, 3066, 3067, 3068, 3069, 3070, 3071, 3072, 3073, 3074, 3075, 3076, 3077, 3078, 3079, 3080, 3081, 3082, 3083, 3084, 3085, 3086, 3087, 3088, 3089, 3090, 3091, 3092, 3093, 3094, 3095, 3096, 3097, 3098, 3099, 3100, 3101, 3102, 3103, 3104, 3105, 3106, 3107, 3108, 3109, 3110, 3111, 3112, 3113, 3114, 3115, 3116, 3117, 3118, 3119, 3120, 3121, 3122, 3123, 3124, 3125, 3126, 3127, 3128, 3129, 3130, 3131, 3132, 3133, 3134, 3135, 3136, 3137, 3138, 3139, 3140, 3141, 3142, 3143, 3144, 3145, 3146, 3147, 3148, 3149, 3150, 3151, 3152, 3153, 3154, 3155, 3156, 3157, 3158, 3159, 3160, 3161, 3162, 3163, 3164, 3165, 3166, 3167, 3168, 3169, 3170, 3171, 3172, 3173, 3174, 3175, 3176, 3177, 3178, 3179, 3180, 3181, 3182, 3183, 3184, 3185, 3186, 3187, 3188, 3189, 3190, 3191, 3192, 3193, 3194, 3195, 3196, 3197, 3198, 3199, 3200, 3201, 3202, 3203, 3204, 3205, 3206, 3207, 3208, 3209, 3210, 3211, 3212, 3213, 3214, 3215, 3216, 3217, 3218, 3219, 3220, 3221, 3222, 3223, 3224, 3225, 3226, 3227, 3228, 3229, 3230, 3231, 3232, 3233, 3234, 3235, 3236, 3237, 3238, 3239, 3240, 3241, 3242, 3243, 3244, 3245, 3246, 3247, 3248, 3249, 3250, 3251, 3252, 3253, 3254, 3255, 3256, 3257, 3258, 3259, 3260, 3261, 3262, 3263, 3264, 3265, 3266, 3267, 3268, 3269, 3270, 3271, 3272, 3273, 3274, 3275, 3276, 3277, 3278, 3279, 3280, 3281, 3282, 3283, 3284, 3285, 3286, 3287, 3288, 3289, 3290, 3291, 3292, 3293, 3294, 3295, 3296, 3297, 3298, 3299, 3300, 3301, 3302, 3303, 3304, 3305, 3306, 3307, 3308, 3309, 3310, 3311, 3312, 3313, 3314, 3315, 3316, 3317, 3318, 3319, 3320, 3321, 3322, 3323, 3324, 3325, 3326, 3327, 3328, 3329, 3330, 3331, 3332, 3333, 3334, 3335, 3336, 3337, 3338, 3339, 3340, 3341, 3342, 3343, 3344, 3345, 3346, 3347, 3348, 3349, 3350, 3351, 3352, 3353, 3354, 3355, 3356, 3357, 3358, 3359, 3360, 3361, 3362, 3363, 3364, 3365, 3366, 3367, 3368, 3369, 3370, 3371, 3372, 3373, 3374, 3375, 3376, 3377, 3378, 3379, 3380, 3381, 3382, 3383, 3384, 3385, 3386, 3387, 3388, 3389, 3390, 3391, 3392, 3393, 3394, 3395, 3396, 3397, 3398, 3399, 3400, 3401, 3402, 3403, 3404, 3405, 3406, 3407, 3408, 3409, 3410, 3411, 3412, 3413, 3414, 3415, 3416, 3417, 3418, 3419, 3420, 3421, 3422, 3423, 3424, 3425, 3426, 3427, 3428, 3429, 3430, 3431, 3432, 3433, 3434, 3435, 3436, 3437, 3438, 3439, 3440, 3441, 3442, 3443, 3444, 3445, 3446, 3447, 3448, 3449, 3450, 3451, 3452, 3453, 3454, 3455, 3456, 3457, 3458, 3459, 3460, 3461, 3462, 3463, 3464, 3465, 3466, 3467, 3468, 3469, 3470, 3471, 3472, 3473, 3474, 3475, 3476, 3477, 3478, 3479, 3480, 3481, 3482, 3483, 3484, 3485, 3486, 3487, 3488, 3489, 3490, 3491, 3492, 3493, 3494, 3495, 3496, 3497, 3498, 3499, 3500, 3501, 3502, 3503, 3504, 3505, 3506, 3507, 3508, 3509, 3510, 3511, 3512, 3513, 3514, 3515, 3516, 3517, 3518, 3519, 3520, 3521, 3522, 3523, 3524, 3525, 3526, 3527, 3528, 3529, 3530, 3531, 3532, 3533, 3534, 3535, 3536, 3537, 3538, 3539, 3540, 3541, 3542, 3543, 3544, 3545, 3546, 3547, 3548, 3549, 3550, 3551, 3552, 3553, 3554, 3555, 3556, 3557, 3558, 3559, 3560, 3561, 3562, 3563, 3564, 3565, 3566, 3567, 3568, 3569, 3570, 3571, 3572, 3573, 3574, 3575, 3576, 3577, 3578, 3579, 3580, 3581, 3582, 3583, 3584, 3585, 3586, 3587, 3588, 3589, 3590, 3591, 3592, 3593, 3594, 3595, 3596, 3597, 3598, 3599, 3600, 3601, 3602, 3603, 3604, 3605, 3606, 3607, 3608, 3609, 3610, 3611, 3612, 3613, 3614, 3615, 3616, 3617, 3618, 3619, 3620, 3621, 3622, 3623, 3624, 3625, 3626, 3627, 3628, 3629, 3630, 3631, 3632, 3633, 3634, 3635, 3636, 3637, 3638, 3639, 3640, 3641, 3642, 3643, 3644, 3645, 3646, 3647, 3648, 3649, 3650, 3651, 3652, 3653, 3654, 3655, 3656, 3657, 3658, 3659, 3660, 3661, 3662, 3663, 3664, 3665, 3666, 3667, 3668, 3669, 3670, 3671, 3672, 3673, 3674, 3675, 3676, 3677, 3678, 3679, 3680, 3681, 3682, 3683, 3684, 3685, 3686, 3687, 3688, 3689, 3690, 3691, 3692, 3693, 3694, 3695, 3696, 3697, 3698, 3699, 3700, 3701, 3702, 3703, 3704, 3705, 3706, 3707, 3708, 3709, 3710, 3711, 3712, 3713, 3714, 3715, 3716, 3717, 3718, 3719, 3720, 3721, 3722, 3723, 3724, 3725, 3726, 3727, 3728, 3729, 3730, 3731, 3732, 3733, 3734, 3735, 3736, 3737, 3738, 3739, 3740, 3741, 3742, 3743, 3744, 3745, 3746, 3747, 3748, 3749, 3750, 3751, 3752, 3753, 3754, 3755, 3756, 3757, 3758, 3759, 3760, 3761, 3762, 3763, 3764, 3765, 3766, 3767, 3768, 3769, 3770, 3771, 3772, 3773, 3774, 3775, 3776, 3777, 3778, 3779, 3780, 3781, 3782, 3783, 3784, 3785, 3786, 3787, 3788, 3789, 3790, 3791, 3792, 3793, 3794, 3795, 3796, 3797, 3798, 3799, 3800, 3801, 3802, 3803, 3804, 3805, 3806, 3807, 3808, 3809, 3810, 3811, 3812, 3813, 3814, 3815, 3816, 3817, 3818, 3819, 3820, 3821, 3822, 3823, 3824, 3825, 3826, 3827, 3828, 3829, 3830, 3831, 3832, 3833, 3834, 3835, 3836, 3837, 3838, 3839, 3840, 3841, 3842, 3843, 3844, 3845, 3846, 3847, 3848, 3849, 3850, 3851, 3852, 3853, 3854, 3855, 3856, 3857, 3858, 3859, 3860, 3861, 3862, 3863, 3864, 3865, 3866, 3867, 3868, 3869, 3870, 3871, 3872, 3873, 3874, 3875, 3876, 3877, 3878, 3879, 3880, 3881, 3882, 3883, 3884, 3885, 3886, 3887, 3888, 3889, 3890, 3891, 3892, 3893, 3894, 3895, 3896, 3897, 3898, 3899, 3900, 3901, 3902, 3903, 3904, 3905, 3906, 3907, 3908, 3909, 3910, 3911, 3912, 3913, 3914, 3915, 3916, 3917, 3918, 3919, 3920, 3921, 3922, 3923, 3924, 3925, 3926, 3927, 3928, 3929, 3930, 3931, 3932, 3933, 3934, 3935, 3936, 3937, 3938, 3939, 3940, 3941, 3942, 3943, 3944, 3945, 3946, 3947, 3948, 3949, 3950, 3951, 3952, 3953, 3954, 3955, 3956, 3957, 3958, 3959, 3960, 3961, 3962, 3963, 3964, 3965, 3966, 3967, 3968, 3969, 3970, 3971, 3972, 3973, 3974, 3975, 3976, 3977, 3978, 3979, 3980, 3981, 3982, 3983, 3984, 3985, 3986, 3987, 3988, 3989, 3990, 3991, 3992, 3993, 3994, 3995, 3996, 3997, 3998, 3999, 4000, 4001, 4002, 4003, 4004, 4005, 4006, 4007, 4008, 4009, 4010, 4011, 4012, 4013, 4014, 4015, 4016, 4017, 4018, 4019, 4020, 4021, 4022, 4023, 4024, 4025, 4026, 4027, 4028, 4029, 4030, 4031, 4032, 4033, 4034, 4035, 4036, 4037, 4038, 4039, 4040, 4041, 4042, 4043, 4044, 4045, 4046, 4047, 4048, 4049, 4050, 4051, 4052, 4053, 4054, 4055, 4056, 4057, 4058, 4059, 4060, 4061, 4062, 4063, 4064, 4065, 4066, 4067, 4068, 4069, 4070, 4071, 4072, 4073, 4074, 4075, 4076, 4077, 4078, 4079, 4080, 4081, 4082, 4083, 4084, 4085, 4086, 4087, 4088, 4089, 4090, 4091, 4092, 4093, 4094, 4095, 4096, 4097, 4098, 4099, 4100, 4101, 4102, 4103, 4104, 4105, 4106, 4107, 4108, 4109, 4110, 4111, 4112, 4113, 4114, 4115, 4116, 4117, 4118, 4119, 4120, 4121, 4122, 4123, 4124, 4125, 4126, 4127, 4128, 4129, 4130, 4131, 4132, 4133, 4134, 4135, 4136, 4137, 4138, 4139, 4140, 4141, 4142, 4143, 4144, 4145, 4146, 4147, 4148, 4149, 4150, 4151, 4152, 4153, 4154, 4155, 4156, 4157, 4158, 4159, 4160, 4161, 4162, 4163, 4164, 4165, 4166, 4167, 4168, 4169, 4170, 4171, 4172, 4173, 4174, 4175, 4176, 4177, 4178, 4179, 4180, 4181, 4182, 4183, 4184, 4185, 4186, 4187, 4188, 4189, 4190, 4191, 4192, 4193, 4194, 4195, 4196, 4197, 4198, 4199, 4200, 4201, 4202, 4203, 4204, 4205, 4206, 4207, 4208, 4209, 4210, 4211, 4212, 4213, 4214, 4215, 4216, 4217, 4218, 4219, 4220, 4221, 4222, 4223, 4224, 4225, 4226, 4227, 4228, 4229, 4230, 4231, 4232, 4233, 4234, 4235, 4236, 4237, 4238, 4239, 4240, 4241, 4242, 4243, 4244, 4245, 4246, 4247, 4248, 4249, 4250, 4251, 4252, 4253, 4254, 4255, 4256, 4257, 4258, 4259, 4260, 4261, 4262, 4263, 4264, 4265, 4266, 4267, 4268, 4269, 4270, 4271, 4272, 4273, 4274, 4275, 4276, 4277, 4278, 4279, 4280, 4281, 4282, 4283, 4284, 4285, 4286, 4287, 4288, 4289, 4290, 4291, 4292, 4293, 4294, 4295, 4296, 4297, 4298, 4299, 4300, 4301, 4302, 4303, 4304, 4305, 4306, 4307, 4308, 4309, 4310, 4311, 4312, 4313, 4314, 4315, 4316, 4317, 4318, 4319, 4320, 4321, 4322, 4323, 4324, 4325, 4326, 4327, 4328, 4329, 4330, 4331, 4332, 4333, 4334, 4335, 4336, 4337, 4338, 4339, 4340, 4341, 4342, 4343, 4344, 4345, 4346, 4347, 4348, 4349, 4350, 4351, 4352, 4353, 4354, 4355, 4356, 4357, 4358, 4359, 4360, 4361, 4362, 4363, 4364, 4365, 4366, 4367, 4368, 4369, 4370, 4371, 4372, 4373, 4374, 4375, 4376, 4377, 4378, 4379, 4380, 4381, 4382, 4383, 4384, 4385, 4386, 4387, 4388, 4389, 4390, 4391, 4392, 4393, 4394, 4395, 4396, 4397, 4398, 4399, 4400, 4401, 4402, 4403, 4404, 4405, 4406, 4407, 4408, 4409, 4410, 4411, 4412, 4413, 4414, 4415, 4416, 4417, 4418, 4419, 4420, 4421, 4422, 4423, 4424, 4425, 4426, 4427, 4428, 4429, 4430, 4431, 4432, 4433, 4434, 4435, 4436, 4437, 4438, 4439, 4440, 4441, 4442, 4443, 4444, 4445, 4446, 4447, 4448, 4449, 4450, 4451, 4452, 4453, 4454, 4455, 4456, 4457, 4458, 4459, 4460, 4461, 4462, 4463, 4464, 4465, 4466, 4467, 4468, 4469, 4470, 4471, 4472, 4473, 4474, 4475, 4476, 4477, 4478, 4479, 4480, 4481, 4482, 4483, 4484, 4485, 4486, 4487, 4488, 4489, 4490, 4491, 4492, 4493, 4494, 4495, 4496, 4497, 4498, 4499, 4500, 4501, 4502, 4503, 4504, 4505, 4506, 4507, 4508, 4509, 4510, 4511, 4512, 4513, 4514, 4515, 4516, 4517, 4518, 4519, 4520, 4521, 4522, 4523, 4524, 4525, 4526, 4527, 4528, 4529, 4530, 4531, 4532, 4533, 4534, 4535, 4536, 4537, 4538, 4539, 4540, 4541, 4542, 4543, 4544, 4545, 4546, 4547, 4548, 4549, 4550, 4551, 4552, 4553, 4554, 4555, 4556, 4557, 4558, 4559, 4560, 4561, 4562, 4563, 4564, 4565, 4566, 4567, 4568, 4569, 4570, 4571, 4572, 4573, 4574, 4575, 4576, 4577, 4578, 4579, 4580, 4581, 4582, 4583, 4584, 4585, 4586, 4587, 4588, 4589, 4590, 4591, 4592, 4593, 4594, 4595, 4596, 4597, 4598, 4599, 4600, 4601, 4602, 4603, 4604, 4605, 4606, 4607, 4608, 4609, 4610, 4611, 4612, 4613, 4614, 4615, 4616, 4617, 4618, 4619, 4620, 4621, 4622, 4623, 4624, 4625, 4626, 4627, 4628, 4629, 4630, 4631, 4632, 4633, 4634, 4635, 4636, 4637, 4638, 4639, 4640, 4641, 4642, 4643, 4644, 4645, 4646, 4647, 4648, 4649, 4650, 4651, 4652, 4653, 4654, 4655, 4656, 4657, 4658, 4659, 4660, 4661, 4662, 4663, 4664, 4665, 4666, 4667, 4668, 4669, 4670, 4671, 4672, 4673, 4674, 4675, 4676, 4677, 4678, 4679, 4680, 4681, 4682, 4683, 4684, 4685, 4686, 4687, 4688, 4689, 4690, 4691, 4692, 4693, 4694, 4695, 4696, 4697, 4698, 4699, 4700, 4701, 4702, 4703, 4704, 4705, 4706, 4707, 4708, 4709, 4710, 4711, 4712, 4713, 4714, 4715, 4716, 4717, 4718, 4719, 4720, 4721, 4722, 4723, 4724, 4725, 4726, 4727, 4728, 4729, 4730, 4731, 4732, 4733, 4734, 4735, 4736, 4737, 4738, 4739, 4740, 4741, 4742, 4743, 4744, 4745, 4746, 4747, 4748, 4749, 4750, 4751, 4752, 4753, 4754, 4755, 4756, 4757, 4758, 4759, 4760, 4761, 4762, 4763, 4764, 4765, 4766, 4767, 4768, 4769, 4770, 4771, 4772, 4773, 4774, 4775, 4776, 4777, 4778, 4779, 4780, 4781, 4782, 4783, 4784, 4785, 4786, 4787, 4788, 4789, 4790, 4791, 4792, 4793, 4794, 4795, 4796, 4797, 4798, 4799, 4800, 4801, 4802, 4803, 4804, 4805, 4806, 4807, 4808, 4809, 4810, 4811, 4812, 4813, 4814, 4815, 4816, 4817, 4818, 4819, 4820, 4821, 4822, 4823, 4824, 4825, 4826, 4827, 4828, 4829, 4830, 4831, 4832, 4833, 4834, 4835, 4836, 4837, 4838, 4839, 4840, 4841, 4842, 4843, 4844, 4845, 4846, 4847, 4848, 4849, 4850, 4851, 4852, 4853, 4854, 4855, 4856, 4857, 4858, 4859, 4860, 4861, 4862, 4863, 4864, 4865, 4866, 4867, 4868, 4869, 4870, 4871, 4872, 4873, 4874, 4875, 4876, 4877, 4878, 4879, 4880, 4881, 4882, 4883, 4884, 4885, 4886, 4887, 4888, 4889, 4890, 4891, 4892, 4893, 4894, 4895, 4896, 4897, 4898, 4899, 4900, 4901, 4902, 4903, 4904, 4905, 4906, 4907, 4908, 4909, 4910, 4911, 4912, 4913, 4914, 4915, 4916, 4917, 4918, 4919, 4920, 4921, 4922, 4923, 4924, 4925, 4926, 4927, 4928, 4929, 4930, 4931, 4932, 4933, 4934, 4935, 4936, 4937, 4938, 4939, 4940, 4941, 4942, 4943, 4944, 4945, 4946, 4947, 4948, 4949, 4950, 4951, 4952, 4953, 4954, 4955, 4956, 4957, 4958, 4959, 4960, 4961, 4962, 4963, 4964, 4965, 4966, 4967, 4968, 4969, 4970, 4971, 4972, 4973, 4974, 4975, 4976, 4977, 4978, 4979, 4980, 4981, 4982, 4983, 4984, 4985, 4986, 4987, 4988, 4989, 4990, 4991, 4992, 4993, 4994, 4995, 4996, 4997, 4998, 4999, 5000, 5001, 5002, 5003, 5004, 5005, 5006, 5007, 5008, 5009, 5010, 5011, 5012, 5013, 5014, 5015, 5016, 5017, 5018, 5019, 5020, 5021, 5022, 5023, 5024, 5025, 5026, 5027, 5028, 5029, 5030, 5031, 5032, 5033, 5034, 5035, 5036, 5037, 5038, 5039, 5040, 5041, 5042, 5043, 5044, 5045, 5046, 5047, 5048, 5049, 5050, 5051, 5052, 5053, 5054, 5055, 5056, 5057, 5058, 5059, 5060, 5061, 5062, 5063, 5064, 5065, 5066, 5067, 5068, 5069, 5070, 5071, 5072, 5073, 5074, 5075, 5076, 5077, 5078, 5079, 5080, 5081, 5082, 5083, 5084, 5085, 5086, 5087, 5088, 5089, 5090, 5091, 5092, 5093, 5094, 5095, 5096, 5097, 5098, 5099, 5100, 5101, 5102, 5103, 5104, 5105, 5106, 5107, 5108, 5109, 5110, 5111, 5112, 5113, 5114, 5115, 5116, 5117, 5118, 5119, 5120, 5121, 5122, 5123, 5124, 5125, 5126, 5127, 5128, 5129, 5130, 5131, 5132, 5133, 5134, 5135, 5136, 5137, 5138, 5139, 5140, 5141, 5142, 5143, 5144, 5145, 5146, 5147, 5148, 5149, 5150, 5151, 5152, 5153, 5154, 5155, 5156, 5157, 5158, 5159, 5160, 5161, 5162, 5163, 5164, 5165, 5166, 5167, 5168, 5169, 5170, 5171, 5172, 5173, 5174, 5175, 5176, 5177, 5178, 5179, 5180, 5181, 5182, 5183, 5184, 5185, 5186, 5187, 5188, 5189, 5190, 5191, 5192, 5193, 5194, 5195, 5196, 5197, 5198, 5199, 5200, 5201, 5202, 5203, 5204, 5205, 5206, 5207, 5208, 5209, 5210, 5211, 5212, 5213, 5214, 5215, 5216, 5217, 5218, 5219, 5220, 5221, 5222, 5223, 5224, 5225, 5226, 5227, 5228, 5229, 5230, 5231, 5232, 5233, 5234, 5235, 5236, 5237, 5238, 5239, 5240, 5241, 5242, 5243, 5244, 5245, 5246, 5247, 5248, 5249, 5250, 5251, 5252, 5253, 5254, 5255, 5256, 5257, 5258, 5259, 5260, 5261, 5262, 5263, 5264, 5265, 5266, 5267, 5268, 5269, 5270, 5271, 5272, 5273, 5274, 5275, 5276, 5277, 5278, 5279, 5280, 5281, 5282, 5283, 5284, 5285, 5286, 5287, 5288, 5289, 5290, 5291, 5292, 5293, 5294, 5295, 5296, 5297, 5298, 5299, 5300, 5301, 5302, 5303, 5304, 5305, 5306, 5307, 5308, 5309, 5310, 5311, 5312, 5313, 5314, 5315, 5316, 5317, 5318, 5319, 5320, 5321, 5322, 5323, 5324, 5325, 5326, 5327, 5328, 5329, 5330, 5331, 5332, 5333, 5334, 5335, 5336, 5337, 5338, 5339, 5340, 5341, 5342, 5343, 5344, 5345, 5346, 5347, 5348, 5349, 5350, 5351, 5352, 5353, 5354, 5355, 5356, 5357, 5358, 5359, 5360, 5361, 5362, 5363, 5364, 5365, 5366, 5367, 5368, 5369, 5370, 5371, 5372, 5373, 5374, 5375, 5376, 5377, 5378, 5379, 5380, 5381, 5382, 5383, 5384, 5385, 5386, 5387, 5388, 5389, 5390, 5391, 5392, 5393, 5394, 5395, 5396, 5397, 5398, 5399, 5400, 5401, 5402, 5403, 5404, 5405, 5406, 5407, 5408, 5409, 5410, 5411, 5412, 5413, 5414, 5415, 5416, 5417, 5418, 5419, 5420, 5421, 5422, 5423, 5424, 5425, 5426, 5427, 5428, 5429, 5430, 5431, 5432, 5433, 5434, 5435, 5436, 5437, 5438, 5439, 5440, 5441, 5442, 5443, 5444, 5445, 5446, 5447, 5448, 5449, 5450, 5451, 5452, 5453, 5454, 5455, 5456, 5457, 5458, 5459, 5460, 5461, 5462, 5463, 5464, 5465, 5466, 5467, 5468, 5469, 5470, 5471, 5472, 5473, 5474, 5475, 5476, 5477, 5478, 5479, 5480, 5481, 5482, 5483, 5484, 5485, 5486, 5487, 5488, 5489, 5490, 5491, 5492, 5493, 5494, 5495, 5496, 5497, 5498, 5499, 5500, 5501, 5502, 5503, 5504, 5505, 5506, 5507, 5508, 5509, 5510, 5511, 5512, 5513, 5514, 5515, 5516, 5517, 5518, 5519, 5520, 5521, 5522, 5523, 5524, 5525, 5526, 5527, 5528, 5529, 5530, 5531, 5532, 5533, 5534, 5535, 5536, 5537, 5538, 5539, 5540, 5541, 5542, 5543, 5544, 5545, 5546, 5547, 5548, 5549, 5550, 5551, 5552, 5553, 5554, 5555, 5556, 5557, 5558, 5559, 5560, 5561, 5562, 5563, 5564, 5565, 5566, 5567, 5568, 5569, 5570, 5571, 5572, 5573, 5574, 5575, 5576, 5577, 5578, 5579, 5580, 5581, 5582, 5583, 5584, 5585, 5586, 5587, 5588, 5589, 5590, 5591, 5592, 5593, 5594, 5595, 5596, 5597, 5598, 5599, 5600, 5601, 5602, 5603, 5604, 5605, 5606, 5607, 5608, 5609, 5610, 5611, 5612, 5613, 5614, 5615, 5616, 5617, 5618, 5619, 5620, 5621, 5622, 5623, 5624, 5625, 5626, 5627, 5628, 5629, 5630, 5631, 5632, 5633, 5634, 5635, 5636, 5637, 5638, 5639, 5640, 5641, 5642, 5643, 5644, 5645, 5646, 5647, 5648, 5649, 5650, 5651, 5652, 5653, 5654, 5655, 5656, 5657, 5658, 5659, 5660, 5661, 5662, 5663, 5664, 5665, 5666, 5667, 5668, 5669, 5670, 5671, 5672, 5673, 5674, 5675, 5676, 5677, 5678, 5679, 5680, 5681, 5682, 5683, 5684, 5685, 5686, 5687, 5688, 5689, 5690, 5691, 5692, 5693, 5694, 5695, 5696, 5697, 5698, 5699, 5700, 5701, 5702, 5703, 5704, 5705, 5706, 5707, 5708, 5709, 5710, 5711, 5712, 5713, 5714, 5715, 5716, 5717, 5718, 5719, 5720, 5721, 5722, 5723, 5724, 5725, 5726, 5727, 5728, 5729, 5730, 5731, 5732, 5733, 5734, 5735, 5736, 5737, 5738, 5739, 5740, 5741, 5742, 5743, 5744, 5745, 5746, 5747, 5748, 5749, 5750, 5751, 5752, 5753, 5754, 5755, 5756, 5757, 5758, 5759, 5760, 5761, 5762, 5763, 5764, 5765, 5766, 5767, 5768, 5769, 5770, 5771, 5772, 5773, 5774, 5775, 5776, 5777, 5778, 5779, 5780, 5781, 5782, 5783, 5784, 5785, 5786, 5787, 5788, 5789, 5790, 5791, 5792, 5793, 5794, 5795, 5796, 5797, 5798, 5799, 5800, 5801, 5802, 5803, 5804, 5805, 5806, 5807, 5808, 5809, 5810, 5811, 5812, 5813, 5814, 5815, 5816, 5817, 5818, 5819, 5820, 5821, 5822, 5823, 5824, 5825, 5826, 5827, 5828, 5829, 5830, 5831, 5832, 5833, 5834, 5835, 5836, 5837, 5838, 5839, 5840, 5841, 5842, 5843, 5844, 5845, 5846, 5847, 5848, 5849, 5850, 5851, 5852, 5853, 5854, 5855, 5856, 5857, 5858, 5859, 5860, 5861, 5862, 5863, 5864, 5865, 5866, 5867, 5868, 5869, 5870, 5871, 5872, 5873, 5874, 5875, 5876, 5877, 5878, 5879, 5880, 5881, 5882, 5883, 5884, 5885, 5886, 5887, 5888, 5889, 5890, 5891, 5892, 5893, 5894, 5895, 5896, 5897, 5898, 5899, 5900, 5901, 5902, 5903, 5904, 5905, 5906, 5907, 5908, 5909, 5910, 5911, 5912, 5913, 5914, 5915, 5916, 5917, 5918, 5919, 5920, 5921, 5922, 5923, 5924, 5925, 5926, 5927, 5928, 5929, 5930, 5931, 5932, 5933, 5934, 5935, 5936, 5937, 5938, 5939, 5940, 5941, 5942, 5943, 5944, 5945, 5946, 5947, 5948, 5949, 5950, 5951, 5952, 5953, 5954, 5955, 5956, 5957, 5958, 5959, 5960, 5961, 5962, 5963, 5964, 5965, 5966, 5967, 5968, 5969, 5970, 5971, 5972, 5973, 5974, 5975, 5976, 5977, 5978, 5979, 5980, 5981, 5982, 5983, 5984, 5985, 5986, 5987, 5988, 5989, 5990, 5991, 5992, 5993, 5994, 5995, 5996, 5997, 5998, 5999, or 6000 rpm. The time of rotation ranges from 10 second to a month. The shape of inner wall of the reactor includes flat, baffled, and swirled wall. The direction of rotation includes lateral and central. The motion of rotation includes single rotating motion, planetary rotating motion, and gyroscopic motion.

Figure 24:
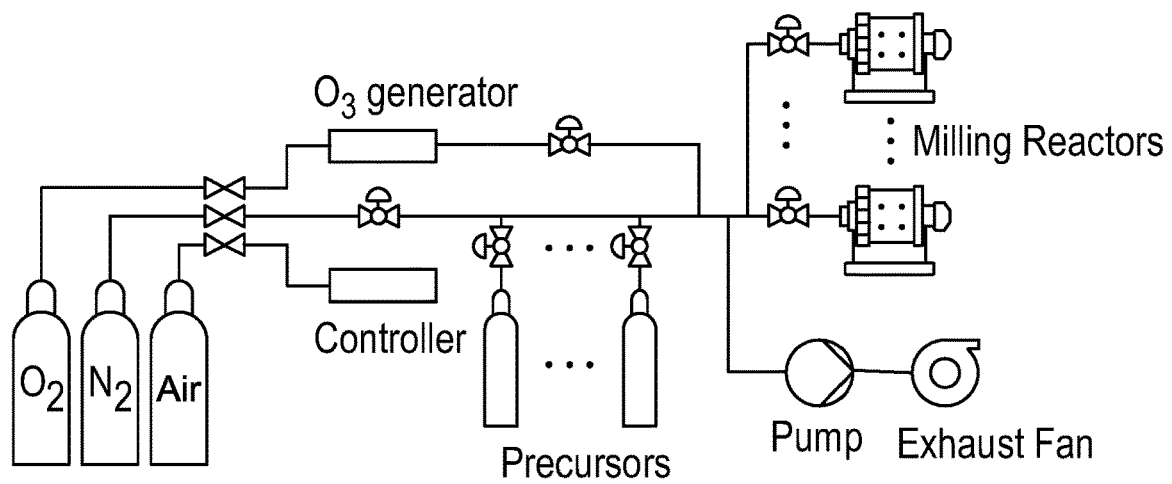
FIG. 24 is a diagram of an atomic layer deposition system with ball milling mechanism.

FIG. 24 is an example atomic layer deposition system with a ball milling mechanism. An exemplary system described in FIG. 24 includes one or more milling reactors accommodating various sizes of balls and particle samples and operating ball milling process during a dose and an expose of ALD precursor at each cycle. An exemplary system includes one or more precursors that are carried by one or more inert gases such as nitrogen and argon. Inert gases flow through the pipes connected with precursors. An exemplary system includes one or more $H_2O$ cylinder or $O_3$ generator. $O_3$ is generated by processing $O_2$ gas. $O_2$ gas flows through $O_3$ generator, followed by flowing into the reactors. An exemplary system includes one or more valves to control the flow of $O_2$, $O_3$, $N_2$, Air, precursor gases, and exhaust gases. An exemplary system includes compressed air to control the valves in the system. An exemplary system includes one or more pumps to generate vacuum in the pipes and reactors. An exemplary system includes one or more exhaust fans to vent the used gas out. One or more filters can be used to filter out solid and liquid chemicals, and toxic gases before the venting out.

Another embodiment of the present disclosure relates to a recycling method of the surface protected battery electrode particles described above. FIG. 25 illustrate a method of recycling the battery electrode particles described herein. The method illustrated by FIG. 25 includes: performing battery cell de-assembly (block 2505), electrode separation (block 2510), rinsing materials (block 2515), separation of materials (block 2520), regeneration of materials (block 2025), re-cast electrode sheets (block 2030), re-lithiating electrodes (block 2535), and re-assemble battery cells (block 2040). In certain example embodiments, one or more of blocks 2505-2040 may be omitted. In certain embodiments, the process may perform the blocks in an order other than that shown in FIG. 25.

Example battery cell de-assembly (block 2505) includes tearing apart packaging of battery cells and separating electrodes (cathode and anode) and separator. Example electrode separation (block 2510) includes one or more of detachment of electrode (cathode or anode) from its substrate (Al or Cu); separation of electrodes to active materials, binder, and conducting agent; performing mixing, shear mixing, shaking, vibrating, sonicating, centrifuging, agitating, milling or combination of thereof. Example solvents for electrode separation (blocks 251) may include N-methyl-2-pyrrolidinone, ethanol, isopropyl alcohol, acetone, acetonitrile, dimethyl carbonate, diethyl carbonate, and ethylmethyl carbonate. Example solutions for use in separation may include organic electrolytes. Example rinsing materials (block 2515) is performed in non-aqueous solvents dissolving binders and conducting agents. Example re-lithiation (block 2535) includes one or more of chemical re-lithiation, electrochemical re-lithiation, and thermal re-lithiation. Example chemical re-lithiation includes mixing with Li precursors such as LiOH, $Li_2CO_3$, $LiO_2$, as such, followed by heat treatment between 100 to 1200° C. Example electrochemical re-lithiation includes performing electrochemical lithiation from Li metal in $Li^+$-contained electrolytes after the electrode fabrication.

The battery electrode sheets and electrode particles of the present disclosure may enable high volumetric energy/power density energy storage materials with prolonged life time and fast charging/discharging capabilities at diverse temperature ranges including its recycling. Specific advantages of the materials disclosed herein may include: suppression of surface oxidation on surface; suppression of gas evolution on surface; suppression of side reactions on surface, suppression of crack generation and propagation; air and moisture stability, high and low temperature durability, extended storage life, extended cycle life, improved charge transfer kinetics in various temperature, enhanced electrical conductivity on surface, higher compactness (Increasing volumetric energy), and recyclability.

The methods of the present disclosure may be applied to improve the performance in a lithium battery by applying a combinatory metal oxide coating to electrodes, such as the cathode. The combinatory metal oxide coating may serve to protect the electrode from oxidation of cathode surface to maintain charge and discharge capacity in the operations at high voltage over 4.4 V and normal voltage around 4.2 V for greater than or equal to 1000 cycles. The combinatory metal oxide coating may improve surface conductivity of electron and lithium ion to enhance charge and discharge capacity at higher rates to retain greater than or equal to 50% of the charge and discharge capacity of 0.1 C at 5 C. The combinatory metal oxide coating may minimize or prevents from formation of solid electrolyte interphase and other side products on the electrode surface to maintain the charge and discharge capacity for greater than or equal to 1000 cycles. The combinatory metal oxide coating may improve the electrochemical compatibility between the electrode and solid electrolytes, resulting in higher ionic conductivity of the electrode surface and the overall enhancement of the solid state battery system. This substantially decreases interfacial impedance between the electrode and electrolytes and maintains the charge and discharge capacity for greater than or equal to 300 cycles.

This methods and materials described herein may apply to generally all kinds of particles and sheets and may specifically include application in energy storage electrode materials. In particular, this may include cathodes and anodes of Li-ion batteries, Li metal batteries, Li—S batteries, Li-air batteries, solid-state Li batteries, Na-ion batteries, solid-state Na batteries, Mg-ion batteries, solid-state Mg batteries, Ca-ion batteries, solid-state Ca batteries, K-ion batteries, solid-state K batteries, Zn-ion batteries, solid-state Zn batteries, other metal-ion and metal-air batteries, and all kinds of solid electrolytes.

Modifications, additions, or omissions may be made to the systems and apparatuses described herein without departing from the scope of the disclosure. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods described herein without departing from the scope of the invention. For example, the steps may be combined, modified, or deleted where appropriate, and additional steps may be added. Additionally, the steps may be performed in any suitable order without departing from the scope of the present disclosure.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims. Therefore, the present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. Also, the terms in the claims have their plain, ordinary meaning unless otherwise explicitly and clearly defined by the patentee. The indefinite articles "a" or "an," as used in the claims, are each defined herein to mean one or more than one of the element that it introduces.

Number of examples have been described. Nevertheless, it will be understood that various modifications can be made. Accordingly, other implementations are within the scope of the following claims.

What is claimed is:

1. A battery comprising:
    a cathode comprising:
        a layered nickel-rich material;
        a first sub-nanoscale lithium metal oxide coating on the nickel-rich material; and
        a sub-nanoscale metal oxide coating on top of the first sub-nanoscale lithium metal oxide coating; wherein the first sub-nanoscale lithium metal oxide and the sub-nanoscale metal oxide coating are less than 1 nm thick; and
    an anode comprising:
        a composite anode material.

2. The battery of claim 1, wherein the nickel-rich material comprises:
    $Li_{1+a}Ni_xCo_yMn_zAl_{1-x-y-z}O_2$, wherein $0.0<=a<=1.0$, $0.5<=x<=1.0$, $0.0<=y<=0.1$, $0.0<=z<=0.1$, and further wherein the nickel-rich material has less than 0.05 mol of impurities and other elements and less than 5 percent by weight of residual lithium compounds on the surface;
    and one or more of a single crystalline primary particle and a combination of secondary and primary particles.

3. The battery of claim 1, wherein the anode material comprises a silicon (Si) and graphite (C) composite with less than 0.05 mol of impurities and other elements.

4. The battery of claim 1, wherein the anode material comprises a composite of silicon and one or more carbonaceous materials, wherein the composite of silicon and one or more carbonaceous materials includes at least five percent silicon by mass and less than ninety-five percent of the one or more carbonaceous materials by mass, and wherein the carbonaceous materials include one or more of graphite, amorphous carbon, graphene, and carbon nanotube.

5. The battery of claim 1, wherein:
    the cathode and the anode further comprise a conductive polymer coating.

6. The battery of claim 5, wherein the conductive polymer coating is disposed on the cathode and the anode by one or more of solution mixing, vacuum filtration, cross-linking, and vacuum drying.

7. The battery of claim 5, wherein the conductive polymer and additive comprises:
one or more of polypyrrole, polyaniline, and poly (3,4-ethylenedioxythiophene) polymer, carbon nanotubes, graphene, conductive carbon, Cu, Ag, Au, Pt, and Os.

8. The battery of claim 5, wherein the conductive polymer coating is applied, at least in part, by:
dissolving a surfactant into a solvent by stirring for 10 min to 1 hours, dependent on the solubility at a temperature between 10° C. and 50° C.;
mixing the conductive polymer and additive into a solution for 1 to 24 hours at a temperature between 50° C. and 120° C.;
drying in a vacuum at a temperature between 80° C. and 200° C. for 6 to 24 hours; and
collecting the coated powder by using filtration.

9. The battery of claim 8, wherein the surfactant comprises one or more of sodium dodecyl sulfonate, benalkonium chloride, cocamidopropyl betain, polyvinylpyrrolidone, polyurethane, polystyrene, polyvinylidene fluoride, cetyl alcohol, polytetrafluoroethylene, ethyl cellulose, nitrocellulose, and carboxymethyl cellulose.

10. The battery of claim 8, wherein the solvent comprises one or more of N-methyl-2-pyrrolidinone, ethanol, isopropyl alcohol, acetone, dimethyl carbonate, diethyl carbonate, and ethyl-methyl carbonate.

11. The battery of claim 1, wherein the first sub-nanoscale metal oxide coating includes one or more of:
surface doping;
island and cluster coating; and
conformal layered coating provided by the use of one or more of lithium metal oxides, binary metal oxides, ternary metal oxides, and quaternary metal oxides.

12. The battery of claim 1, wherein the first sub-nanoscale metal oxide coating is deposited, at least in part, by one or more of:
atomic layer deposition;
chemical vapor deposition;
pulsed laser deposition; and
physical vapor deposition.

13. The battery of claim 12, wherein the atomic layer deposition comprises:
providing a ball-milling mechanism, the ball-milling mechanism comprising:
a rotating reactor with a plurality of balls, wherein the plurality of balls comprises one or more of $ZrO_2$, $TiO_2$, stainless steel, and $Al_2O_3$;
performing the atomic layer deposition at a deposition temperature between 20 to 400° C.;
providing one or more metal precursors, wherein the metal precursors comprise one or more of Al, Ti, Co, Ni, Cu, Si, Ge, Se, Zr, Nb, W, Sn, Ga, Li, Mg, Sr, Ba, Fe, Hf, Ru, Ta, V, Y;
wherein the atomic layer deposition is performed at a pulse (dose) time for a metal precursor between 0.05 to 60 second to fill the reactor full;
wherein the atomic layer deposition is performed with one or more pulses (doses) of the same or different metal precursors to form different metal elements on the same layer;
wherein the atomic layer deposition is performed an exposure time between 1 to 3600 second until saturation;
wherein the atomic layer deposition is performed for a purge time until it reaches an appropriate vacuum state;
wherein the atomic layer deposition is performed with $H_2O$ and/or ozone to attach oxygen on the metal precursor surface;
wherein the atomic layer deposition is performed for one or more cycles; and
wherein the metal oxide coating has a thickness of less than 1 nm.

14. The battery of claim 1, the first sub-nanoscale metal oxide coating comprises one or more metals selected from the group consisting of: Al, Ti, Co, Ni, Cu, Si, Ge, Se, Zr, Nb, W, Sn, Ga, Li, Mg, Sr, Ba, Fe, Hf, Ru, Ta, V, and Y.

15. The battery of claim 1, wherein the first sub-nanoscale metal oxide coating forms Li-metal-oxide coatings without adding additional Li source during the coating process and wherein the first sub-nanoscale metal oxide coating comprises one or more metals selected from the group consisting of: Al, Ti, Co, Ni, Cu, Si, Ge, Se, Zr, Nb, W, Sn, Ga, Li, Mg, Sr, Ba, Fe, Hf, Ru, Ta, V, Y.

* * * * *